(12) United States Patent
Clampitt et al.

(10) Patent No.: US 11,942,422 B2
(45) Date of Patent: Mar. 26, 2024

(54) METHODS OF FORMING MICROELECTRONIC DEVICES

(71) Applicant: Micron Technology, Inc., Boise, ID (US)

(72) Inventors: Darwin A. Clampitt, Wilder, ID (US); Roger W. Lindsay, Boise, ID (US); Jeffrey D. Runia, Boise, ID (US); Matthew Holland, Victor, NY (US); Chamunda N. Chamunda, Boise, ID (US)

( * ) Notice: Subject to any disclaimer, the term of this patent is extended or adjusted under 35 U.S.C. 154(b) by 0 days.

(21) Appl. No.: 18/050,438

(22) Filed: Oct. 27, 2022

(65) Prior Publication Data

US 2023/0096467 A1 Mar. 30, 2023

Related U.S. Application Data

(62) Division of application No. 16/864,823, filed on May 1, 2020, now Pat. No. 11,495,530.

(51) Int. Cl.
| | |
|---|---|
| *H01L 23/522* | (2006.01) |
| *G11C 7/18* | (2006.01) |
| *G11C 8/14* | (2006.01) |
| *H01L 23/528* | (2006.01) |
| *H10B 41/10* | (2023.01) |

(Continued)

(52) U.S. Cl.
CPC .......... *H01L 23/5226* (2013.01); *G11C 7/18* (2013.01); *G11C 8/14* (2013.01); *H01L 23/5283* (2013.01); *H10B 41/10* (2023.02); *H10B 41/27* (2023.02); *H10B 41/35* (2023.02); *H10B 43/10* (2023.02); *H10B 43/27* (2023.02); *H10B 43/35* (2023.02)

(58) Field of Classification Search
CPC ............ H01L 23/5226; H01L 23/5283; H01L 21/76816; G11C 7/18; G11C 8/14; H10B 41/10; H10B 41/27; H10B 41/35; H10B 43/10; H10B 43/27; H10B 43/35; H10B 41/50; H10B 43/50
See application file for complete search history.

(56) References Cited

U.S. PATENT DOCUMENTS

| | | |
|---|---|---|
| 8,787,082 B2 | 7/2014 | Son et al. |
| 9,177,872 B2 | 11/2015 | Sandhu |

(Continued)

*Primary Examiner* — Allison Bernstein
(74) *Attorney, Agent, or Firm* — TraskBritt

(57) ABSTRACT

A microelectronic device comprises a stack structure, a stadium structure within the stack structure, and conductive contact structures. The stack structure comprises a vertically alternating sequence of conductive structures and insulative structures arranged in tiers. Each of the tiers comprises one of the conductive structures and one of the insulative structures. The stadium structure comprises a forward staircase structure having steps comprising edges of the tiers, and a reverse staircase structure opposing the forward staircase structure and having additional steps comprising additional edges of the tiers. The conductive contact structures vertically extend to upper vertical boundaries of at least some of the conductive structures of the stack structure at the steps of the forward staircase structure and the additional steps of the reverse staircase structure, and are each integral and continuous with one of the conductive structures. Memory devices, electronic systems, and methods of forming microelectronic devices are also described.

20 Claims, 25 Drawing Sheets

(51) Int. Cl.
  *H10B 41/27* (2023.01)
  *H10B 41/35* (2023.01)
  *H10B 43/10* (2023.01)
  *H10B 43/27* (2023.01)
  *H10B 43/35* (2023.01)

(56) References Cited

U.S. PATENT DOCUMENTS

| | | |
|---|---|---|
| 9,553,106 B1 | 1/2017 | Sung et al. |
| 9,601,502 B2 | 3/2017 | Sano et al. |
| 2009/0268524 A1 | 10/2009 | Maejima |
| 2010/0039865 A1 | 2/2010 | Kidoh et al. |
| 2013/0020647 A1 | 1/2013 | Hwang et al. |
| 2014/0027838 A1* | 1/2014 | Kido ............... H01L 29/66833 438/269 |
| 2015/0228623 A1 | 8/2015 | Oh et al. |
| 2017/0271363 A1 | 9/2017 | Kamigaki et al. |
| 2017/0309639 A1 | 10/2017 | Hwang et al. |

\* cited by examiner

METHODS OF FORMING MICROELECTRONIC DEVICES

CROSS-REFERENCE TO RELATED APPLICATION

This application is a divisional of U.S. patent application Ser. No. 16/864,823, filed May 1, 2020, now U.S. Pat. No. 11,495,530 issued Nov. 8, 2022, the disclosure of which is hereby incorporated herein in its entirety by this reference.

TECHNICAL FIELD

The disclosure, in various embodiments, relates generally to the field of microelectronic device design and fabrication. More specifically, the disclosure relates to microelectronic devices including stadium structures, and to related methods, memory devices, and electronic systems.

BACKGROUND

A continuing goal of the microelectronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in one or more stack structures including tiers of conductive structures and dielectric materials. Each vertical memory string may include at least one select device coupled in series to a serial combination of vertically-stacked memory cells. Such a configuration permits a greater number of switching devices (e.g., transistors) to be located in a unit of die area (i.e., length and width of active surface consumed) by building the array upwards (e.g., vertically) on a die, as compared to structures with conventional planar (e.g., two-dimensional) arrangements of transistors.

Vertical memory array architectures generally include electrical connections between the conductive structures of the tiers of the stack structure(s) of the memory device and access lines (e.g., word lines) so that the memory cells of the vertical memory array can be uniquely selected for writing, reading, or erasing operations. One method of forming such an electrical connection includes forming so-called "staircase" (or "stair step") structures at edges (e.g., horizontal ends) of the tiers of the stack structure(s) of the memory device. The staircase structure includes individual "steps" defining contact regions of the conductive structures, upon which conductive contact structures can be positioned to provide electrical access to the conductive structures.

As vertical memory array technology has advanced, additional memory density has been provided by forming vertical memory arrays to include additional tiers of conductive structures, and, hence, additional steps in the staircase structures associated therewith. However, increasing the number of steps of a staircase structure without undesirably increasing the overall width (e.g., horizontal footprint) of the staircase structure can decrease the acceptable margin of error associated with different acts in the process of forming the increased number of steps. A conventional process of forming a staircase structure may include repeated acts of trimming a uniform width of a mask (e.g., photoresist) overlying alternating conductive structures and insulating structures, etching portions of the insulating structures not covered by a remaining portion of the mask, and then etching portions of the conductive structures not covered by remaining portions of the insulating structures. Each of these repeated acts has an associated margin of error permitting the steps of the staircase structure to be suitably sized and positioned to form contact structures thereon. As the number of repeated acts increases, deviation from a desired step width and/or a desired step position may be compounded because errors in the size and/or position of one structure are transferred to subsequently formed structures later in the process. For a large number of steps in the staircase structure, margins of error to achieve suitably sized and positioned steps may be small, such as less than one percent (1%). Achieving such small margins of error can be very difficult using conventional methods, which may result in improperly positioned contact structures and may undesirably decrease yield (e.g., the number of memory cells that are validly programmable and erasable as a percentage of the total number of memory cells in a given batch). In addition, as feature packing densities have increased and margins for formation error have decreased, conventional configurations have resulted in undesirable defects (e.g., contact punch through) as well as current leaks and short circuits that can diminish desired memory device performance, reliability, and durability.

Accordingly, there remains a need for new microelectronic device (e.g., memory device, such as 3D NAND Flash memory device) configurations facilitating enhanced memory density while alleviating the problems of conventional microelectronic device configurations, as well as for new methods of forming the microelectronic devices and new electronic systems including the new microelectronic device configurations.

DETAILED DESCRIPTION

Figure 1A:
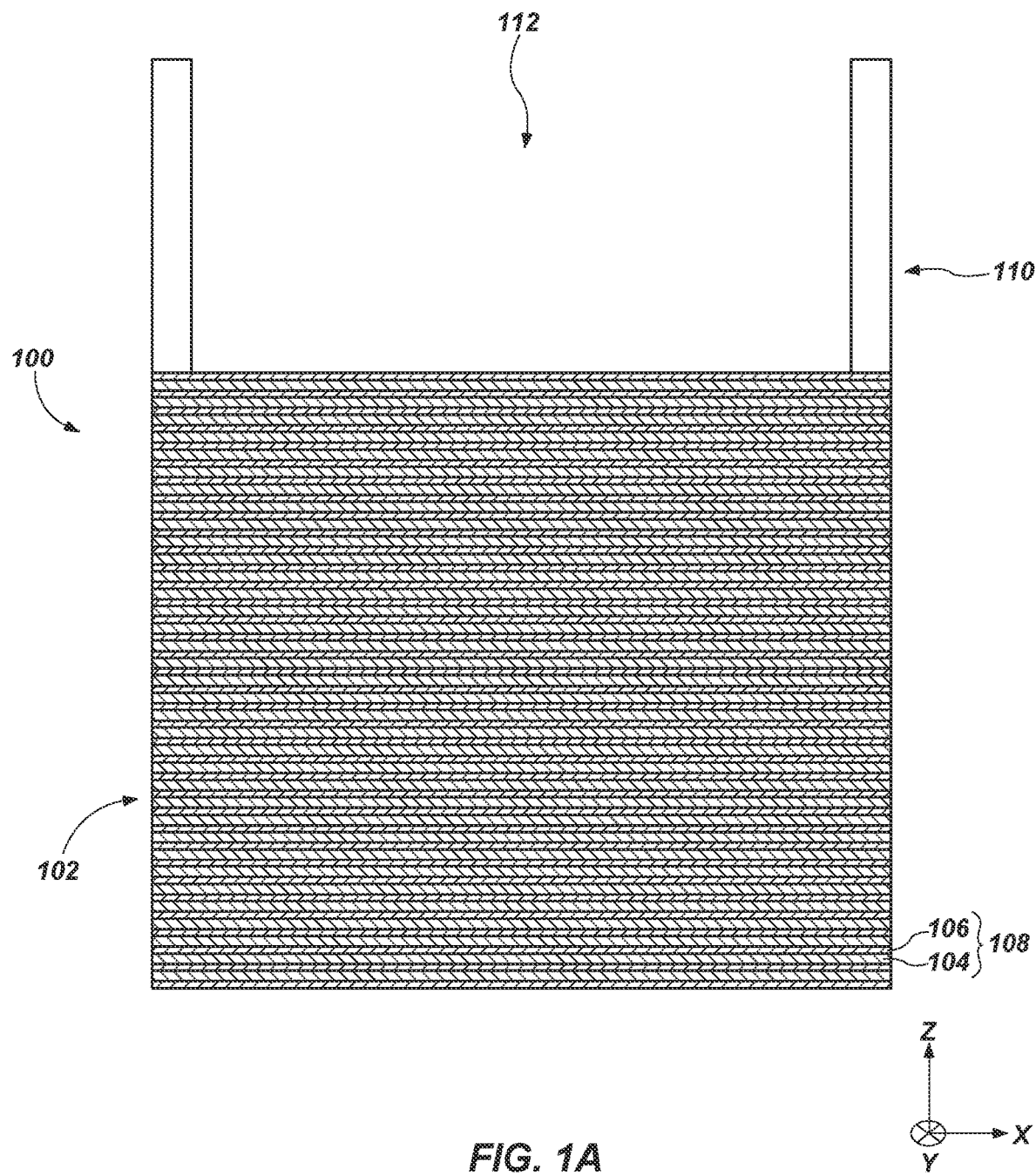
FIGS. 1A through 1L are simplified partial cross-sectional views illustrating a method of forming a microelectronic device, in accordance with embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device, such as 3D NAND Flash memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the term "memory device" means and includes microelectronic devices exhibiting memory functionality, but not necessarily limited to memory functionality. Stated another way, and by way of non-limiting example only, the term "memory device" includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

As used herein, features (e.g., regions, structures, devices) described as "neighboring" one another means and includes features of the disclosed identity (or identities) that are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the terms "comprising," "including," "having," and grammatical equivalents thereof are inclusive or open-ended terms that do not exclude additional, unrecited elements or method steps, but also include the more restrictive terms "consisting of" and "consisting essentially of" and grammatical equivalents thereof. As used herein, the term "may" with respect to a material, structure, feature, or method act indicates that such is contemplated for use in implementation of an embodiment of the disclosure and such term is used in preference to the more restrictive term "is" so as to avoid any implication that other, compatible materials, structures, features, and methods usable in combination therewith should or must be excluded.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the term "configured" refers to a size, shape, material composition, orientation, and arrangement of one or more of at least one structure and at least one apparatus facilitating operation of one or more of the structure and the apparatus in a pre-determined way.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

Unless the context indicates otherwise, the materials described herein may be formed by any suitable process including, but not limited to, spin coating, blanket coating, chemical vapor deposition ("CVD"), atomic layer deposition ("ALD"), plasma enhanced ALD, physical vapor deposition ("PVD") (including sputtering, evaporation, ionized PVD, and/or plasma-enhanced CVD), or epitaxial growth. Depending on the specific material to be formed, the technique for depositing or growing the material may be selected by a person of ordinary skill in the art. In addition, unless the context indicates otherwise, the removal of materials described herein may be accomplished by any suitable process including, but not limited to, etching (e.g., dry etching, wet etching, vapor etching), ion milling, abrasive planarization, or other known methods.

FIGS. 1A through 1L are simplified partial cross-sectional views illustrating embodiments of a method of forming a microelectronic device (e.g., a memory device, such as a 3D NAND Flash memory device). With the description provided below, it will be readily apparent to one of ordinary skill in the art that the methods and structures described herein may be used in various devices and electronic systems.

Referring to FIG. 1A, a microelectronic device structure 100 may be formed to include a preliminary stack structure 102, and a patterned mask structure 110 on or over the preliminary stack structure 102. The preliminary stack structure 102 includes a vertically alternating (e.g., in the Z-direction) sequence of first insulative structures 104 and second insulative structures 106 arranged in tiers 108. Each of the tiers 108 of the preliminary stack structure 102 may include at least one of the first insulative structures 104 vertically neighboring at least one of the second insulative structures 106. The preliminary stack structure 102 may be formed to include any desired number of the tiers 108, such as greater than or equal to sixteen (16) of the tiers 108, greater than or equal to thirty-two (32) of the tiers 108, greater than or equal to sixty-four (64) of the tiers 108, greater than or equal to one hundred twenty-eight (128) of the tiers 108, or greater than or equal to two hundred fifty-six (256) of the tiers 108.

The first insulative structures 104 of the tiers 108 of the preliminary stack structure 102 may be formed of and include at least one electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, the first insulative structures 104 may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. Each of the first insulative structures 104 may individually include a substantially homogeneous distribution or a substantially heterogeneous distribution of the at least one electrically insulative material. As used herein, the term "homogeneous distribution" means amounts of a material do not vary throughout different portions (e.g., different horizontal portions, different vertical portions) of a structure. Conversely, as used herein, the term "heterogeneous distribution" means amounts of a material vary throughout different portions of a structure. In some embodiments, each of the first insulative structures 104 exhibits a substantially homogeneous distribution of electrically insulative material. In further embodiments, at least one of the first insulative structures 104 exhibits a substantially heterogeneous distribution of at least one electrically insulative material. One or more of the first insulative structures 104 may, for example, be formed of and include a stack (e.g., laminate) of at least two different electrically insulative materials (e.g., at least two different dielectric materials). In some embodiments, each of the first insulative structures 104 is formed of and includes a dielectric nitride material, such as $SiN_y$ (e.g., $Si_3N_4$). The first insulative structures 104 may each be substantially planar, and may each individually exhibit a desired thickness. In addition, each of the first insulative structures 104 may be substantially the same (e.g., exhibit substantially the same material composition, material distribution, size, and shape) as one another, or at least one of the first insulative structures 104 may be different (e.g., exhibit one or more of a different material composition, a different material distribution, a different size, and a different shape) than at least one other of the first insulative structures 104. In some embodiments, each of the first insulative structures 104 is substantially the same as each other of the first insulative structures 104.

The second insulative structures 106 of the tiers 108 of the preliminary stack structure 102 may be formed of and include at least one additional electrically insulative material. Material compositions of the second insulative structures 106 and the first insulative structures 104 may be selected such that the first insulative structures 104 and the second insulative structures 106 may be selectively removed relative to one another. The second insulative structures 106 may be selectively etchable relative to the first insulative structures 104 during common (e.g., collective, mutual) exposure to a first etchant, and the first insulative structures 104 may be selectively etchable to the second insulative structures 106 during common exposure to a second, different etchant. As used herein, a material is "selectively etchable" relative to another material if the material exhibits an etch rate that is at least about five times (5×) greater than the etch rate of another material, such as about ten times (10×) greater, about twenty times (20×) greater, or about forty times (40×) greater. A material composition of the second insulative structures 106 is different than a material composition of the first insulative structures 104. The second insulative structures 106 may comprise an additional electrically insulative material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_g$), at least one dielectric oxynitride material (e.g., $SiO_xN_y$), and at least one dielectric carboxynitride material (e.g., $SiO_xC_zN_y$). In some embodiments, each of the second insulative structures 106 is formed of and includes a dielectric oxide material, such as $SiO_x$ (e.g., $SiO_2$). Each of the second insulative structures 106 may individually include a substantially homogeneous distribution of the at least one additional electrically insulative material, or a substantially heterogeneous distribution of the at least one additional electrically insulative material. In some embodiments, each of the second insulative structures 106 of the preliminary stack structure 102 exhibits a substantially homogeneous distribution of additional electrically insulative material. In additional embodiments, at least one of the second insulative structures 106 of the preliminary stack structure 102 exhibits a substantially heterogeneous distribution of at least one additional electrically insulative material. The second insulating structure(s) 106 may, for example, individually be formed of and include a stack (e.g., laminate) of at least two different additional electrically insulative materials. The second insulative structures 106 may each be substantially planar, and may each individually exhibit a desired thickness.

With continued reference to FIG. 1A, the patterned mask structure 110 may be formed of and include at least one material (e.g., at least one hard mask material) suitable for use as an etch mask to pattern portions of the preliminary stack structure 102 (e.g., portions of the tiers 108, including portions of the first insulative structures 104 and portions of the second insulative structures 106) to form apertures (e.g., openings, vias, trenches) vertically extending (e.g., in the Z-direction) into the preliminary stack structure 102, as described in further detail below. By way of non-limiting example, the patterned mask structure 110 may be formed of and include one or more hard mask materials having etch selectivity relative to the materials of the preliminary stack structure 102 (including the first insulative structures 104 and the second insulative structures 106). In some embodiments, the patterned mask structure 110 comprises polycrystalline silicon. The patterned mask structure 110 may be homogeneous (e.g., may include only one material layer), or may be heterogeneous (e.g., may include a stack exhibiting at least two different material layers). In addition, the patterned mask structure 110 may exhibit any thickness permitting desired patterning of the preliminary stack structure 102 using patterned mask structure 110, such as a thickness within a range of from about 1 nanometer (nm) to about 1000 nm.

As shown in FIG. 1A, the patterned mask structure 110 may include at least one opening 112 (e.g., aperture, via) vertically extending therethrough. The opening 112 may vertically extend (e.g., in the Z-direction) completely through the patterned mask structure 110, from an upper surface of the patterned mask structure 110 to an upper surface of the preliminary stack structure 102 (e.g., an upper surface of the second insulative structure 106 of an uppermost tier 108 of the preliminary stack structure 102).

The patterned mask structure 110 may be formed to exhibit any desired quantity of openings 112. The quantity of the openings 112 included in the patterned mask structure 110 may at least partially depend on a desired quantity and distribution of trenches to be formed in the preliminary stack structure 102 using the patterned mask structure 110, which may, in turn, at least partially depend on the quantity of tiers 108 included below the patterned mask structure 110. In some embodiments, the patterned mask structure 110 is formed to include multiple (e.g., more than one) openings 112.

A geometric configuration (e.g., shape, dimensions), horizontal position (e.g., in the X-direction, in the Y-direction), and horizontal spacing of each opening 112 in the patterned mask structure 110 at least partially depends on the geometric configuration, horizontal position, and horizontal spacing of the trenches to be subsequently formed in the preliminary stack structure 102 using the patterned mask structure 110, as described in further detail below. In some embodiments, each opening 112 exhibits substantially the same geometric configuration (e.g., substantially the same shape and substantially the same dimensions) as each other opening 112, is regularly (e.g., uniformly, non-variably) horizontal spaced apart (e.g., horizontally separated, horizontally distanced) from horizontally neighboring openings 112, and is substantially horizontally aligned with horizontally neighboring openings 112 in at least one horizontal direction. In additional embodiments, at least one opening 112 in the patterned mask structure 110 exhibits one or more of a different geometric configuration (e.g., a different shape, such as a non-rectangular horizontal cross-sectional shape), different horizontal dimension(s), and/or different horizontal spacing than at least one other opening 112. For example, at least one opening 112 may exhibit a different (e.g., larger, smaller) width in the X-direction and/or a different length in the Y-direction than at least one other of opening 112. As another example, some horizontally neighboring openings 112 may be horizontally separated from one another by a first distance, and other horizontally neighboring openings 112 may be horizontally separated from one another by a second distance different than (e.g., less than, greater than) the first distance.

Figure 1B:
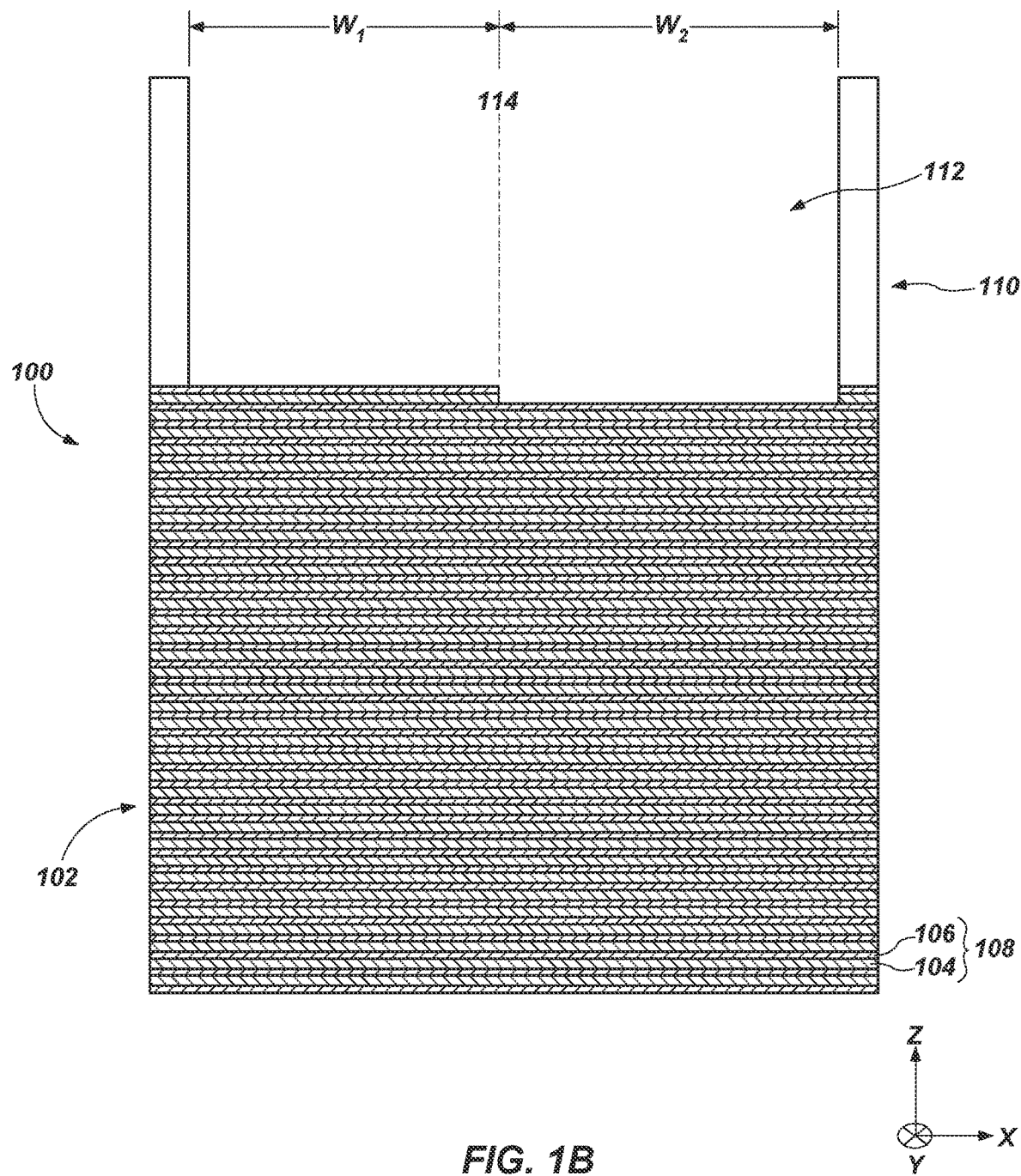

Referring next to FIG. 1B, portions of at least one upper tier 108 (e.g., a highest tier in the Z-direction, a top tier, an uppermost tier) of the preliminary stack structure 102 exposed by the opening 112 in the patterned mask structure 110 may be removed to expose portions of a relatively lower tier 108 (e.g., a second highest tier in the Z-direction) of the preliminary stack structure 102 vertically underlying (e.g., vertically neighboring) the upper tier 108. The removal process may partially remove portions of the second insulative structure 106 and the first insulative structure 104 of the upper tier 108 exposed by the opening 112 in the patterned mask structure 110 to uncover (e.g., expose) portions of the second insulative structure 106 of the relatively lower tier 108 vertically underlying the upper tier 108.

As shown in FIG. 1B, following the removal process, remaining portions of the upper tier 108 of the preliminary stack structure 102 exposed within the opening 112 may terminate (e.g., end) at or substantially proximate a horizontal centerline 114 (e.g., in the X-direction) of the opening 112 in the patterned mask structure 110. Thus, newly exposed portions of the relatively lower tier 108 may horizontally extend (e.g., in the X-direction) from and between the horizontal centerline 114 and outer horizontal boundaries (e.g., in the X-direction) of the opening 112 in the patterned mask structure 110. Put another way, following the removal process, a first width $W_1$ of a remaining portion of the upper tier 108 of the preliminary stack structure 102 exposed within the opening 112 may be substantially equal to a second width $W_2$ of a newly exposed portion of the relatively lower tier 108 vertically underlying the upper tier 108. In additional embodiments, the remaining portion of the upper tier 108 of the preliminary stack structure 102 exposed within the opening 112 may terminate at a location horizontally offset from (e.g., in the X-direction) the horizontal centerline 114 (e.g., in the X-direction) of the opening 112 in the patterned mask structure 110. In such embodiments, the first width $W_1$ of the remaining portion of the upper tier 108 of the preliminary stack structure 102 exposed within the opening 112 may be different than (e.g., greater than, less than) the second width $W_2$ of the newly exposed portion of the relatively lower tier 108 vertically underlying the upper tier 108.

A portion of the upper tier 108 of the preliminary stack structure 102 exposed within the opening 112 in the patterned mask structure 110 may be removed using conventional material removal processes (e.g., conventional photolithographic patterning processes; conventional etching processes, such as a conventional anisotropic etching processes), which are not described in detail herein.

Figure 1C:
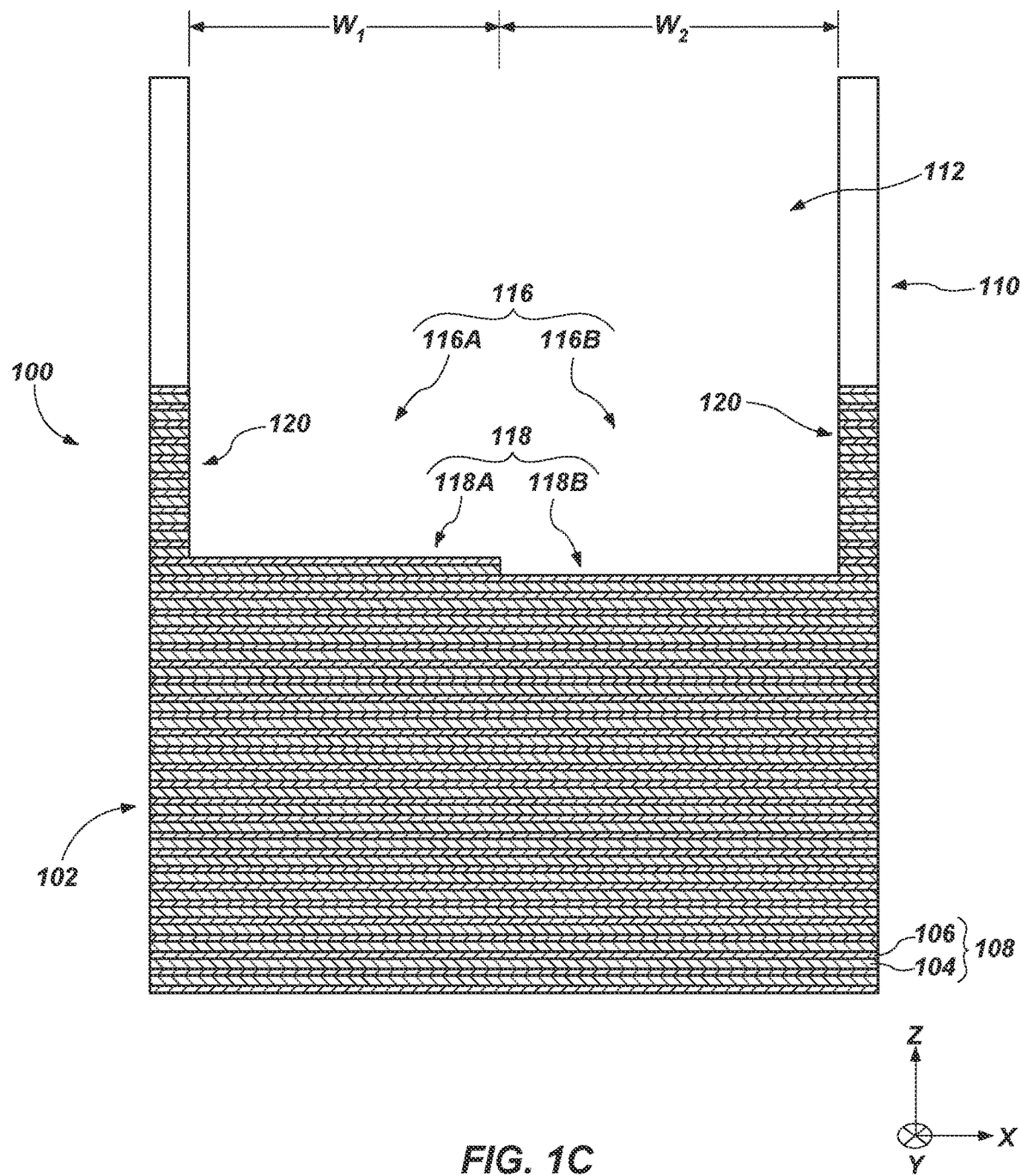

Referring next to FIG. 1C, the microelectronic device structure 100 may be subjected to one or more material removal processes (e.g., one or more chopping processes) to form at least one trench 116 (e.g., opening, blind via) vertically extending (e.g., in the Z-direction) into the preliminary stack structure 102. As shown in FIG. 1C, the trench 116 within the preliminary stack structure 102 may be substantially confined within horizontal boundaries of the opening 112 within the patterned mask structure 110. In embodiments wherein the patterned mask structure 110 includes multiple openings 112, different trenches 116 may be formed to extend to different vertical depths than one another within the preliminary stack structure 102. For example, at least one of the trenches 116 may vertically extend to a relatively lower depth within the preliminary stack structure 102 than at least one other of the trenches 116. The vertical depths of the trenches 116 relative to one another may at least partially depend on the quantity of tiers 108 of the preliminary stack structure 102, the quantity of the trenches 116 within the preliminary stack structure 102, and the horizontal dimensions of the trenches 116. The trench(es) 116 may be configured to facilitate subsequent formation of vertically extending insulative structures in physical contact with at least some (e.g., each) of the tiers 108 of the preliminary stack structure 102, as described in further detail below.

As shown in FIG. 1C, the trench 116 may include a first region 116A and a second region 116B. The second region 116B of the trench 116 may vertically extend (e.g., in the Z-direction) to a relatively lower depth within the preliminary stack structure 102 than the first region 116A of the trench 116. For example, the first region 116A of the trench 116 vertically extend to and terminate at a relatively higher tier 108 of the preliminary stack structure 102; and the second region 116B of the trench 116 may vertically extend to and terminate at a relatively lower tier 108 of the preliminary stack structure 102. The relatively higher tier 108 of the preliminary stack structure 102 and the relatively lower tier 108 of the preliminary stack structure 102 may vertically neighbor one another within the preliminary stack structure 102. The first region 116A of the trench 116 may have the first width $W_1$ (e.g., in the X-direction) previously described with reference to FIG. 1B, and the second region 116B of the trench 116 may have the second width $W_2$ (e.g., in the X-direction) previously described with reference to FIG. 1B. The first region 116A of the trench 116 may horizontally neighbor the second region 116B of the trench 116.

The trench 116 may include a lower vertical boundary 118 (e.g., floor) and horizontal boundaries 120 (e.g., sides). The lower vertical boundary 118 of the trench 116 may have a non-planar topography resulting from the differing vertical depths of the first region 116A of the trench 116 and the second region 116B of the trench 116. For example, a first portion 118A of the lower vertical boundary 118 of the trench 116 may be defined by the vertical depth of the first region 116A of the trench 116, and a second portion 118B of the lower vertical boundary 118 of the trench 116 may be defined by the vertical depth of the first region 116A of the trench 116. The first portion 118A and the second portion 118B of the lower vertical boundary 118 of the trench 116 may each be substantially horizontally planar, but may be vertically offset (e.g., in the Z-direction) from one another. The second portion 118B of the lower vertical boundary 118 of the trench 116 may horizontally neighbor (e.g., in the X-direction) the first portion 118A of the lower vertical boundary 118 of the trench 116. In addition, as depicted in FIG. 1C, the horizontal boundaries 120 of the trench 116 may be substantially vertically planar.

As shown in FIG. 1C, the trench 116 may be formed to vertically terminate (e.g., vertically end) at the second insulative structures 106 of two different tiers 108 of the preliminary stack structure 102 (e.g., two vertically neighboring tiers 108 of the preliminary stack structure 102). For example, the first region 116A of the trench 116 may vertically terminate at the second insulative structure 106 of a relatively higher tier 108 of the preliminary stack structure 102; and the second region 116B of the trench 116 may vertically terminate at the second insulative structure 106 of a relatively lower tier 108 of the preliminary stack structure 102. Put another way, the first portion 118A of the lower vertical boundary 118 of the trench 116 may be defined by an exposed portion of the second insulative structure 106 of the relatively higher tier 108 of the preliminary stack structure 102; and the second portion 118B of the lower vertical boundary 118 of the trench 116 may be defined by an exposed portion of the second insulative structure 106 of the relatively lower tier 108 of the preliminary stack structure 102. In additional embodiments, the trench 116 may be formed to vertically terminate at the first insulative structures 104 of two different tiers 108 of the preliminary stack structure 102 (e.g., two vertically neighboring tiers 108 of the preliminary stack structure 102). For example, the first region 116A of the trench 116 may vertically terminate at the first insulative structure 104 of a relatively higher tier 108 of the preliminary stack structure 102; and the second region 116B of the trench 116 may vertically terminate at the first insulative structure 104 of a relatively lower tier 108 of the preliminary stack structure 102. Put another way, the first portion 118A of the lower vertical boundary 118 of the trench 116 may be defined by an exposed portion of the first insulative structure 104 of the relatively higher tier 108 of the preliminary stack structure 102; and the second portion 118B of the lower vertical boundary 118 of the trench 116 may be defined by an exposed portion of the first insulative structure 104 of the relatively lower tier 108 of the preliminary stack structure 102.

Figure 1D:
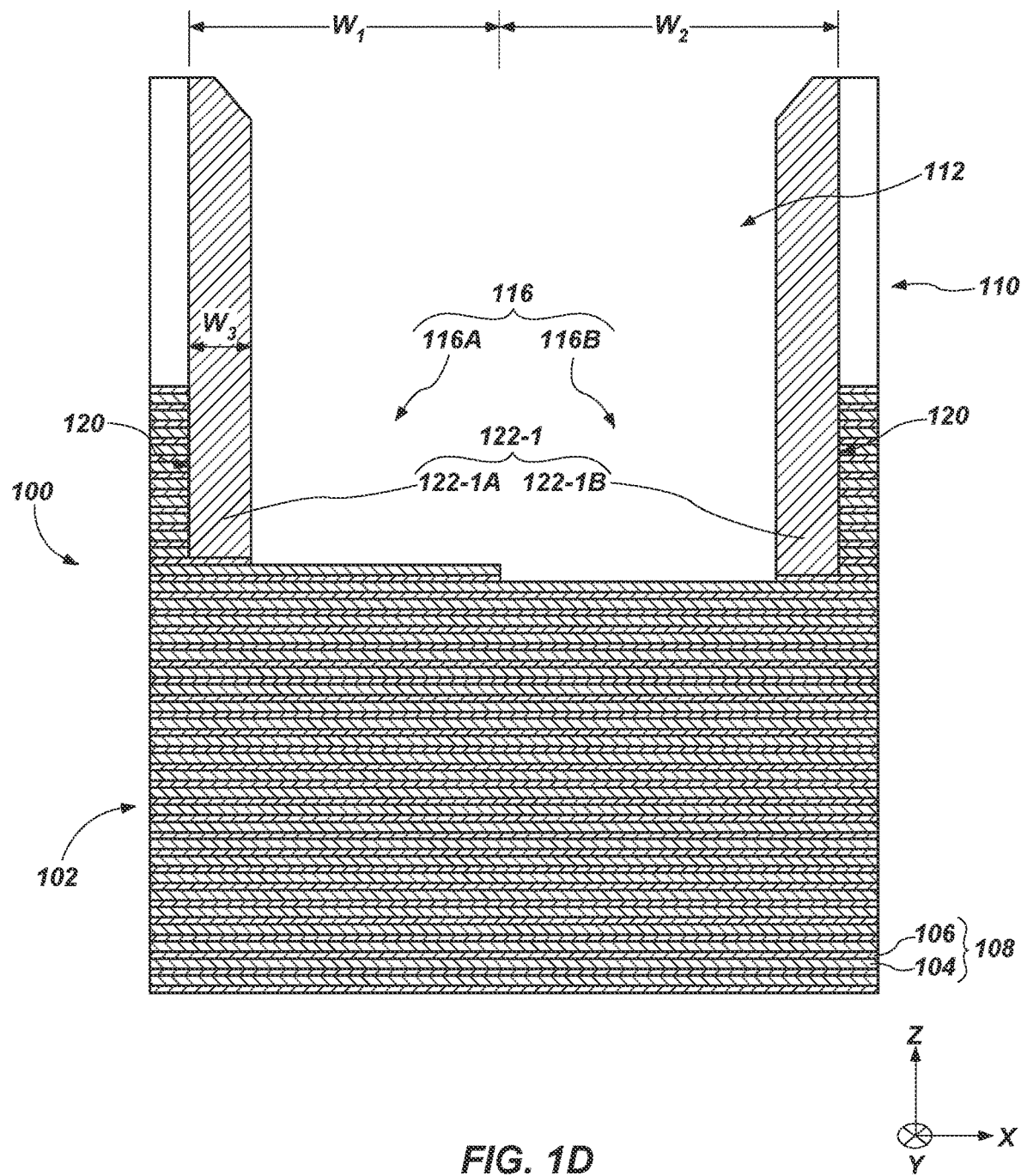

Referring next to FIG. 1D, a first dielectric spacer structure 122-1 may be formed within the opening 112 in the patterned mask structure 110 and the trench 116 in the preliminary stack structure 102. The first dielectric spacer structure 122-1 may partially (e.g., less than completely) fill each of the opening 112 and the trench 116, and may be formed on exposed surfaces of the patterned mask structure 110 and the preliminary stack structure 102 within horizontal boundaries (e.g., in the X-direction and the Y-direction) of the trench 116 (and, hence, the opening 112 in the patterned mask structure 110). For example, as shown in FIG. 1D, the first dielectric spacer structure 122-1 may be formed directly horizontally adjacent (e.g., horizontally on) side surfaces of the patterned mask structure 110 and the preliminary stack structure 102 at (e.g., coplanar with) the horizontal boundaries 120 of the trench 116, and may also be formed directly vertically adjacent (e.g., vertically on) upper surfaces of tiers 108 of the preliminary stack structure 102 defining the lower vertical boundary 118 (FIG. 1C, including the first portion 118A and the second portion 118B thereof) of the trench 116. The first dielectric spacer structure 122-1 may substantially vertically extend across (e.g., in the Z-direction) and cover the side surfaces of the patterned mask structure 110 and the preliminary stack structure 102 at (e.g., coplanar with) the horizontal boundaries 120 of the trench 116, and may only partially horizontally extend across (e.g., in the X-direction and the Y-direction) and cover the upper surfaces of the tiers 108 of the preliminary stack structure 102 defining the lower vertical boundary 118 (FIG. 1C) of the trench 116.

As shown in FIG. 1D, the first dielectric spacer structure 122-1 may include a first portion 122-1A and a second portion 122-1B. The first portion 122-1A may be formed within horizontal boundaries of the first region 116A of the trench 116, and the second dielectric spacer structure 122-2 may be formed within horizontal boundaries of the second region 116B of the trench 116. The second portion 122-1B may vertically extend (e.g., in the Z-direction) to a lower vertical depth than the first portion 122-1A. The vertical depth of the first portion 122-1A may correspond to (e.g., be substantially the same as) the vertical depth of the first region 116A of the trench 116; and the vertical depth of the second portion 122-1B may correspond to (e.g., be substantially the same as) the vertical depth of the second region 116B of the trench 116. For example, the first portion 122-1A may vertically extend to and terminate at a relatively higher tier 108 defining the first portion 118A (FIG. 1C) of the lower vertical boundary 118 (FIG. 1C) of the trench 116; and the second portion 122-1B may vertically extend to and terminate at a relatively lower tier 108 defining the second portion 118B (FIG. 1C) of the lower vertical boundary 118 (FIG. 1C) of the trench 116.

The first dielectric spacer structure 122-1 may be formed to exhibit a third width $W_3$ (e.g., in the X-direction). The third width $W_3$ may at least partially depend on the overall width (e.g., the combination of the first width $W_1$ and the second width $W_2$ previously described with reference to FIG. 1C) of the trench 116, and a desired configuration of a stadium structure to be formed within horizontal boundaries of the trench 116, as described in further detail below. By way of non-limiting example, the third width $W_3$ may be within a range of from about 25 nanometers (nm) to about 500 nm.

The first dielectric spacer structure 122-1 may be formed of and include at least one dielectric material having different etch selectivity than the first insulative structures 104 of the preliminary stack structure 102. The first dielectric spacer structure 122-1 may, for example, have an etch selectivity substantially similar to that of the second insulative structures 106 of preliminary stack structure 102. Portions of the first dielectric spacer structure 122-1 may be employed to protect (e.g., mask) portions of the preliminary stack structure 102 during subsequent processing acts (e.g., subsequent material removal acts, such as subsequent etching acts), as described in further detail below. By way of non-limiting example, the first dielectric spacer structure 122-1 may be formed of and include at least one oxygen-containing dielectric material, such as a one or more of a dielectric oxide material (e.g., one or more of $SiO_x$, phosphosilicate glass, borosilicate glass, borophosphosilicate glass, fluorosilicate glass, $AlO_x$, $HfO_x$, $NbO_x$, and $TiO_x$), a dielectric oxynitride material (e.g., $SiO_xN_y$), and a dielectric carboxynitride material (e.g., $SiO_xC_zN_y$). A material composition of the first dielectric spacer structure 122-1 may be different than a material composition of the first insulative structures 104 of the preliminary stack structure 102. The material composition of the first dielectric spacer structure 122-1 may be substantially the same as or may be different than a material composition of the second insulative structures 106 of the preliminary stack structure 102. In some embodiments, the first dielectric spacer structure 122-1 is formed of and includes $SiO_x$ (e.g., $SiO_2$).

The first dielectric spacer structure 122-1 may be formed by conformally forming (e.g., through one or more of a conventional ALD process, and a conventional conformal CVD process) a dielectric material (e.g., a dielectric oxide material) on or over surfaces of the preliminary stack structure 102 and the patterned mask structure 110 inside and outside of the trench 116. Thereafter, the microelectronic device structure 100 may be subjected to at least one material removal (e.g., etching, such as anisotropic dry etching) process to form the first dielectric spacer structure 122-1 (including the first portion 122-1A and the second portion 122-1B thereof). The material removal process may substantially (e.g., completely) remove portions of the dielectric material on or over upper surfaces of the patterned mask structure 110 outside of the trench 116, and may partially remove portions of dielectric material on or over surfaces of the preliminary stack structure 102 at the lower vertical boundary 118 (FIG. 1C) of the trench 116. As shown in FIG. 1D, the material removal process may also remove portions of the second insulative structures 106 of tiers 108 of the preliminary stack structure 102 defining the lower vertical boundary 118 (FIG. 1C) of the trench 116 to expose (e.g., uncover) portions of the first insulative structures 104 of the tiers 108 within horizontal boundaries of the trench 116. The exposed portions of the first insulative structures 104 of the tiers 108 may be horizontally bounded by the first dielectric spacer structure 122-1 within the horizontal boundaries of the trench 116.

Figure 1E:
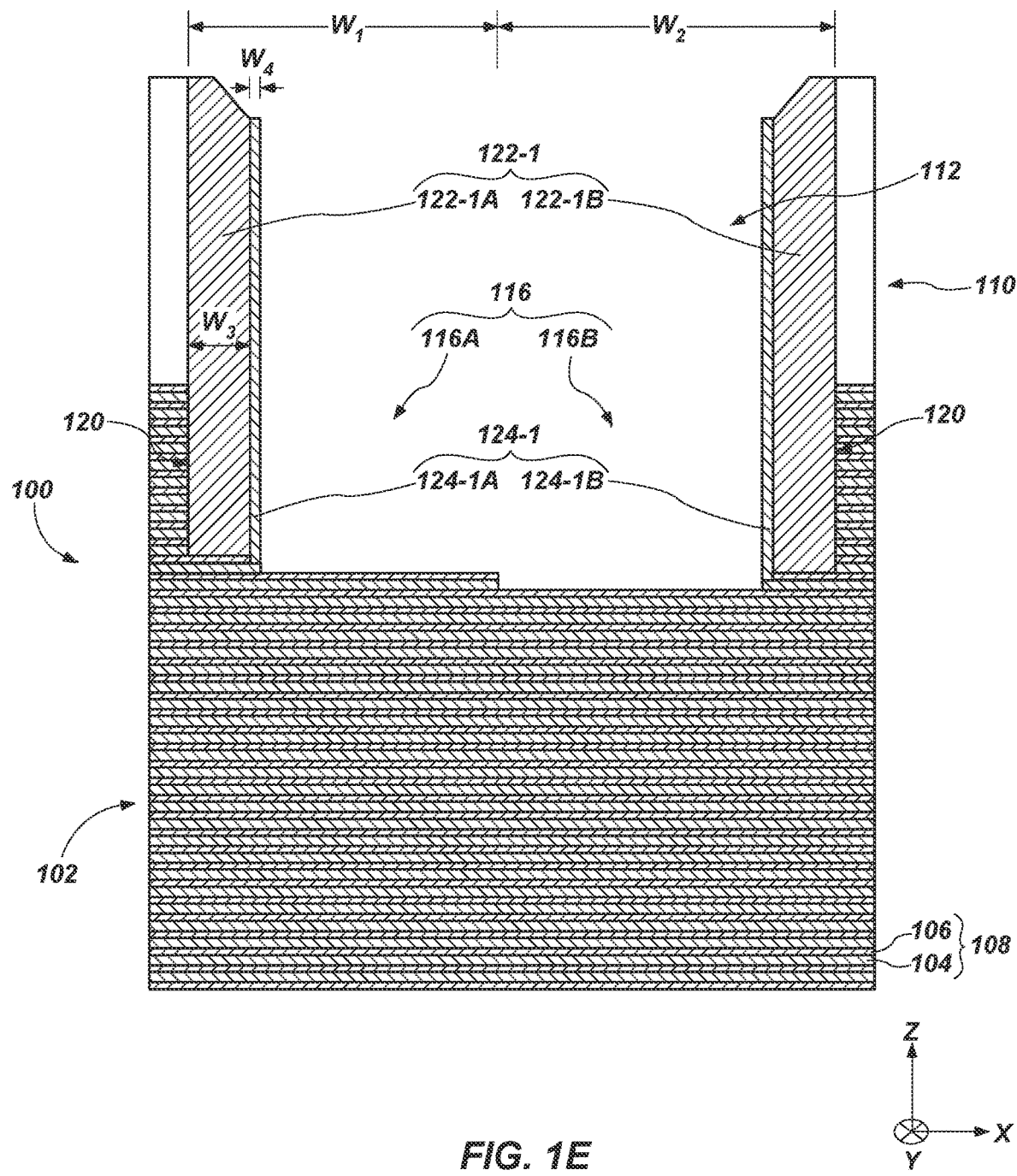

Referring next to FIG. 1E, a first dielectric liner structure 124-1 may be formed within remaining (e.g., unfilled) portions of the opening 112 in the patterned mask structure 110 and the trench 116 in the preliminary stack structure 102. The first dielectric liner structure 124-1 may partially (e.g., less than completely) fill the remaining portions of each of the opening 112 and the trench 116, and may be formed on exposed surfaces of the first dielectric spacer structure 122-1 and the preliminary stack structure 102 within horizontal boundaries (e.g., in the X-direction and the Y-direction) of the trench 116 (and, hence, the opening 112 in the patterned mask structure 110). For example, the first dielectric liner structure 124-1 may be formed directly horizontally adjacent (e.g., horizontally on) inner side surfaces of the first dielectric spacer structure 122-1 (including the first portion 122-1A and the second portion 122-1B thereof), and may also be formed directly vertically adjacent (e.g., vertically on) upper surfaces of first insulative structures 104 of tiers 108 of the preliminary stack structure 102 at a modified lower vertical boundary of the trench 116 formed in the processing stage previously described with reference to FIG. 1D. The first dielectric liner structure 124-1 may substantially vertically extend across (e.g., in the Z-direction) and cover the inner side surfaces of the first dielectric spacer structure 122-1.

As shown in FIG. 1E, the first dielectric liner structure 124-1 may include a first portion 124-1A and a second portion 124-1B. The first portion 124-1A may be formed within horizontal boundaries of the first region 116A of the trench 116, and the second dielectric liner structure 124-2 may be formed within horizontal boundaries of the second region 116B of the trench 116. The first portion 124-1A may be formed directly horizontally adjacent (e.g., horizontally on) the first portion 122-1A of the first dielectric spacer structure 122-1, and the second portion 124-1B may be formed directly horizontally adjacent (e.g., horizontally on) the second portion 122-1B of the first dielectric spacer structure 122-1. The second portion 124-1B of the first dielectric liner structure 124-1 may vertically extend (e.g., in the Z-direction) to a vertical depth within the preliminary stack structure 102 relatively lower than a vertical depth of the first portion 124-1A of the first dielectric liner structure 124-1. The vertical depth of the first portion 124-1A of the first dielectric liner structure 124-1 may be greater than or equal to the vertical depth of the first portion 122-1A of the first dielectric spacer structure 122-1; and the vertical depth of the second portion 124-1B of the first dielectric liner structure 124-1 may be greater than or equal to the vertical depth of the second portion 122-1B of the first dielectric spacer structure 122-1. For example, the first portion 124-1A of the first dielectric liner structure 124-1 may vertically extend to and terminate at the first insulative structure 104 of a tier 108 of the preliminary stack structure 102 vertically neighboring a lower vertical boundary of the first portion 122-1A of the first dielectric spacer structure 122-1; and the second portion 124-1B of the first dielectric liner structure 124-1 may vertically extend to and terminate at the first insulative structure 104 of another, relatively lower tier 108 of the preliminary stack structure 102 vertically neighboring a lower vertical boundary of the second portion 122-1B of the first dielectric spacer structure 122-1.

The first dielectric liner structure 124-1 may be formed to exhibit a fourth width $W_4$ (e.g., in the X-direction). The fourth width $W_4$ may, for example, be substantially equal to a vertical height (e.g., in the Z-direction) of each of the first insulative structures 104 of the preliminary stack structure 102. In additional embodiments, the fourth width $W_4$ is different than (e.g., less than, greater than) a vertical height of one or more (e.g., each) of the first insulative structures 104 of the preliminary stack structure 102.

The first dielectric liner structure 124-1 may be formed of and include at least one dielectric material having different etch selectivity than the second insulative structures 106 of the preliminary stack structure 102. The first dielectric liner structure 124-1 may, for example, have an etch selectivity substantially similar to that of the first insulative structures 104 of preliminary stack structure 102. By way of non-limiting example, if formed, the first dielectric liner structure 124-1 may be formed of and include at least one dielectric nitride material (e.g., $SiN_y$). A material composition of the first dielectric liner structure 124-1 may be different than material composition(s) of the first dielectric spacer structure 122-1 (FIG. 1D) and the second insulative structures 106 of the preliminary stack structure 102. The material composition of the first dielectric liner structure 124-1 may be substantially the same as or may be different than a material composition of the first insulative structures 104 of the preliminary stack structure 102. In some embodiments, the first dielectric liner structure 124-1 is formed of and includes $SiN_y$ (e.g., $Si_3N_4$).

The first dielectric liner structure 124-1 may be formed by conformally forming (e.g., through one or more of a conventional ALD process, and a conventional conformal CVD process) an additional dielectric material (e.g., a dielectric nitride material) on or over surfaces of the preliminary stack structure 102, the first dielectric spacer structure 122-1, and the patterned mask structure 110 inside and outside of the trench 116. Thereafter, the microelectronic device structure 100 may be subjected to at least one material removal (e.g., etching, such as anisotropic dry etching) process to form the first dielectric liner structure 124-1 (including the first portion 124-1A and the second portion 124-1B thereof). The material removal process may substantially (e.g., completely) remove portions of the additional dielectric material on or over upper surfaces of the patterned mask structure 110 and the first dielectric spacer structure 122-1, and may partially remove portions of additional dielectric material on or over surfaces of the preliminary stack structure 102 at the modified lower vertical boundary of the trench 116. As shown in FIG. 1E, the material removal process may also remove portions of the first insulative structures 104 of tiers 108 of the preliminary stack structure 102 vertically neighboring lower vertical boundaries of the first portion 122-1A and the second portion 122-1B of the first dielectric spacer structure 122-1 to expose (e.g., uncover) portions of the second insulative structures 106 of relatively vertically lower tiers 108 within horizontal boundaries of the trench 116. The exposed portions of the second insulative structures 106 of the relatively vertically lower tiers 108 may be horizontally bounded by the first dielectric liner structure 124-1 within the horizontal boundaries of the trench 116.

Figure 1F:
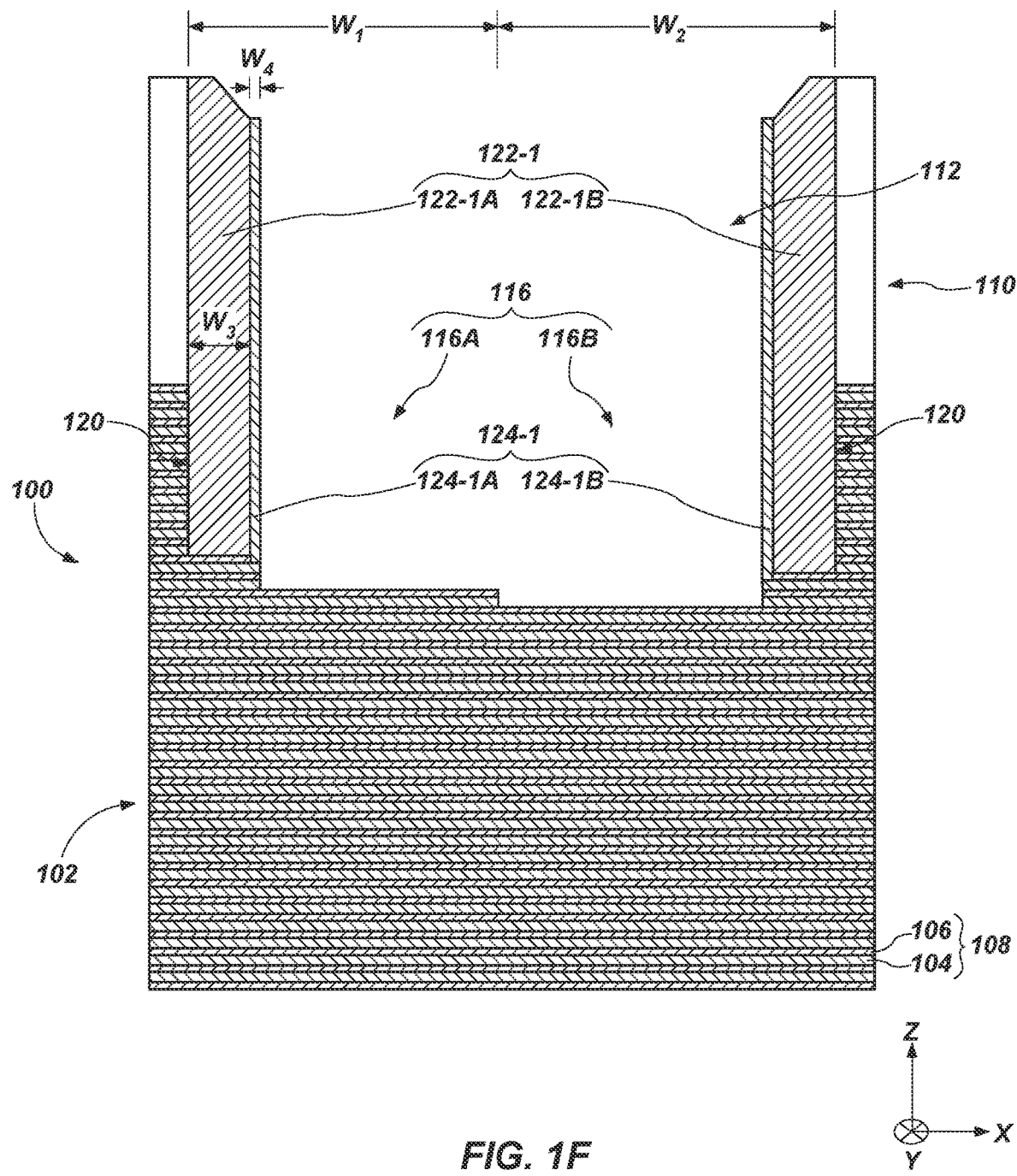

Referring next to FIG. 1F, the microelectronic device structure 100 may be subjected to at least one additional material removal (e.g., etching, such as anisotropic dry etching) processes to increase vertical depths (e.g., in the Z-direction) of remaining (e.g., unfilled) portions of the trench 116. The additional material removal process may increase a vertical depth of a remaining portion of the first region 116A of the trench 116, and may also increase a vertical depth of a remaining portion of the second region 116B of the trench 116. Following the additional material removal process, the remaining portion of the second region 116B of the trench 116 may vertically extend to a relatively lower depth within the preliminary stack structure 102 than the remaining portion of the first region 116A of the trench 116. A magnitude of a vertical offset between a lower vertical boundary of the first region 116A of the trench 116 and a lower vertical boundary of the second region 116B of the trench 116 may be substantially maintained at the end of the additional material removal process. For example, the additional material removal process may increase a vertical depth of each of the remaining portion of the first region 116A of the trench 116 and the remaining portion of the second region 116B of the trench 116 by a distance (e.g., in the Z-direction) substantially equal to the height (e.g., in the Z-direction) of a single (e.g., only one) tier 108 of the preliminary stack structure 102. Put another way, the additional material removal process may remove an exposed portion of a single (e.g., only one) tier 108 of the preliminary stack structure 102 vertically neighboring a modified lower vertical boundary of the first region 116A of the trench 116 at the end of the processing stage depicted in FIG. 1E; and may also remove an exposed portion of another, single (e.g., only one) tier 108 of the preliminary stack structure 102 vertically neighboring a modified lower vertical boundary of the second region 116B of the trench 116 at the end of the processing stage depicted in FIG. 1E.

As shown in FIG. 1F, following the additional material removal process, remaining (e.g., unfilled) portions the trench 116 (including remaining portions of the first region 116A and the second region 116B thereof) may vertically terminate (e.g., vertically end) at the second insulative structures 106 of two different tiers 108 of the preliminary stack structure 102 (e.g., two vertically neighboring tiers 108 of the preliminary stack structure 102). For example, the remaining portion of the first region 116A of the trench 116 may vertically terminate at the second insulative structure 106 of a relatively higher tier 108 of the preliminary stack structure 102; and the remaining portion of the second region 116B of the trench 116 may vertically terminate at the second insulative structure 106 of a relatively lower tier 108 of the preliminary stack structure 102. In additional embodiments, following the additional material removal process remaining (e.g., unfilled) portions the trench 116 may vertically terminate at the first insulative structures 104 of two different tiers 108 of the preliminary stack structure 102 (e.g., two vertically neighboring tiers 108 of the preliminary stack structure 102). For example, the first region 116A of the trench 116 may vertically terminate at the first insulative structure 104 of a relatively higher tier 108 of the preliminary stack structure 102; and the second region 116B of the trench 116 may vertically terminate at the first insulative structure 104 of a relatively lower tier 108 of the preliminary stack structure 102.

Figure 1G:
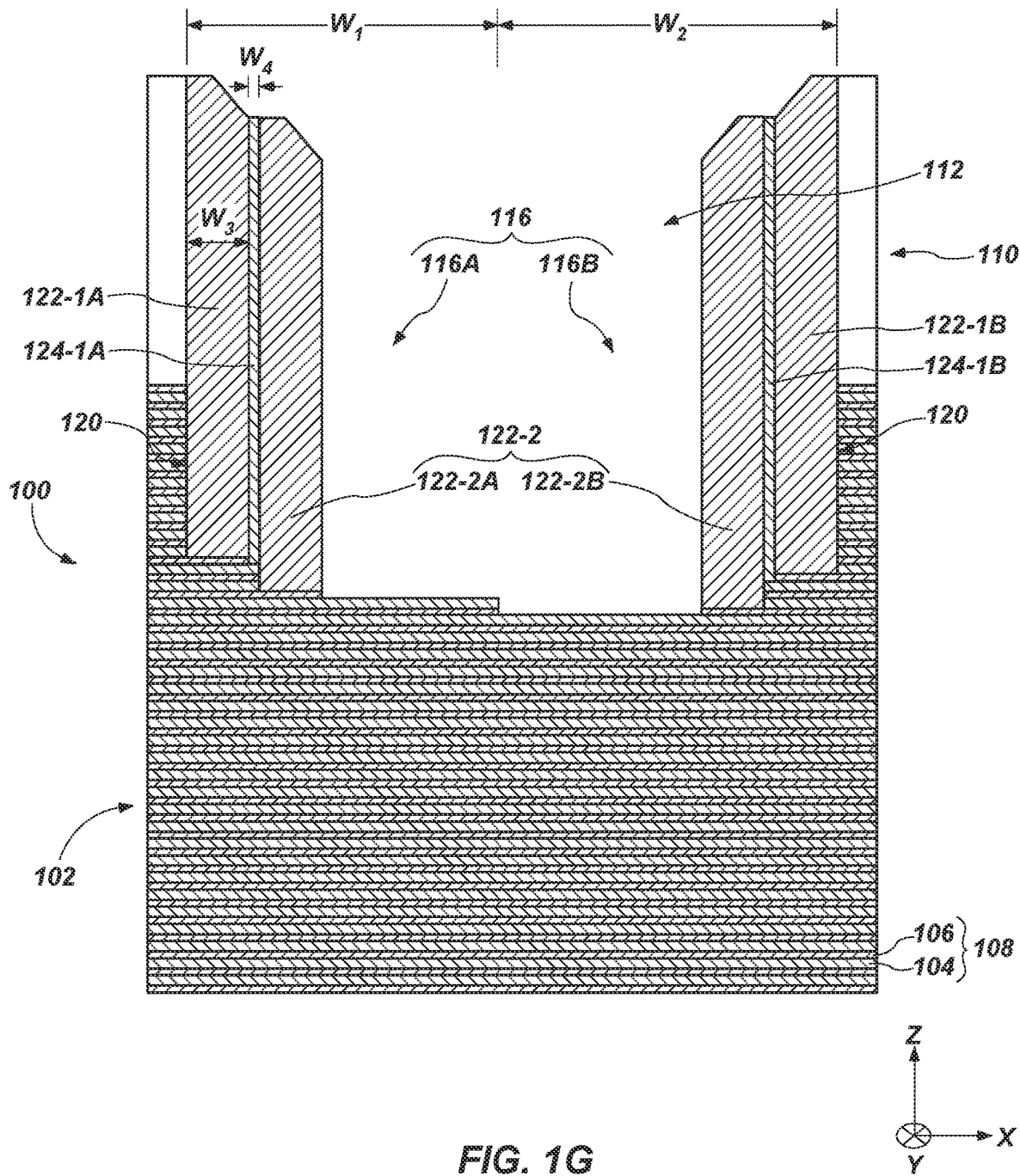

Referring next to FIG. 1G, a second dielectric spacer structure 122-2 may be formed within a remaining (e.g., unfilled) portion the opening 112 in the patterned mask structure 110 and in remaining, deepened portions of the trench 116 in the preliminary stack structure 102. The second dielectric spacer structure 122-2 may partially (e.g., less than completely) fill the remaining portion of the opening 112 and the remaining, deepened portions of the trench 116; and may be formed on exposed surfaces of the first dielectric liner structure 124-1 (FIG. 1F) and the preliminary stack structure 102 within horizontal boundaries (e.g., in the X-direction and the Y-direction) of the trench 116 (and, hence, the opening 112 in the patterned mask structure 110). For example, the second dielectric spacer structure 122-2 may be formed directly horizontally adjacent (e.g., horizontally on) exposed inner side surfaces of the first dielectric liner structure 124-1 (FIG. 1F, which includes the first portion 124-1A and the second portion 124-1B shown in FIG. 1G) and the preliminary stack structure 102 within the trench 116, and may also be formed directly vertically adjacent (e.g., vertically on) upper surfaces of second insulative structures 106 of tiers 108 of the preliminary stack structure 102 at a modified lower vertical boundary of the trench 116 formed in the processing stage previously described with reference to FIG. 1G. The second dielectric spacer structure 122-2 may substantially vertically extend across (e.g., in the Z-direction) and cover the inner side surfaces of the first dielectric liner structure 124-1 (FIG. 1F).

As shown in FIG. 1G, the second dielectric spacer structure 122-2 may include a first portion 122-2A and a second portion 122-2B. The first portion 122-2A may be formed within horizontal boundaries of the first region 116A of the trench 116, and the second portion 122-2B may be formed within horizontal boundaries of the second region 116B of the trench 116. The first portion 122-2A of the second dielectric spacer structure 122-2 may be formed directly horizontally adjacent (e.g., horizontally on) the first portion 124-1A of the first dielectric liner structure 124-1, and the second portion 122-2B may be formed directly horizontally adjacent (e.g., horizontally on) the second portion 124-1B of the first dielectric liner structure 124-1. The second portion 122-2B of the second dielectric spacer structure 122-2 may vertically extend (e.g., in the Z-direction) to a lower vertical depth within the preliminary stack structure 102 than the first portion 122-2A of the second dielectric spacer structure 122-2. The vertical depth of the first portion 122-2A of the second dielectric spacer structure 122-2 may be greater than the vertical depth of the first portion 124-1A of the first dielectric liner structure 124-1; and the vertical depth of the second portion 122-2B of the second dielectric spacer structure 122-2 may be greater than the vertical depth of the second portion 124-1B of the first dielectric liner structure 124-1. For example, the first portion 122-2A of the second dielectric spacer structure 122-2 may vertically extend to and terminate at the first insulative structure 104 of a relatively higher tier 108 of the preliminary stack structure 102; and the second portion 122-2B of the second dielectric spacer structure 122-2 may vertically extend to and terminate at the first insulative structure 104 of another, relatively lower tier 108 of the preliminary stack structure 102 vertically neighboring the relatively higher tier 108 of the preliminary stack structure 102.

In some embodiments, the second dielectric spacer structure 122-2 is formed to exhibit a width (e.g., in the X-direction) substantially equal to the third width $W_3$ of the first dielectric spacer structure 122-1 (FIG. 1D, including the first portion 122-1A and the second portion 122-1B shown in FIG. 1G). In additional embodiments, the second dielectric spacer structure 122-2 is formed to exhibit a width different than (e.g., greater than, less than) the third width $W_3$.

The second dielectric spacer structure 122-2 may be formed of and include at least one dielectric material having different etch selectivity than the first insulative structures 104 of the preliminary stack structure 102 and the first dielectric liner structure 124-1 (FIG. 1F). The second dielectric spacer structure 122-2 may, for example, have etch selectively substantially similar to that of the second insulative structures 106 of preliminary stack structure 102 and the first dielectric spacer structure 122-1 (FIG. 1D). By way of non-limiting example, the second dielectric spacer structure 122-2 may be formed of and include at least one oxygen-containing dielectric material, such as a one or more of a dielectric oxide material (e.g., one or more of $SiO_x$, phosphosilicate glass, borosilicate glass, borophosphosilicate glass, fluorosilicate glass, $AlO_x$, $HfO_x$, $NbO_x$, and $TiO_x$), a dielectric oxynitride material (e.g., $SiO_xN_y$), and a dielectric carboxynitride material (e.g., $SiO_xC_zN_y$). A material composition of the second dielectric spacer structure 122-2 may be different than material composition(s) of the first insulative structures 104 of the preliminary stack structure 102 and the first dielectric liner structure 124-1 (FIG. 1F). The material composition of the second dielectric spacer structure 122-2 may be substantially the same as or may be different than a material composition of the second insulative structures 106 of the preliminary stack structure 102 and the first dielectric spacer structure 122-1 (FIG. 1D). In some embodiments, the second dielectric spacer structure 122-2 is formed of and includes $SiO_x$ (e.g., $SiO_2$).

The second dielectric spacer structure 122-2 may be formed by conformally forming (e.g., through one or more of a conventional ALD process, and a conventional conformal CVD process) a dielectric material (e.g., a dielectric oxide material) on or over surfaces of the preliminary stack structure 102, the first dielectric spacer structure 122-1, the first dielectric liner structure 124-1, and the patterned mask structure 110 inside and outside of the trench 116. Thereafter, the microelectronic device structure 100 may be subjected to at least one material removal (e.g., etching, such as anisotropic dry etching) process to form the second dielectric spacer structure 122-2 (including the first portion 122-2A and the second portion 122-2B thereof). The material removal process may substantially (e.g., completely) remove portions of the dielectric material on or over upper surfaces of the patterned mask structure 110, the first dielectric spacer structure 122-1, and the first dielectric liner structure 124-1; and may partially remove portions of the dielectric material on or over surfaces of the preliminary stack structure 102 at a modified lower vertical boundary of the trench 116. As shown in FIG. 1G, the material removal process may also remove portions of the second insulative structures 106 of tiers 108 of the preliminary stack structure 102 defining the modified lower vertical boundary of the trench 116 to expose (e.g., uncover) portions of the first insulative structures 104 of the tiers 108 within horizontal boundaries of the trench 116. The exposed portions of the first insulative structures 104 of the tiers 108 may be horizontally bounded by the second dielectric spacer structure 122-2 within the horizontal boundaries of the trench 116.

Figure 1H:
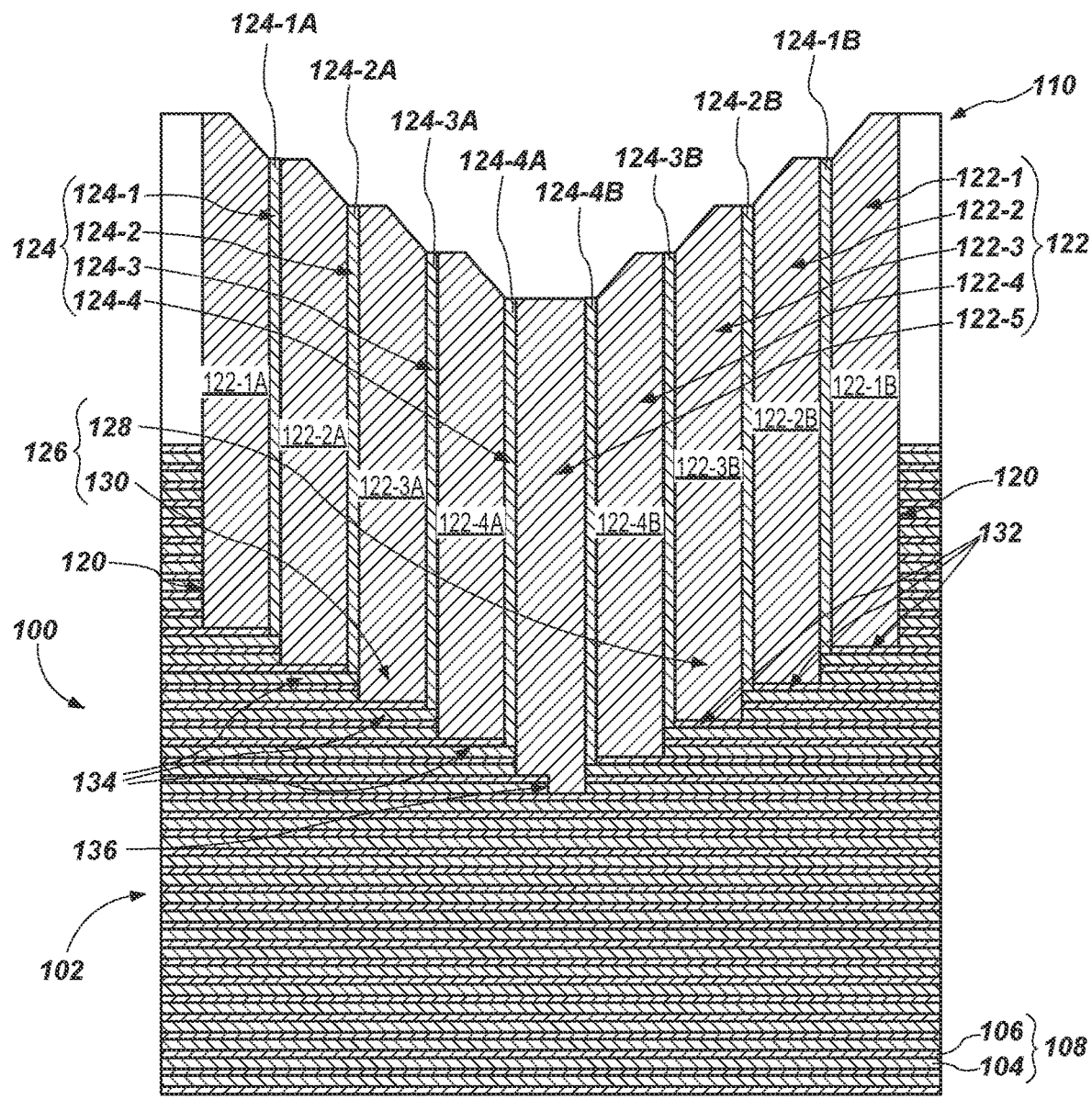

Referring next to FIG. 1H, following the processing stage described with reference to FIG. 1G, the microelectronic device structure 100 may be subjected to additional processing acts similar to those previously described with reference to FIGS. 1E through 1G to fill remaining portions of the trench 116 (FIG. 1G) with more of the dielectric liner structures 124 (e.g., in addition to the first dielectric liner structure 124-1) and more of the dielectric spacer structures 122 (e.g., in addition to the first dielectric spacer structure 122-1 and the second dielectric spacer structure 122-2), and form a stadium structure 126 vertically underlying and in contact with the dielectric liner structures 124 and the dielectric spacer structures 122. As shown in FIG. 1H, the stadium structure 126 may include a forward staircase structure 128 including steps 132 comprising horizontal ends of pairs of the tiers 108 of the preliminary stack structure 102; a reverse staircase structure 130 including additional steps 134 comprising horizontal ends of additional pairs of the tiers 108 of the preliminary stack structure 102; and a central region 136 horizontally interposed between the forward staircase structure 128 and the reverse staircase structure 130. The central region 136 of the stadium structure 126 may, for example, constitute an intersection region and vertical termination location for the forward staircase structure 128 and the reverse staircase structure 130. As described in further detail below, different dielectric spacer structures 122 and different dielectric liner structures 124 may be formed to physically contact different steps 132 of the forward staircase structure 128 and different additional steps 134 of the reverse staircase structure 130 than one another.

As shown in FIG. 1H, the dielectric liner structures 124 formed within the horizontal boundaries 120 of the trench 116 (FIG. 1G) may include the first dielectric liner structure 124-1 (comprising the first portion 124-1A and the second portion 124-1B thereof); a second dielectric liner structure 124-2 (comprising a first portion 124-2A and a second portion 124-2B thereof) vertically extending relatively deeper into the preliminary stack structure 102 than the first dielectric liner structure 124-1; a third dielectric liner structure 124-3 (comprising a first portion 124-3A and a second portion 124-3B thereof) vertically extending relatively deeper into the preliminary stack structure 102 than the second dielectric liner structure 124-2; and a fourth dielectric liner structure 124-4 (comprising a first portion 124-4A and a second portion 124-4B thereof) vertically extending relatively deeper into the preliminary stack structure 102 than the third dielectric liner structure 124-3. In additional embodiments, a different quantity of the dielectric liner structures 124 is formed within the horizontal boundaries 120 of the trench 116 (FIG. 1G). For example, greater than four (4) (e.g., greater than or equal to ten (10), greater than or equal to twenty (20), greater than or equal to fifty (50)) of the dielectric liner structures 124 may be formed within the horizontal boundaries 120 of the trench 116 (FIG. 1G), or less than four (4) of the dielectric liner structures 124 may be formed within the horizontal boundaries 120 of the trench 116 (FIG. 1G). The quantity of dielectric liner structures 124 formed within the horizontal boundaries of the trench 116 (e.g., through processing acts similar to those previously described with reference to FIG. 1E) may at least partially depend on the horizontal dimensions of the trench 116 (FIG. 1G), the dielectric spacer structures 122, and the dielectric liner structures 124.

Still referring to FIG. 1H, the dielectric liner structures 124 may physically contact the first insulative structures 104 of different tiers 108 of the preliminary stack structure 102 at the steps 132 and the additional steps 134 of the stadium structure 126. As shown in FIG. 1H, the first portions 124-1A, 124-2A, 124-3A, 124-4A of the different dielectric liner structures 124 (e.g., the first dielectric liner structure 124-1, the second dielectric liner structure 124-2, the third dielectric liner structure 124-3, the fourth dielectric liner structure 124-4) may physically contact at least some of the additional steps 134 of the reverse staircase structure 130 of the stadium structure 126; and the second portions 124-1B, 124-2B, 124-3B, 124-4B of the different dielectric liner structures 124 (e.g., the first dielectric liner structure 124-1, the second dielectric liner structure 124-2, the third dielectric liner structure 124-3, the fourth dielectric liner structure 124-4) may physically contact at least some of the steps 132 of the forward staircase structure 128 of the stadium structure 126.

As depicted in FIG. 1H, the dielectric liner structures 124 formed within the horizontal boundaries 120 of the trench 116 (FIG. 1G) may individually be horizontally positioned at horizontal boundaries (e.g., in the X-direction, in the Y-direction) of the steps 132 and the additional steps 134 of the stadium structure 126 that the dielectric liner structures 124 physically contact. Put another way, a horizontal boundary (e.g., an inner horizontal boundary positioned relatively closer to the central region 136 of the stadium structure 126 than another, outer horizontal boundary) of each dielectric liner structure 124 may be substantially coplanar with horizontal boundaries (e.g., the inner horizontal boundaries horizontally positioned relatively closer to the central region 136 of the stadium structure 126 than other, outer horizontal boundaries) of the step 132 and the additional step 134 of the stadium structure 126 that the dielectric liner structure 124 physically contacts.

The dielectric liner structures 124 may horizontally alternate with the dielectric spacer structures 122 within the horizontal boundaries 120 of the trench 116 (FIG. 1G). By way of non-limiting example, as shown in FIG. 1H, the first dielectric liner structure 124-1 may be horizontally interposed between the first dielectric spacer structure 122-1 and the second dielectric spacer structure 122-2; the second dielectric liner structure 124-2 may be horizontally interposed between the second dielectric spacer structure 122-2 and a third dielectric spacer structure 122-3; the third dielectric liner structure 124-3 may be horizontally interposed between the third dielectric spacer structure 122-3 and a fourth dielectric spacer structure 122-4; and the fourth dielectric liner structure 124-4 may be horizontally interposed between the fourth dielectric spacer structure 122-4 and a fifth dielectric spacer structure 122-5. Each dielectric liner structure 124 may horizontally extend from and between the dielectric spacer structures 122 horizontally neighboring the dielectric liner structure 124.

Each of the dielectric liner structures 124 may exhibit substantially the same width (e.g., in the X-direction) as each other of the dielectric liner structures 124, or at least one of the dielectric liner structures 124 may exhibit a different width than at least one other of the dielectric liner structures 124. In some embodiments, the dielectric liner structures 124 each individually exhibit a width substantially equal to a vertical height (e.g., in the Z-direction) of one or more of the first insulative structures 104 of the preliminary stack structure 102 that the dielectric liner structure 124 physically contacts. As a non-limiting example, the dielectric liner structures 124 may each individually exhibit the fourth width $W_4$ (FIG. 1G) previously described with reference to the first dielectric liner structure 124-1. In additional embodiments, at least one the dielectric liner structure 124 exhibits a width different than (e.g., less than, greater than) a vertical height of one or more of the first insulative structures 104 of the preliminary stack structure 102 that the dielectric liner structure 124 physically contacts.

Still referring to FIG. 1H, the dielectric spacer structures 122 formed within the horizontal boundaries 120 of the trench 116 (FIG. 1G) may include the first dielectric spacer structure 122-1 (comprising the first portion 122-1A and the second portion 122-1B thereof); the second dielectric spacer structure 122-2 (comprising the first portion 122-2A and the second portion 122-2B thereof) vertically extending relatively deeper into the preliminary stack structure 102 than the first dielectric spacer structure 122-1; the third dielectric spacer structure 122-3 (comprising a first portion 122-3A and a second portion 122-3B thereof) vertically extending relatively deeper into the preliminary stack structure 102 than the second dielectric spacer structure 122-2; the fourth dielectric spacer structure 122-4 (comprising a first portion 122-4A and a second portion 122-4B thereof) vertically extending relatively deeper into the preliminary stack structure 102 than the third dielectric spacer structure 122-3; and the fifth dielectric spacer structure 122-5 vertically extending relatively deeper into the preliminary stack structure 102 than the fourth dielectric spacer structure 122-4. In additional embodiments, a different quantity of the dielectric spacer structures 122 is formed within the horizontal boundaries 120 of the trench 116 (FIG. 1G). For example, greater than five (5) (e.g., greater than or equal to ten (10), greater than or equal to twenty (20), greater than or equal to fifty (50)) of the dielectric spacer structures 122 may be formed within the horizontal boundaries 120 of the trench 116 (FIG. 1G), or less than five (5) of the dielectric spacer structures 122 may be formed within the horizontal boundaries 120 of the trench 116 (FIG. 1G). The quantity of dielectric spacer structures 122 formed within the horizontal boundaries 120 of the trench 116 (e.g., through processing acts similar to those previously described with reference to FIG. 1E) may at least partially depend on the horizontal dimensions of the trench 116 (FIG. 1G), the dielectric spacer structures 122, and the dielectric liner structures 124.

The dielectric spacer structures 122 may be formed horizontally adjacent the dielectric spacer structures 122 over different steps 132 and additional steps 134 of the stadium structure 126. As shown in FIG. 1H, the first portions 122-1A, 122-2A, 122-3A, 122-4A of the different dielectric spacer structures 122 (e.g., the first dielectric spacer structure 122-1, the second dielectric spacer structure 122-2, the third dielectric spacer structure 122-3, the fourth dielectric spacer structure 122-4) may be formed over and within horizontal boundaries of at least some of the additional steps 134 of the reverse staircase structure 130 of the stadium structure 126; and the second portions 122-1B, 122-2B, 122-3B, 122-4B of the different dielectric spacer structures 122 (e.g., the first dielectric spacer structure 122-1, the second dielectric spacer structure 122-2, the third dielectric spacer structure 122-3, the fourth dielectric spacer structure 122-4) may be formed over and within horizontal boundaries of at least some of the steps 132 of the forward staircase structure 128 of the stadium structure 126. The fifth dielectric spacer structure 122-5 may be formed over and within horizontal boundaries of the central region 136 of the stadium structure 126.

As previously described, the dielectric spacer structures 122 may horizontally alternate with the dielectric spacer structures 122 within the horizontal boundaries 120 of the trench 116 (FIG. 1G). By way of non-limiting example, as shown in FIG. 1H, the first dielectric spacer structure 122-1 may be horizontally interposed between the first dielectric liner structure 124-1 and portions of the preliminary stack structure 102 and the patterned mask structure 110 at the horizontal boundaries 120 of the trench 116 (FIG. 1G); the second dielectric spacer structure 122-2 may be horizontally interposed between the first dielectric liner structure 124-1 and the second dielectric liner structure 124-2; the third dielectric spacer structure 122-3 may be horizontally interposed between the second dielectric liner structure 124-2 and the third dielectric liner structure 124-3; the fourth dielectric spacer structure 122-4 may be horizontally interposed between the third dielectric liner structure 124-3 and the fourth dielectric liner structure 124-4; and the fifth dielectric spacer structure 122-5 may be horizontally interposed between the first portion 124-4A of the fourth dielectric liner structure 124-4 and the second portion 124-4B of the fourth dielectric liner structure 124-4.

Each of the dielectric spacer structures 122 may exhibit substantially the same width (e.g., in the X-direction) as each other of the dielectric spacer structures 122, or at least one of the dielectric spacer structures 122 may exhibit a different width than at least one other of the dielectric spacer structures 122. In some embodiments, the dielectric spacer structure 122 (e.g., the fifth dielectric spacer structure 122-5) positioned within horizontal boundaries of the central region 136 of the stadium structure 126 exhibits a different width (e.g., a greater width, a smaller width) than one or more (e.g., each) other of the dielectric spacer structures 122. In additional embodiments, the dielectric spacer structure 122 (e.g., the fifth dielectric spacer structure 122-5) positioned within horizontal boundaries of the central region 136 of the stadium structure 126 exhibits substantially the same width (e.g., the third width $W_3$ (FIG. 1G)) as each other of the dielectric spacer structures 122.

With continued reference to FIG. 1H, the forward staircase structure 128 and the reverse staircase structure 130 of the stadium structure 126 may horizontally oppose one another (e.g., in the X-direction) and may be partially vertically offset from one another (e.g., in the Z-direction) within the horizontal boundaries 120 of the trench 116 (FIG.

1G). A phantom line extending from a top (e.g., a vertically uppermost one of the steps 132) of the forward staircase structure 128 to a bottom (e.g., a vertically lowermost one of the steps 132) of the forward staircase structure 128 may have a positive slope, and another phantom line extending from a top (e.g., a vertically uppermost one of the additional steps 134) of the reverse staircase structure 130 to a bottom (e.g., a vertically lowermost one of the additional steps 134) of the reverse staircase structure 130 may have a negative slope. In addition, upper boundaries (e.g., upper surfaces) of the steps 132 of the forward staircase structure 128 may be vertically offset from upper boundaries (e.g., upper surfaces) of the additional steps 134 of the reverse staircase structure 130. In some embodiments, upper boundaries of the steps 132 of the forward staircase structure 128 are vertical offset from (e.g., vertical underlie) upper boundaries of the additional steps 134 of the reverse staircase structure 130 most vertically proximate thereto by a distance equal to the thickness of one of the tiers 108 of the preliminary stack structure 102.

Individual steps 132 of the forward staircase structure 128 of the stadium structure 126 may comprise horizontal ends of two vertically neighboring tiers 108 of the preliminary stack structure 102. In addition, individual additional steps 134 of the reverse staircase structure 130 of the stadium structure 126 may also comprise horizontal ends of two vertically neighboring tiers 108 of the preliminary stack structure 102. Individual steps 132 of the stadium structure 126 vertically neighboring individual additional steps 134 of the stadium structure 126 may share a tier 108 of the preliminary stack structure 102 with the individual additional steps 134. For example, one of the two vertically neighboring tiers 108 of the preliminary stack structure 102 associated with (e.g., defining) an individual step 132 may also be one of the two vertically neighboring tiers 108 of the preliminary stack structure 102 associated with an individual additional step 134 vertically neighboring the individual step 132. A tier 108 shared by an individual step 132 and an individual additional step 134 vertically neighboring the individual step 132 may form a vertically upper portion of the individual step 132 and a vertically lower portion of the individual additional step 134, or vice versa. As a non-limiting example, an uppermost additional step 134 of the reverse staircase structure 130 may comprise horizontal ends of two vertically neighboring tiers 108 of the preliminary stack structure 102; and an uppermost step 132 of the forward staircase structure 128 may comprise horizontal ends of two additional vertically neighboring tiers 108 of the preliminary stack structure 102, wherein one of the two additional vertically neighboring tiers 108 is the same tier 108 as one of the two vertically neighboring tiers 108. A first of the two vertically neighboring tiers 108 may form an upper portion of the uppermost additional step 134 and may physically contact the first portion 124-1A of the first dielectric liner structure 124-1; and a second of the two vertically neighboring tiers 108 may form a lower portion of the uppermost additional step 134 and may not physically contact the first portion 124-1A of the first dielectric liner structure 124-1. In turn, the tier 108 forming the lower portion of the upper additional step 134 may constitute a first of the two additional vertically neighboring tiers 108 and may form an upper portion of the uppermost step 132 in physical contact with the second portion 124-1B of the first dielectric liner structure 124-1; and a second of the two additional vertically neighboring tiers 108 may form a lower portion of the uppermost step 132 and may not physically contact the second portion 124-1B of the first dielectric liner structure 124-1.

Figure 1I:
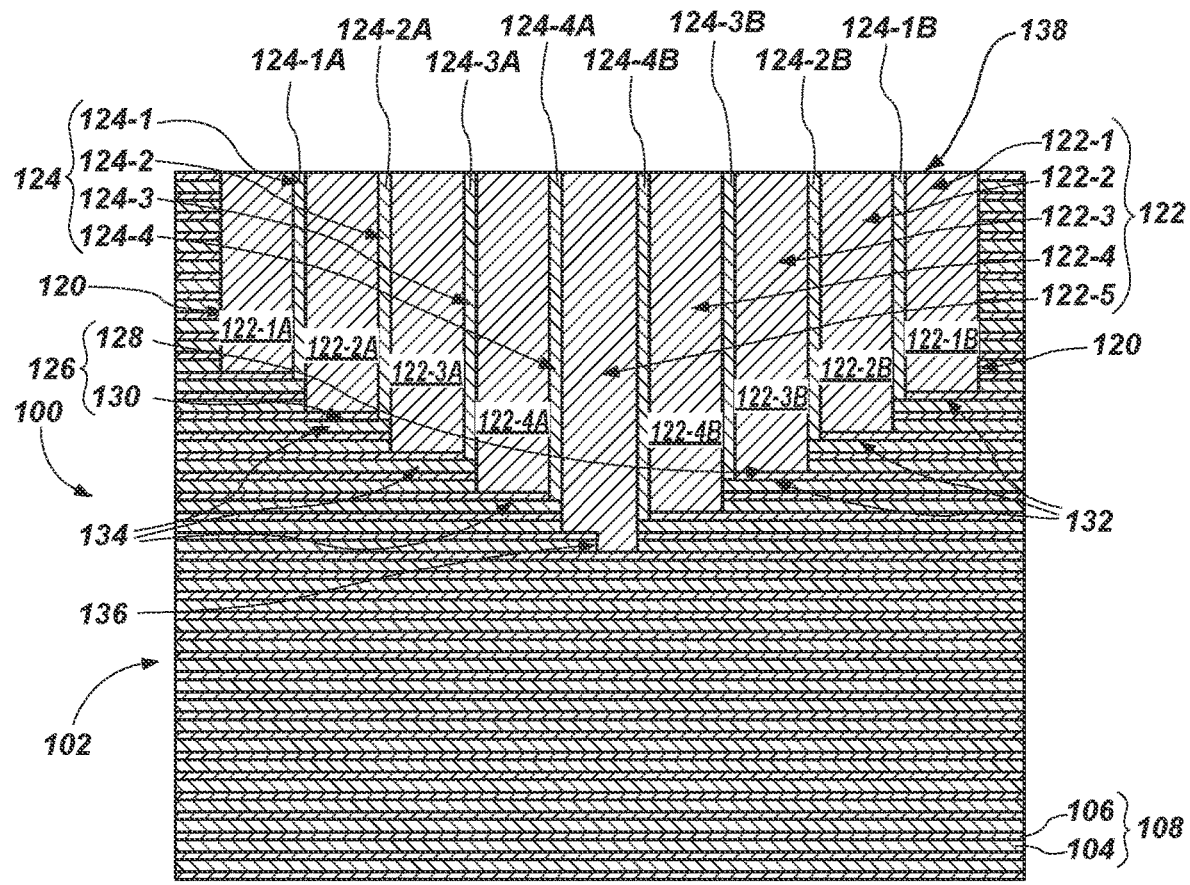

Referring next to FIG. 1I, the patterned mask structure 110 (FIG. 1H) and portions (e.g., upper portions) of the dielectric spacer structures 122 and the dielectric liner structures 124 outside of the vertical boundaries of the trench 116 (FIG. 1C) may be removed while retaining other portions (e.g., lower portions) of the dielectric spacer structures 122 and the dielectric liner structures 124 within the vertical boundaries of the trench 116 (FIG. 1C). As shown in FIG. 1I, the removal process may expose an uppermost surface of the preliminary stack structure 102 of the microelectronic device structure 100. Uppermost boundaries (e.g., uppermost surfaces) of remaining portions (e.g., lower portions) of the dielectric spacer structures 122 and the dielectric liner structures 124 may be substantially coplanar with the exposed uppermost surface of the preliminary stack structure 102. Put another way, following the removal process, uppermost boundaries (e.g., uppermost surfaces) of the dielectric spacer structures 122, the dielectric liner structures 124, and the preliminary stack structure 102 may form a substantially planar uppermost surface 138 of the microelectronic device structure 100.

The patterned mask structure 110 (FIG. 1H) and portions (e.g., upper portions) of the dielectric spacer structures 122 and the dielectric liner structures 124 outside of the vertical boundaries of the trench 116 (FIG. 1C) may be removed using conventional processes (e.g., conventional etching processes, conventional planarization processes), which are not described in detail herein. For example, the patterned mask structure 110 (FIG. 1H) and portions (e.g., upper portions) of the dielectric spacer structures 122 and the dielectric liner structures 124 outside of the vertical boundaries of the trench 116 (FIG. 1C) may be removed using one or more of an etching process (e.g., a wet etching process) and a chemical-mechanical planarization (CMP) process.

Figure 1J:
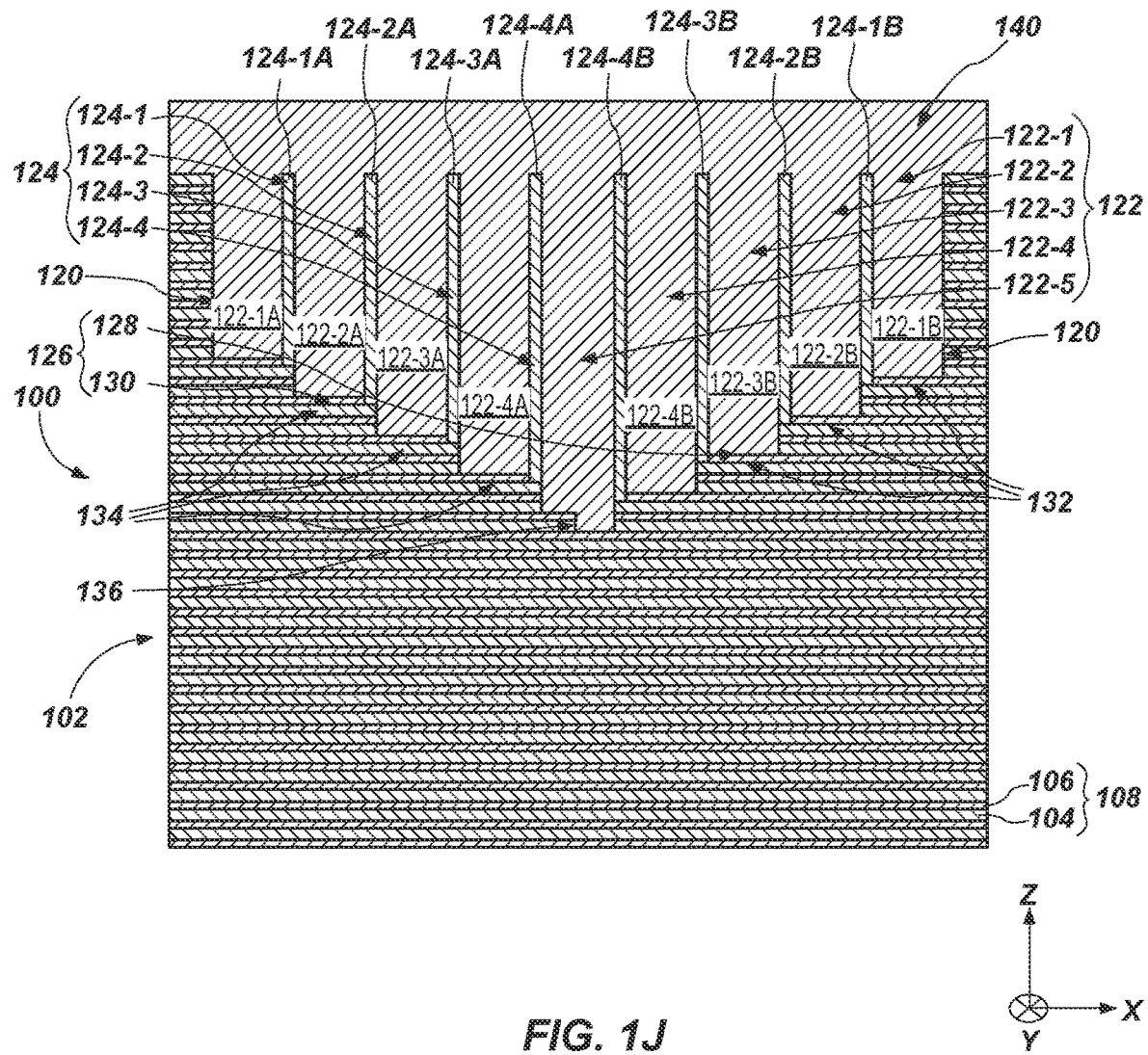

Referring next to FIG. 1J, a capping material 140 may be formed on or over the substantially planar uppermost surface 138 (FIG. 1I) of the microelectronic device structure 100. The capping material 140 may horizontally extend continuously across the substantially planar uppermost surface 138 (FIG. 1I) of the microelectronic device structure 100. The capping material 140 may cover (e.g., cap) uppermost surfaces of the dielectric liner structures 124, and may facilitate replacement of dielectric material(s) of the dielectric liner structures 124 and at least some of the first insulative structures 104 of the preliminary stack structure 102 with one or more conductive materials through so called "replacement gate" or "gate last" processing acts, as described in further detail below.

The capping material 140 may be formed of and include at least one dielectric material having different etch selectivity than the first insulative structures 104 of the preliminary stack structure 102 and the dielectric liner structures 124. The capping material 140 may, for example, have etch selectively substantially similar to that of the second insulative structures 106 of preliminary stack structure 102 and the dielectric spacer structures 122. By way of non-limiting example, the capping material 140 may be formed of and include at least one oxygen-containing dielectric material, such as a one or more of a dielectric oxide material (e.g., one or more of $SiO_x$, phosphosilicate glass, borosilicate glass, borophosphosilicate glass, fluorosilicate glass, $AlO_x$, $HfO_x$, $NbO_x$, and $TiO_x$), a dielectric oxynitride material (e.g., $SiO_xN_y$), and a dielectric carboxynitride material (e.g., $SiO_xC_zN_y$). A material composition of the capping material 140 may be different than material composition(s) of the first insulative structures 104 of the preliminary stack structure 102 and the dielectric liner structures 124. The material composition of the capping material 140 may be substantially the same as or may be different than material composition(s) of the second insulative structures 106 of the preliminary stack structure 102 and the dielectric spacer structures 122. In some embodiments, the capping material 140 is formed of and includes $SiO_x$ (e.g., $SiO_2$).

The capping material 140 may be formed using conventional processes (e.g., conventional deposition processes, such as one or more PVD, CVD, ALD, and spin-coating; conventional material removal processes, such as conventional polishing processes). Such processes are known in the art and, therefore, are not described in detail herein. In some embodiments, a dielectric material is conventionally deposited on or over the substantially planar uppermost surface 138 (FIG. 1I) of the microelectronic device structure 100 to form the capping material 140, and then the capping material 140 is subjected to at least one polishing process (e.g., at least one buffing process) to mitigate (e.g., substantially remove) undesirable irregularities (e.g., deviations from planarity) at an uppermost surface thereof. The uppermost surface of the capping material 140 may be substantially planar.

Figure 1K:
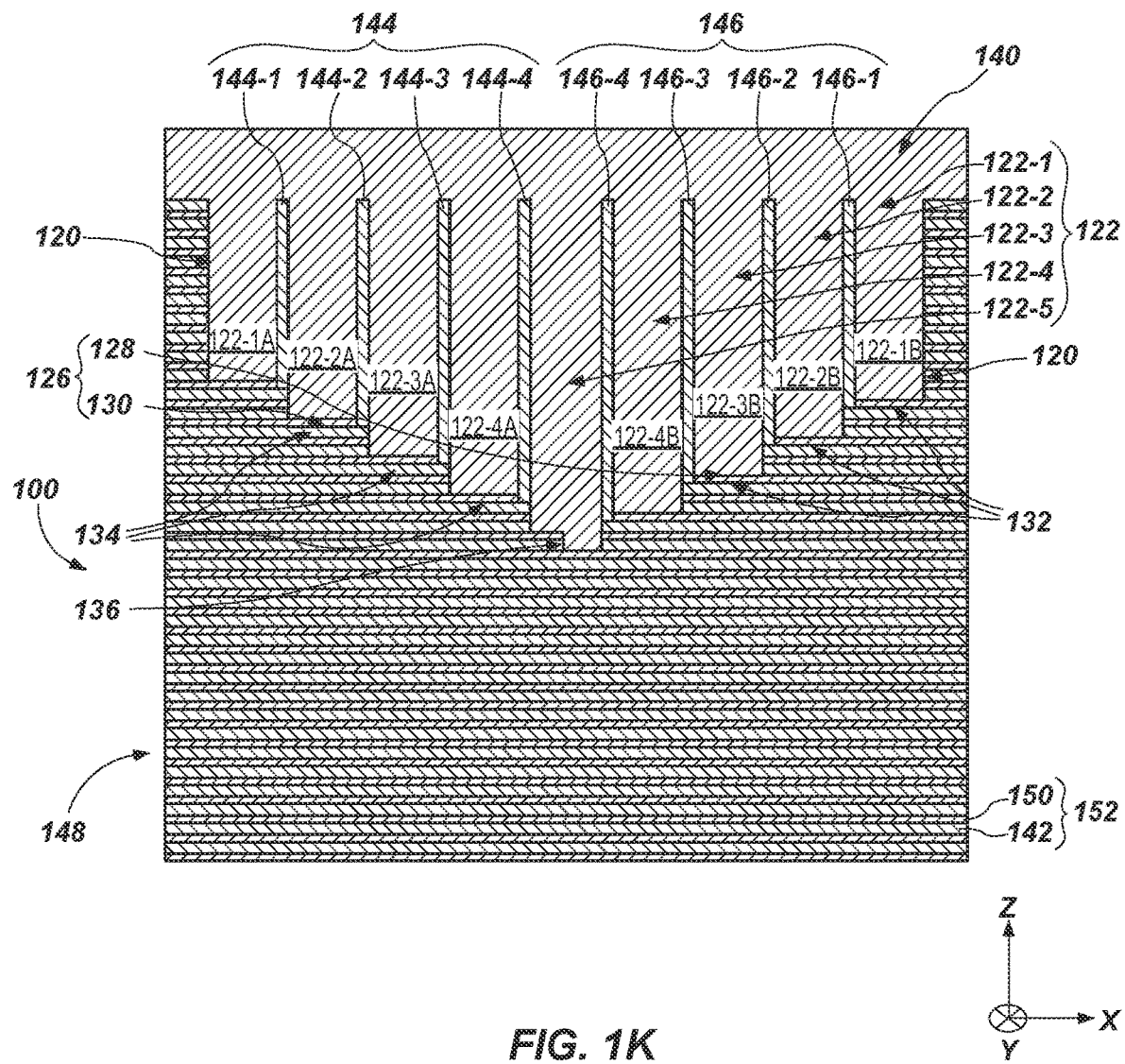

Referring next to FIG. 1K, the first portions (e.g., the first portions 124-1A, 124-2A, 124-3A, 124-4A shown in FIG. 1J) of the dielectric liner structures 124 (e.g., the dielectric liner structures 124-1, 124-2, 124-3, 124-4 shown in FIG. 1J) may be physically separated (e.g., physically partitioned) from the second portions (e.g., the second portions 124-1B, 124-2B, 124-3B, 124-4B shown in FIG. 1J) of the dielectric liner structures 124 (FIG. 1J); and dielectric material(s) of the dielectric liner structures 124 (FIG. 1J) and at least some of the first insulative structures 104 (FIG. 1J) of the preliminary stack structure 102 (FIG. 1J) may be at least partially replaced with conductive material(s) to form conductive structures 142 from the first insulative structures 104 (FIG. 1J), conductive contact structures 144 from the first portions of the dielectric liner structures 124 (FIG. 1J), and additional conductive contact structures 146 from the second portions of the dielectric liner structures 124 (FIG. 1J). As shown in FIG. 1K, the process may modify the tiers 108 (FIG. 1J) of the preliminary stack structure 102 (FIG. 1J) to form a stack structure 148 including a vertically alternating (e.g., in the Z-direction) sequence of the conductive structures 142 and insulative structures 150 arranged in modified tiers 152. The insulative structures 150 may correspond to remainders (e.g., remaining portions, unremoved portions) of the second insulative structures 106 (FIG. 1J) of the preliminary stack structure 102 (FIG. 1J). The modified tiers 152 of the stack structure 148 may be formed from and correspond to the tiers 108 (FIG. 1J) of the preliminary stack structure 102 (FIG. 1J). The modified tiers 152 of the stack structure 148 may each individually include a conductive structure 142 vertically neighboring an insulative structure 150. In embodiments wherein only portions (e.g., less than entireties) of the first insulative structures 104 (FIG. 1J) of the preliminary stack structure 102 (FIG. 1J) are replaced with the conductive structures 142, the modified tiers 152 of the stack structure 148 may also include remainders (e.g., remaining portions, unremoved portions) of the first insulative structures 104 (FIG. 1J) horizontally neighboring the conductive structures 142.

The first portions (e.g., the first portions 124-1A, 124-2A, 124-3A, 124-4A shown in FIG. 1J) of the dielectric liner structures 124 (e.g., the dielectric liner structures 124-1, 124-2, 124-3, 124-4 shown in FIG. 1J) may be physically separated from the second portions (e.g., the second portions 124-1B, 124-2B, 124-3B, 124-4B shown in FIG. 1J) of the dielectric liner structures 124 (FIG. 1J) by removing (e.g., etching) regions of the dielectric liner structures 124 at intersections of the first portions and the second portions thereof, and then filling the resulting openings with at least one electrically insulative material having different etch selectivity than the dielectric liner structures 124 and the first insulative structures 104 (FIG. 1J) of the preliminary stack structure 102 (FIG. 1J). The electrically insulative material may, for example, have etch selectively substantially similar to that of the second insulative structures 106 (FIG. 1J) of preliminary stack structure 102 (FIG. 1J) and the dielectric spacer structures 122. The material composition of the electrically insulative material may be substantially the same as or may be different than material composition(s) of the second insulative structures 106 (FIG. 1J) and the dielectric spacer structures 122 (FIG. 1J). In some embodiments, the electrically insulative material is formed of and includes $SiO_x$ (e.g., $SiO_2$).

In some embodiments, the material removal process employed to physically separate the first portions (e.g., the first portions 124-1A, 124-2A, 124-3A, 124-4A shown in FIG. 1J) and the second portions (e.g., the second portions 124-1B, 124-2B, 124-3B, 124-4B shown in FIG. 1J) of individual dielectric liner structures 124 (FIG. 1J) is controlled to substantially only physically separate the first portions and the second portions of the dielectric liner structures 124 from one another. The material removal process may, for example, form discrete openings vertically extending through individual dielectric liner structures 124, but not through the dielectric spacer structures 122 horizontally neighboring the dielectric liner structures 124. The discrete openings may then be filled with electrically insulative material to form discrete pillar structures (e.g., discrete circular column structures) horizontally interposed between the separated portions of the dielectric liner structures 124 in a first horizontal direction, and horizontally interposed between horizontally neighboring dielectric spacer structures 122 in a second horizontal direction orthogonal to the first horizontal direction.

In additional embodiments, the material removal process employed to physically separate the first portions (e.g., the first portions 124-1A, 124-2A, 124-3A, 124-4A shown in FIG. 1J) and the second portions (e.g., the second portions 124-1B, 124-2B, 124-3B, 124-4B shown in FIG. 1J) of individual dielectric liner structures 124 (FIG. 1J) is controlled to also physically separate first portions (e.g., the first portions 122-1A, 122-2A, 122-3A, 122-4A shown in FIG. 1J) and second portions (e.g., the second portions 122-1B, 122-2B, 122-3B, 122-4B shown in FIG. 1J) of individual dielectric spacer structures 122 (e.g., the dielectric spacer structures 122-1, 122-2, 122-3, 122-4 shown in FIG. 1J) from one another. The material removal process may, for example, form at least one linear opening (e.g., at least one trench) vertically extending through individual dielectric liner structures 124 as well as individual dielectric spacer structures 122 horizontally neighboring the individual dielectric liner structures 124. The linear opening may then be filled with electrically insulative material to form at least one linear pillar structure (described in further detail below with reference to FIG. 2) (e.g., a horizontally elongate, rectangular column structure) horizontally interposed between the separated portions of the individual dielectric liner structures 124 and the separated portions of the individual dielectric spacer structures 122 in a first horizontal direction; and continuously horizontally extending, in a second horizontal direction orthogonal to the first horizontal direction, through dielectric liner structures 124 and dielectric spacer structures 122 horizontally neighboring one another.

In addition to physically separating at least the first portions (e.g., the first portions 124-1A, 124-2A, 124-3A, 124-4A shown in FIG. 1J) and the second portions (e.g., the second portions 124-1B, 124-2B, 124-3B, 124-4B shown in FIG. 1J) of individual dielectric liner structures 124 (FIG. 1J), structure(s) (e.g., pillar structures, linear pillar structure(s)) formed between the separated portions of individual dielectric liner structures 124 may provide structural support to the preliminary stack structure 102 (FIG. 1J) during so called "replacement gate" or "gate last" processing acts to form the conductive structures 142, the conductive contact structures 144, and the additional conductive contact structures 146. The structure(s) may, for example, impede undesirable tier deformations (e.g., tier warping) and/or tier collapse during the formation of the conductive structures 142, the conductive contact structures 144, and the additional conductive contact structures 146. One or more additional support structures (e.g., pillar structures, such as dielectric pillar structure) may be formed at desired locations within the preliminary stack structure 102 (FIG. 1J) prior to the replacement gate processing acts to provide further structural support to the preliminary stack structure 102 (FIG. 1J) during the formation of the conductive structures 142, the conductive contact structures 144, and the additional conductive contact structures 146.

With continued reference to FIG. 1K, quantities and positions (e.g., horizontal positions, vertical positions) of the conductive contact structures 144 may correspond to the quantities and positions of the first portions of the dielectric liner structures 124 (FIG. 1J) used to form the conductive contact structures 144; and the quantities and positions (e.g., horizontal positions, vertical positions) of the additional conductive contact structures 146 may correspond to the quantities and positions of the second portions of the dielectric liner structures 124 (FIG. 1J) used to form the additional conductive contact structures 146. As a non-limiting example, as shown in FIG. 1K, the conductive contact structures 144 may include a conductive contact structure 144-1, a second conductive contact structure 144-2, a third conductive contact structure 144-3, and a fourth conductive contact structure 144-4 respectively corresponding to the first portion 124-1A (FIG. 1J) of the first dielectric liner structure 124-1 (FIG. 1J), the first portion 124-2A (FIG. 1J) of the second dielectric liner structure 124-2 (FIG. 1J), the first portion 124-3A (FIG. 1J) of the third dielectric liner structure 124-3 (FIG. 1J), and the first portion 124-4A (FIG. 1J) of the fourth dielectric liner structure 124-4 (FIG. 1J). As another non-limiting example, as also shown in FIG. 1K, the additional conductive contact structures 146 may include a first additional conductive contact structure 146-1, a second additional conductive contact structure 146-2, a third additional conductive contact structure 146-3, and a fourth additional conductive contact structure 146-4 respectively corresponding to the second portion 124-1B (FIG. 1J) of the first dielectric liner structure 124-1 (FIG. 1J), the second portion 124-2B (FIG. 1J) of the second dielectric liner structure 124-2 (FIG. 1J), the second portion 124-3B (FIG. 1J) of the third dielectric liner structure 124-3 (FIG. 1J), and the second portion 124-4B (FIG. 1J) of the fourth dielectric liner structure 124-4 (FIG. 1J).

As shown in FIG. 1K, the conductive contact structures 144 may be integral and continuous with some of the conductive structures 142 of the modified stack structure 148, and the additional conductive contact structures 146 may be integral and continuous with some other of the conductive structures 142 of the modified stack structure 148. For example, individual conductive contact structures 144 may be integral and continuous with individual conductive structures 142 of the modified stack structure 148 at the additional steps 134 of the reverse staircase structure 130 of the stadium structure 126, and individual additional conductive contact structures 146 may be integral and continuous with other individual conductive structures 142 of the modified stack structure 148 at the steps 132 of the forward staircase structure 128 of the stadium structure 126. Individual conductive contact structures 144 and individual conductive structures 142 in physical contact therewith may constitute different portions of individual monolithic structures. As a non-limiting example, the first conductive contact structure 144-1 and one of the conductive structures 142 of the modified stack structure 148 in physical contact therewith (e.g., at an uppermost additional step 134 of the reverse staircase structure 130) may together form a first monolithic structure comprising the first conductive contact structure 144-1 and the one of the conductive structures 142. In addition, individual additional conductive contact structures 146 and other individual conductive structures 142 in physical contact therewith may constitute different portions of other individual monolithic structures. As a non-limiting example, the first additional conductive contact structure 146-1 and another of the conductive structures 142 of the modified stack structure 148 in physical contact therewith (e.g., at an uppermost step 132 of the forward staircase structure 128) may together form a first additional monolithic structure comprising the first additional conductive contact structure 146-1 and the another of the conductive structures 142.

The conductive structures 142, the conductive contact structures 144, and the additional conductive contact structures 146 may each individually be formed of and include at least one electrically conductive material, such as one or more of a metal, an alloy, a conductive metal oxide, a conductive metal nitride, a conductive metal silicide, and a conductively doped semiconductor material. By way of non-limiting example, the conductive structures 142, the conductive structures 142, the conductive contact structures 144, and the additional conductive contact structures 146 may each individually be formed of and include one or more of tungsten (W), tungsten nitride ($WN_y$), nickel (Ni), tantalum (Ta), tantalum nitride ($TaN_y$), tantalum silicide ($TaSi_x$), platinum (Pt), copper (Cu), silver (Ag), gold (Au), aluminum (Al), molybdenum (Mo), titanium (Ti), titanium nitride ($TiN_y$), titanium silicide ($TiSi_x$), titanium silicon nitride ($TiSi_xN_y$), titanium aluminum nitride ($TiAl_xN_y$), molybdenum nitride ($MoN_x$), iridium (Jr), iridium oxide ($IrO_z$), ruthenium (Ru), ruthenium oxide ($RuO_z$), and conductively doped silicon. In some embodiments, the conductive structures 142, the conductive contact structures 144, and the additional conductive contact structures 146 are each formed of and include tungsten (W).

With continued reference to FIG. 1K, to form the modified stack structure 148 (including the conductive structures 142 and the insulative structures 150 thereof), the conductive contact structures 144, and the additional conductive contact structures 146, slots (e.g., slits, trenches) may be formed to vertically extend through the dielectric spacer structures 122, the dielectric liner structures 124 (FIG. 1J), and the preliminary stack structure 102 (FIG. 1J) to form discrete blocks. The slots and the blocks may each extend in a first horizontal direction (e.g., the X-direction); and the slots and the blocks may alternate with one another in a second horizontal direction (e.g., the Y-direction) orthogonal to the first horizontal directions. The dielectric liner structures 124 (FIG. 1J) and the first insulative structures 104 (FIG. 1J) of the preliminary stack structure 102 (FIG. 1J) may then be selectively removed (e.g., selectively etched and exhumed), in whole or in part, through the slots. Thereafter, open volumes (e.g., void spaces) formed by the selective removal of the dielectric liner structures 124 (FIG. 1J) and the first insulative structures 104 (FIG. 1J) may be filled with electrically conductive material (e.g., tungsten) to form the conductive structures 142, the conductive contact structures 144, and the additional conductive contact structures 146. The slots may then be filled with at least one dielectric material.

Figure 1L:
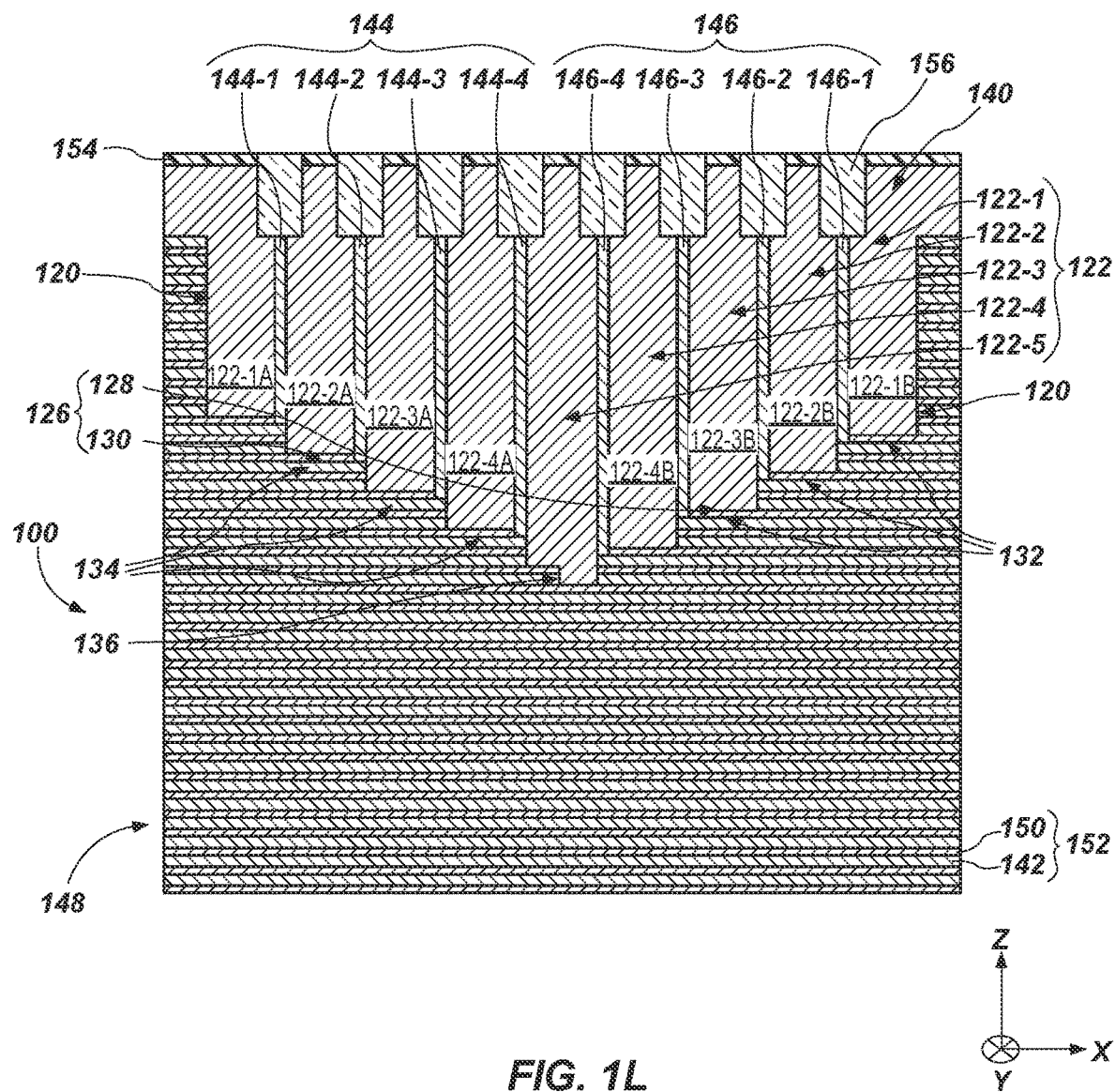

Referring next to FIG. 1L, a dielectric structure 154 may be formed on or over the capping material 140; portions of the dielectric structure 154 and the capping material 140 may be removed (e.g., etched) to form openings (e.g., vias, apertures) exposing portions of the conductive contact structures 144 and the additional conductive contact structures 146; and then conductive plug structures 156 may be formed within the openings and in contact (e.g., physical contact, electrical contact) with the conductive contact structures 144 and the additional conductive contact structures 146. The conductive plug structures 156 may facilitate electrical communication between additional conductive structures (e.g., conductive line structures, such as access line structures) to be formed over the stadium structure 126 (and, hence, additional structures and/or devices to be electrically coupled to the additional conductive structures, such as one or more control devices) and the conductive contact structures 144 and the additional conductive contact structures 146.

The dielectric structure 154 may be formed of and include at least one dielectric material having different etch selectivity than the capping material 140. The dielectric structure 154 may serve as a mask to pattern the capping material 140. The dielectric structure 154 may be selectively etchable relative to the capping material 140 during mutual exposure to a first enchant, and the capping material 140 may be selectively etchable relative to the dielectric structure 154 during mutual exposure to a second, different enchant. A material composition of the dielectric structure 154 is different than a material composition of the capping material 140, and may comprise one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). In some embodiments, the dielectric structure 154 is formed of and includes $SiN_y$ (e.g., $Si_3N_4$). The dielectric structure 154 may be substantially homogeneous, or may be substantially heterogeneous. In some embodiments, the dielectric structure 154 is substantially homogeneous. In additional embodiments, the dielectric structure 154 is substantially heterogeneous. The dielectric structure 154 may be substantially planar, and may exhibit a desired thickness (e.g., height in the Z-direction).

The conductive plug structures 156 may be formed of and include at least one electrically conductive material, such as one or more of a metal (e.g., W, Ti, Mo, Nb, V, Hf, Ta, Cr, Zr, Fe, Ru, Os, Co, Rh, Jr, Ni, Pa, Pt, Cu, Ag, Au, Al), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped Si, conductively-doped Ge, conductively-doped SiGe). Each of the conductive plug structures 156 may have substantially the same material composition, or at least one of the conductive plug structures 156 may have a different material composition than at least one other of the conductive plug structures 156.

The conductive plug structures 156 may each individually be provided at a desired horizontal location (e.g., in the X-direction and the Y-direction) on or over one of the conductive contact structures 144 or one of the additional conductive contact structures 146. The conductive plug structures 156 may each individually contact a single (e.g., only one) conductive contact structure 144 or a single (e.g., only one) additional conductive contact structure 146. In some embodiments, each of the conductive plug structures 156 is individually substantially horizontally centered on one of the conductive contact structures 144 or one of the additional conductive contact structures 146. In additional embodiments, one or more of the conductive plug structures 156 are individually horizontally offset (e.g., in the X-direction and/or in the Y-direction) from a horizontal center the conductive contact structure 144 or the additional conductive contact structure 146 in contact therewith. In addition, as shown in FIG. 1L, in some embodiments, at least some of the conductive plug structures 156 are substantially horizontally aligned with one another. For example, at least some (e.g., all) conductive plug structures 156 horizontally neighboring one another in a first horizontal direction (e.g., the X-direction) may be substantially aligned with one another in a second horizontal direction (e.g., the Y-direction) orthogonal to the first horizontal direction. In additional embodiments, at least some of the conductive plug structures 156 are offset from one another in multiple horizontal directions (e.g., the X-direction and the Y-direction). For example, at least some (e.g., all) conductive plug structures 156 horizontally neighboring one another in a first horizontal direction (e.g., the X-direction) may be offset from one another in a second horizontal direction (e.g., the Y-direction) orthogonal to the first horizontal direction.

The dielectric structure 154 and the conductive plug structures 156 may be formed using conventional processes (e.g., conventional material deposition processes, conventional photolithography processes, conventional material removal processes) and conventional processing equipment, which are not described in detail herein.

Thus, in accordance with embodiments of the disclosure, a method of forming a microelectronic device comprises forming a preliminary stack structure comprising a vertically alternating sequence of insulative structures and additional insulative structures arranged in tiers. Each of the tiers comprises one of the insulative structures and one of the additional insulative structures. A trench is formed to vertically extend into the preliminary stack structure. A horizontally alternating sequence of dielectric spacer structures and dielectric liner structures is formed within horizontal boundaries of the trench. At least some of the dielectric liner structures physically contact different insulative structures of the preliminary stack structure than one another. Dielectric material of the dielectric liner structures and the insulative structures of the preliminary stack structure is at least partially replaced with electrically conductive material.

Furthermore, in accordance with embodiments of the disclosure, a microelectronic device comprises a stack structure, a stadium structure within the stack structure, and conductive contact structures. The stack structure comprises a vertically alternating sequence of conductive structures and insulative structures arranged in tiers. Each of the tiers comprises one of the conductive structures and one of the insulative structures. The stadium structure comprises a forward staircase structure having steps comprising edges of the tiers, and a reverse staircase structure opposing the forward staircase structure and having additional steps comprising additional edges of the tiers. The conductive contact structures vertically extend to upper vertical boundaries of at least some of the conductive structures of the stack structure at the steps of the forward staircase structure and the additional steps of the reverse staircase structure. The conductive contact structures are each integral and continuous with one of the conductive structures.

Figure 2:
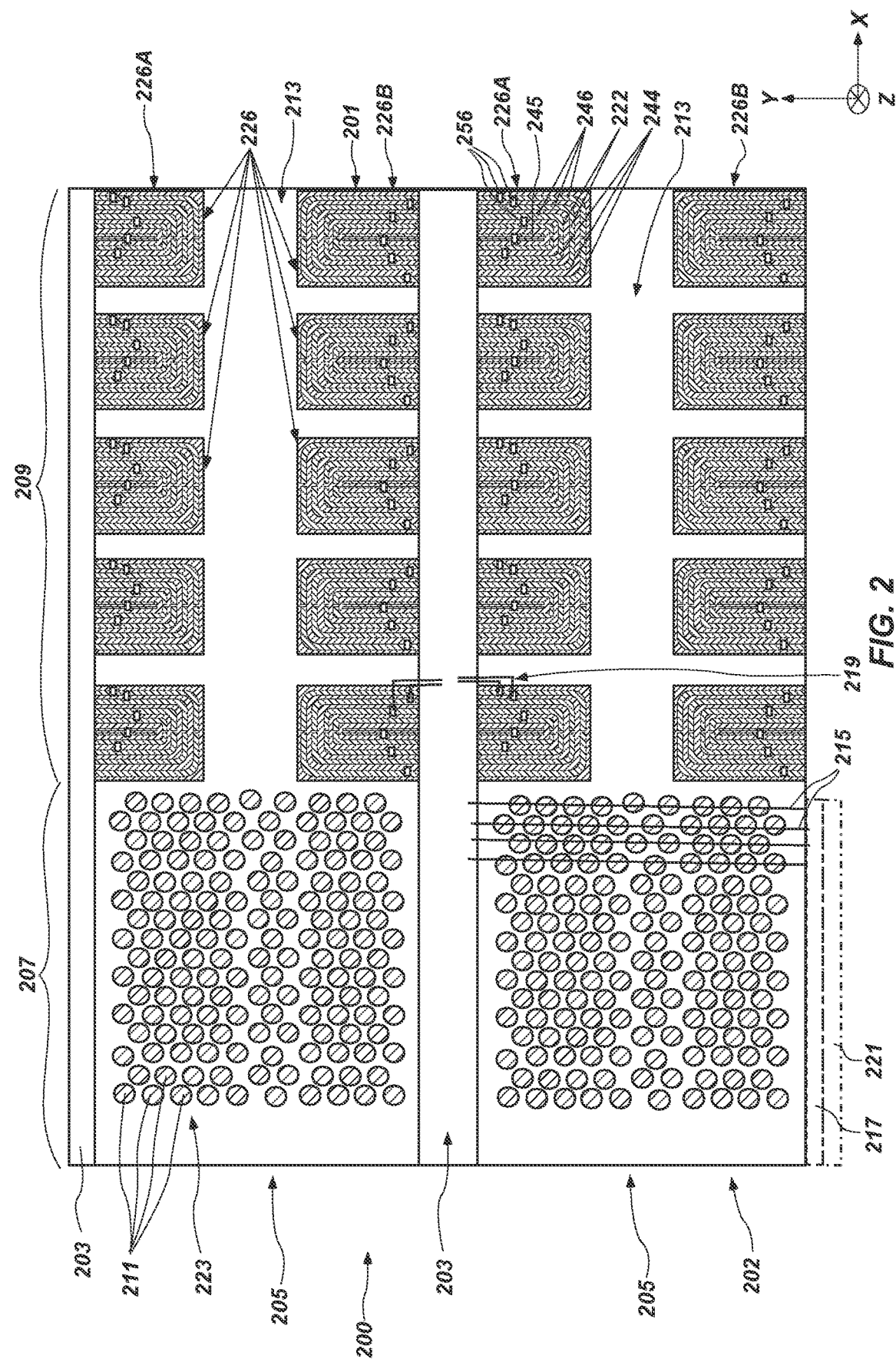
FIG. 2 is a simplified top-down view of a microelectronic device, in accordance with embodiments of the disclosure.

Microelectronic device structures (e.g., the microelectronic device structure 100 previously described with reference to FIG. 1L) in accordance with embodiments of the disclosure may be included in embodiments of microelectronic devices (e.g., memory devices, such as a 3D NAND Flash memory devices) of the disclosure. For example, FIG. 2 illustrates a simplified, partial top-down view of a microelectronic device 200 including a microelectronic device structure 201. The microelectronic device structure 201 may be substantially similar to the microelectronic device structure 100 at the processing stage previously described with reference to FIG. 1L.

Referring to FIG. 2, the microelectronic device 200 includes a stack structure 202 including a vertically alternating (e.g., in the Z-direction) sequence of conductive structures and insulative structures arranged in tiers. The stack structure 202 may be substantially similar to the modified stack structure 148 previously described with reference to FIG. 1K. As shown in FIG. 2, the stack structure 202 may be partitioned in the Y-direction by slots 203. The slots 203 may be filled with dielectric material, and correspond to the slots previously described with reference to FIG. 1K in relation to the formation of the conductive structures 142, the conductive contact structures 144, and the additional conductive contact structures 146 through so called "replacement gate" or "gate last" processing acts. The slots 203 may divide (e.g., in the Y-direction) the stack structure 202 into multiple blocks 205. In addition, the stack structure 202 includes a memory array region 207, and a distributed stadium region 209 horizontally neighboring (e.g., in the X-direction) the memory array region 207. As described in further detail below, the microelectronic device 200 further includes additional components (e.g., features, structures, devices) within boundaries of the different horizontal regions (e.g., the memory array region 207, the distributed stadium region 209) of the stack structure 202.

Within horizontal boundaries of the memory array region 207 of the stack structure 202, the microelectronic device 200 may include vertically extending pillar structures 211. The vertically extending pillar structures 211 may, for example, vertically extend (e.g., in the Z-direction) from or proximate data lines 215 (e.g., digit lines, bit lines), through the memory array region 207 of stack structure 202, and to or proximate a source structure 217 (e.g., a source plate). In FIG. 2, the source structure 217 is represented with dashed lines to indicate that the source structure 217 may vertically underlie the stack structure 202. Each of the vertically extending pillar structures 211 may include a semiconductive pillar (e.g., a polysilicon pillar, a silicon-germanium pillar) at least partially surrounded by one or more charge storage structures (e.g., a charge trapping structure, such as a charge trapping structure comprising an oxide-nitride-oxide ("ONO") material; floating gate structures). Intersections of the vertically extending pillar structures 211 and conductive structures (e.g., corresponding to the conductive structures 142 previously described with reference to FIG. 1K) of tiers (e.g., corresponding to the modified tiers 152 previously described with reference to FIG. 1K) of the stack structure 202 may define vertically extending (e.g., in the Z-direction) strings of memory cells 223 coupled in series with one another within the memory array region 207 of the stack structure 202. In some embodiments, the memory cells 223 formed at the intersections of the conductive structures of the tiers of the stack structure 202 and the vertically extending pillar structures comprise so-called "MONOS" (metal-oxide-nitride-oxide-semiconductor) memory cells. In additional embodiments, the memory cells 223 comprise so-called "TANOS" (tantalum nitride-aluminum oxide-nitride-oxide-semiconductor) memory cells, or so-called "BETANOS" (band/barrier engineered TANOS) memory cells, each of which are subsets of MONOS memory cells. In further embodiments, the memory cells 223 comprise so-called "floating gate" memory cells including floating gates (e.g., metallic floating gates) as charge storage structures. The floating gates may horizontally intervene between the central structures of the vertically extending pillar structures 211 and the conductive structures of the different tiers of the stack structure 202. The microelectronic device 200 may include any desired quantity and distribution of the vertically extending pillar structures 211 within the memory array region 207 of the stack structure 202.

With continued reference to FIG. 2, within horizontal boundaries of the distributed stadium region 209 of the stack structure 202, the microelectronic device 200 may include stadium structures 226 distributed within the stack structure 202. The stadium structures 226 may individually have a geometric configuration (e.g., a shape and dimensions) substantially similar to that previously described with respect to the stadium structure 126 (including geometric configurations of the forward staircase structure 128, the reverse staircase structure 130, and the central region 136 thereof) (FIGS. 1H through 1L), except at least some of the stadium structures 226 may be positioned at different elevations (e.g., vertical positions in the Z-direction) than one another within the stack structure 202. Aside from at least some differing elevations within the stack structure 202, each of the stadium structures 226 may have substantially the same geometric configuration (e.g., substantially the same shape and size, including substantially the same shapes and sizes of individual components thereof, and substantially the same shapes and sizes resulting from the combination of different components thereof) as each other of the stadium structures 226. In additional embodiment, at least one of the stadium structures 226 has a different geometric configuration (e.g., a different shape and/or one or more different dimensions, including substantially a different shape and/or one or more different dimensions of one or more individual components thereof, and/or a different shape and/or one or more different dimensions resulting from the combination of different components thereof) than at least one other of the stadium structures 226.

As shown in FIG. 2, portions of individual blocks 205 of the stack structure 202 within the distributed stadium region 209 of the stack structure 202 may include sections of individual stadium structures 226 separated (e.g., divided, segmented, isolated) from other sections of the individual stadium structures 226 by the slots 203. For example, a first section 226A of an individual (e.g., single, one) stadium structure 226 may be located within and horizontally extend (e.g., in the Y-direction) partially (e.g., less than completely) across a first of the blocks 205 of the stack structure 202, and a second section 226B of the individual stadium structure 226 may be located within and horizontally extend (e.g., in the Y-direction) partially (e.g., less than completely) across a second of the blocks 205 horizontally neighboring (e.g., in the Y-direction) the first of the blocks 205. One of the slots 203 may be horizontally interposed between (e.g., in the Y-direction) the first section 226A of the individual stadium structure 226 and the second section 226B of the individual stadium structure 226. Individual blocks 205 of the stack structure 202 may include first sections 226A of multiple of the stadium structures 226, and second sections 226B of multiple other of the stadium structures 226. As shown in FIG. 2, within an individual block 205 of the stack structure 202, the first sections 226A of multiple of the stadium structures 226 may be substantially horizontally aligned with one another in a first horizontal direction (e.g., the X-direction), the second sections 226B of multiple other of the stadium structures 226 may also be substantially horizontally aligned with one another in the first horizontal direction (e.g., the X-direction), and the first sections 226A of the multiple of the stadium structures 226 may horizontally neighbor the second sections 226B of the multiple other of the stadium structures 226 in a second horizontal direction (e.g., the Y-direction) orthogonal to the first horizontal direction.

With continued reference to FIG. 2, within individual blocks 205 of the stack structure 202, a word line bridging region 213 may continuously horizontally extend from and between sections of different stadium structures 226 located within horizontal boundaries (e.g., in the X-direction and the Y-direction) of the block 205 of the stack structure 202. As shown in FIG. 2, for a given block 205 of the stack structure 202, the word line bridging region 213 thereof may continuously horizontally extend from and between the first sections 226A and the second sections 226B of different stadium structures 226 located within the horizontal boundaries of the block 205. The word line bridging regions 213 may include portions of the conductive structures (e.g., corresponding to the conductive structures 142 previously described with reference to FIG. 1K) of the stack structure 202 continuously horizontally extending from and between the sections of the different stadium structures 226, and may be established during the so-called "replacement gate" or "gate last" processing acts used to form the conductive structures of the stack structure 202. The word line bridging regions 213 facilitate appropriate word line driving using center-of-die staircase positions and configurations.

Still referring to FIG. 2, within individual blocks 205 of the stack structure 202, conductive contact structures 244 and additional conductive contact structure 246 may be integral and continuous with conductive structures of the stack structure 202 at steps (e.g., corresponding to the steps 132 previously described with reference to FIGS. 1H through 1L) and additional steps (e.g., corresponding to the additional steps 134 previously described with reference to FIGS. 1H through 1L) of sections (e.g., the first sections 226A, the second sections 226B) of the stadium structures 226. The conductive contact structures 244 and the additional conductive contact structure 246 may correspond to the conductive contact structures 144 and the additional conductive contact structure 146 previously described with reference to FIG. 1K. As shown in FIG. 2, dielectric spacer structures 222 may horizontally intervene between and separate horizontally neighboring conductive contact structures 244 and horizontally neighboring additional conductive contact structures 246; and additional dielectric structures 245 may horizontally intervene between and separate conductive contact structures 244 horizontally neighboring additional conductive contact structures 246. The dielectric spacer structures 222 may correspond to the dielectric spacer structures 122 previously described with reference to FIGS. 1I through 1L; and the additional dielectric structures 245 may correspond to the discrete pillar structures and/or the linear pillar structures previously described with reference to FIG. 1K.

In addition, within individual blocks 205 of the stack structure 202, conductive plug structures 256 may contact (e.g., physically contact, electrically contact) the conductive contact structures 244 and the additional conductive contact structure 246. The conductive plug structures 256 may correspond to the conductive plug structures 156 previously described with reference to FIG. 1L. The conductive plug structures 256 may, for example, be connected (e.g., physically connected, electrically connected) to access lines 219 (e.g., word lines) of the microelectronic device 200. The access lines 219 may be formed of and include at least one electrically conductive material, such as one or more of a metal (e.g., W, Ti, Mo, Nb, V, Hf, Ta, Cr, Zr, Fe, Ru, Os, Co, Rh, Jr, Ni, Pa, Pt, Cu, Ag, Au, Al), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped Si, conductively-doped Ge, conductively-doped SiGe).

Still referring to FIG. 2, the microelectronic device 200 may further include at least one control unit 221 (e.g., a control device). The control unit 221 may include one or more of string driver circuitry, pass gates, circuitry for selecting gates, circuitry for selecting conductive lines, circuitry for amplifying signals, and circuitry for sensing signals. The control unit 221 may, for example, be electrically coupled to the data lines 215, the source structure 217, and the access lines 219. In some embodiments, the control unit 221 vertically underlies (e.g., in the Z-direction) and is substantially confined within horizontal boundaries of the memory array region 207 of the stack structure 202. In FIG. 2, the control unit 221 is represented with dashed lines to indicate that the control unit 221 may vertically underlie the stack structure 202. The control unit 221 may vertically underlie the source structure 217 of the microelectronic device 200. In some embodiments, the control unit 221 includes CMOS circuitry. In some such embodiments, the control unit 221 may be characterized as having a "CMOS under Array" ("CuA") configuration.

Figure 3:
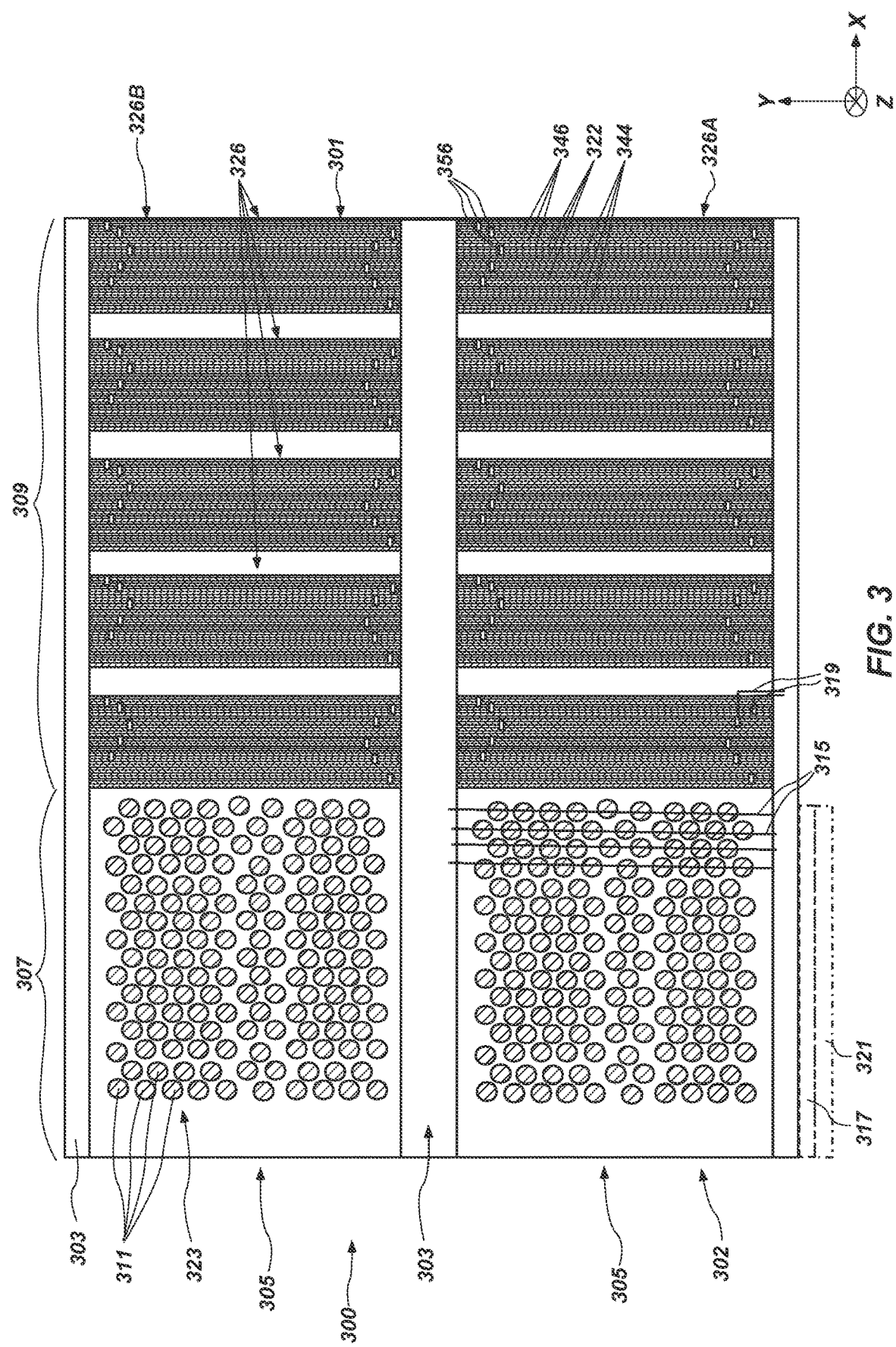
FIG. 3 is a simplified top-down view of a microelectronic device, in accordance with additional embodiments of the disclosure.

Referring next to FIG. 3, microelectronic device structures (e.g., the microelectronic device structure 100 previously described with reference to FIG. 1L) in accordance with embodiments of the disclosure may be included in additional embodiments of microelectronic devices (e.g., additional memory devices, such as additional 3D NAND Flash memory devices) of the disclosure. For example, FIG. 3 illustrates a simplified, partial top-down view of a microelectronic device 300 including a microelectronic device structure 301. The microelectronic device structure 301 may be substantially similar to the microelectronic device structure 100 at the processing stage previously described with reference to FIG. 1L. Throughout FIG. 3 and the associated description below, features (e.g., structures, materials, regions) functionally similar to features of the microelectronic device 200 previously described with reference to FIG. 2 are referred to with similar reference numerals incremented by 100. To avoid repetition, not all features shown in FIG. 3 are described in detail herein. Rather, unless described otherwise below, in FIG. 3, a feature designated by a reference numeral that is a 100 increment of the reference numeral of a feature previously described with reference to FIG. 2 will be understood to be substantially similar to the previously described feature.

As shown in FIG. 3, within horizontal boundaries of a distributed stadium region 309 of the stack structure 302, the microelectronic device 300 may include stadium structures 326 having different horizontal geometric configurations (e.g., different horizontal shapes, different horizontal dimensions) than the stadium structures 226 of the microelectronic device 200 previously described with reference to FIG. 2. For example, individual stadium structures 326 within the distributed stadium region 309 may be configured such that different sections of an individual stadium structure 326 horizontally extend substantially (e.g., completely) across individual blocks 305 of the stack structure 302 in a first horizontal direction (e.g., the Y-direction) and are separated from one another by the slots 303 horizontally extending a second horizontal direction (e.g., the X-direction) orthogonal to the first horizontal direction. For example, a first section 326A of an individual (e.g., single, one) stadium structure 326 may be located within and substantially horizontally extend across (e.g., in the Y-direction) a first of the blocks 305 of the stack structure 302, and a second section 326B of the individual stadium structure 226 may be located within and substantially horizontally extend across (e.g., in the Y-direction) a second of the blocks 205 horizontally neighboring (e.g., in the Y-direction) the first of the blocks 205. One of the slots 303 may be horizontally interposed between (e.g., in the Y-direction) the first section 326A of the individual stadium structure 326 and the second section 326B of the individual stadium structure 326. A first block 305 of the stack structure 302 may include first sections 326A of multiple of the stadium structures 326 separated from one another in the X-direction and each substantially horizontally extending across the first block 305 in the Y-direction; and a second block 305 horizontally neighboring the first block 305 in the Y-direction may include second sections 326B of the multiple of the stadium structures 326 separated from one another in the X-direction and each substantially horizontally extending across the second block 305 in the Y-direction.

As shown in FIG. 3, given the different horizontal geometric configurations of the stadium structures 326 of the microelectronic device 300 relative to those of the stadium structures 226 (FIG. 2) of the microelectronic device 200 (FIG. 2), individual blocks 305 of the stack structure 302 are free of word line bridging regions substantially similar to the word line bridging regions 213 previously described with reference to FIG. 2. Rather, as different sections (e.g., the first section 326A, the second section 326B) of individual stadium structures 326 substantially horizontally extend (e.g., in the Y-direction) across the individual blocks 305 of the stack structure 302 associated therewith, such word line bridging regions may be absent (e.g., omitted) from the blocks 305 of the stack structure 302. The configuration of the microelectronic device 300 shown in FIG. 3 facilitates appropriate word line driving using end-of-die staircase positions and configurations.

Thus, in accordance with embodiments of the disclosure, a memory device comprises a stack structure, stadium structures, conductive contact structures, and strings of memory cells. The stack structure has tiers each comprising a conductive structure and an insulative structure vertically neighboring the conductive structure. The stadium structures are positioned at different vertical depths within the stack structure than one another. Each of the stadium structures comprises a forward staircase structure having steps comprising horizontal ends of a group of the tiers, and a reverse staircase structure opposing the forward staircase structure and having additional steps comprising additional horizontal ends of the group of the tiers. The conductive contact structures vertically extend from at least some of the conductive structures of the stack structure at the steps and the additional steps of the stadium structures. The conductive contact structures are each integral and continuous with one of the conductive structures. The strings of memory cells vertical extend through the stack structure.

Figure 4A:
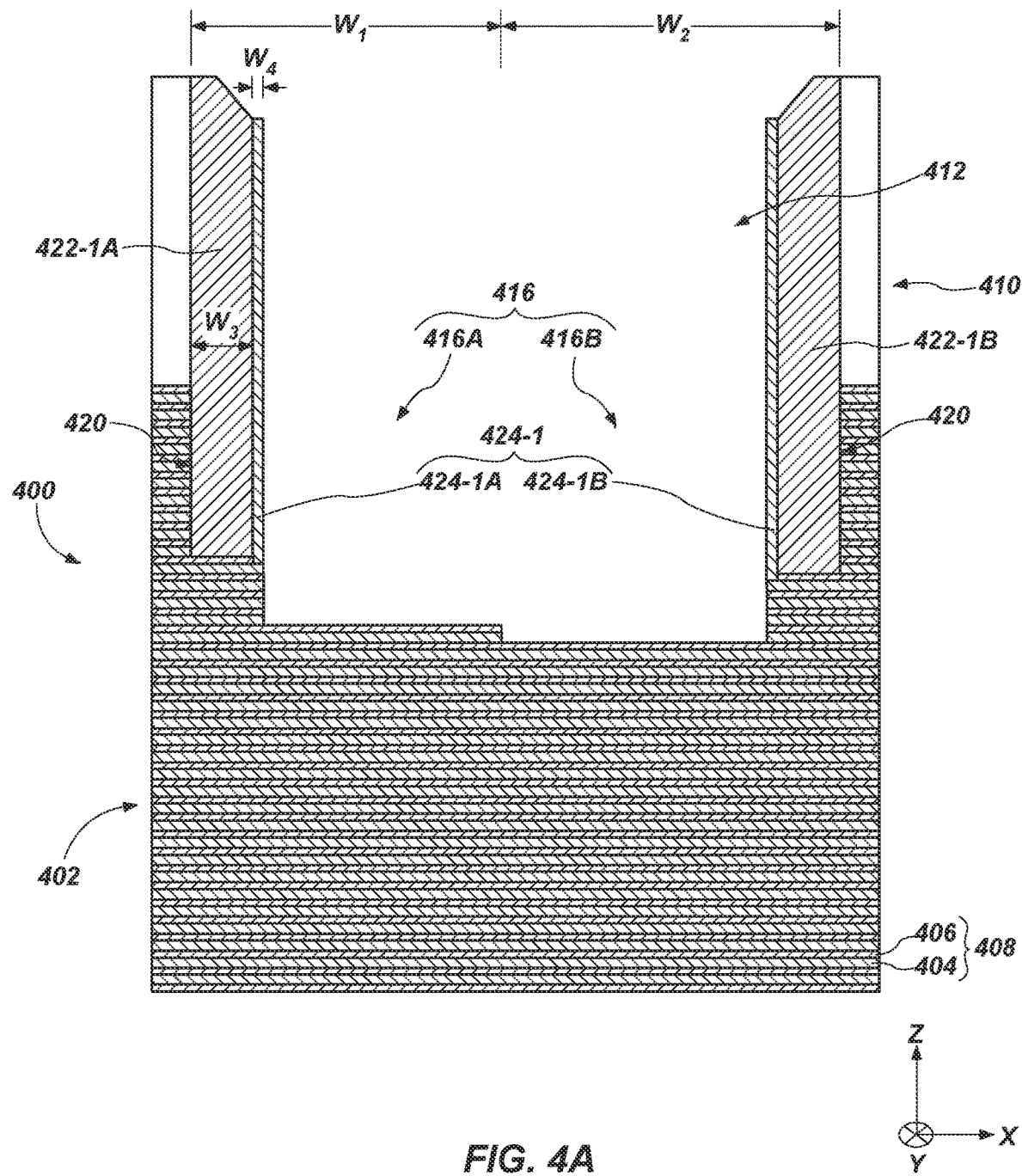
FIGS. 4A through 4C are simplified partial cross-sectional views illustrating a method of forming a microelectronic device, in accordance with additional embodiments of the disclosure.
Figure 4B:
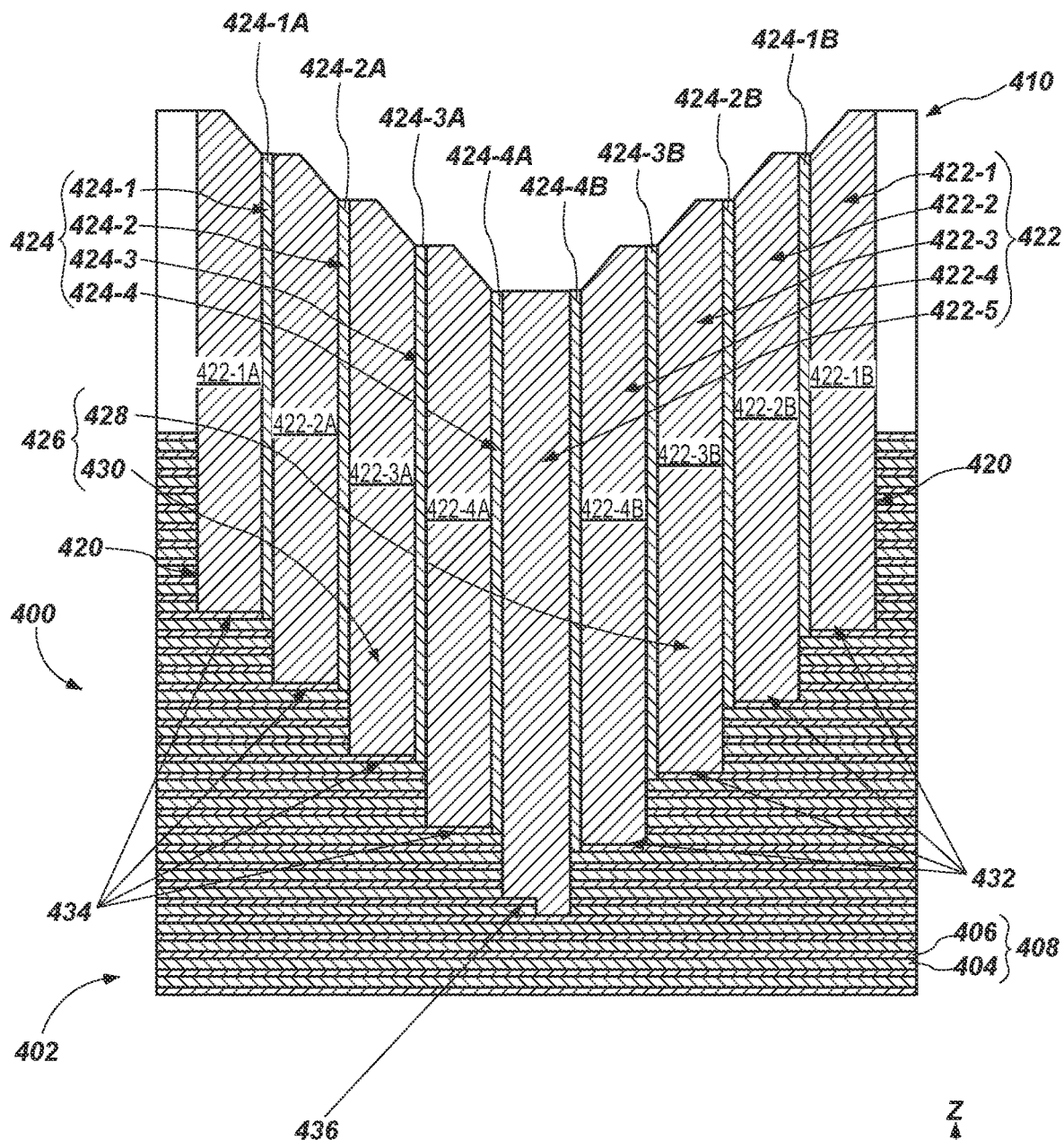
Figure 4C:
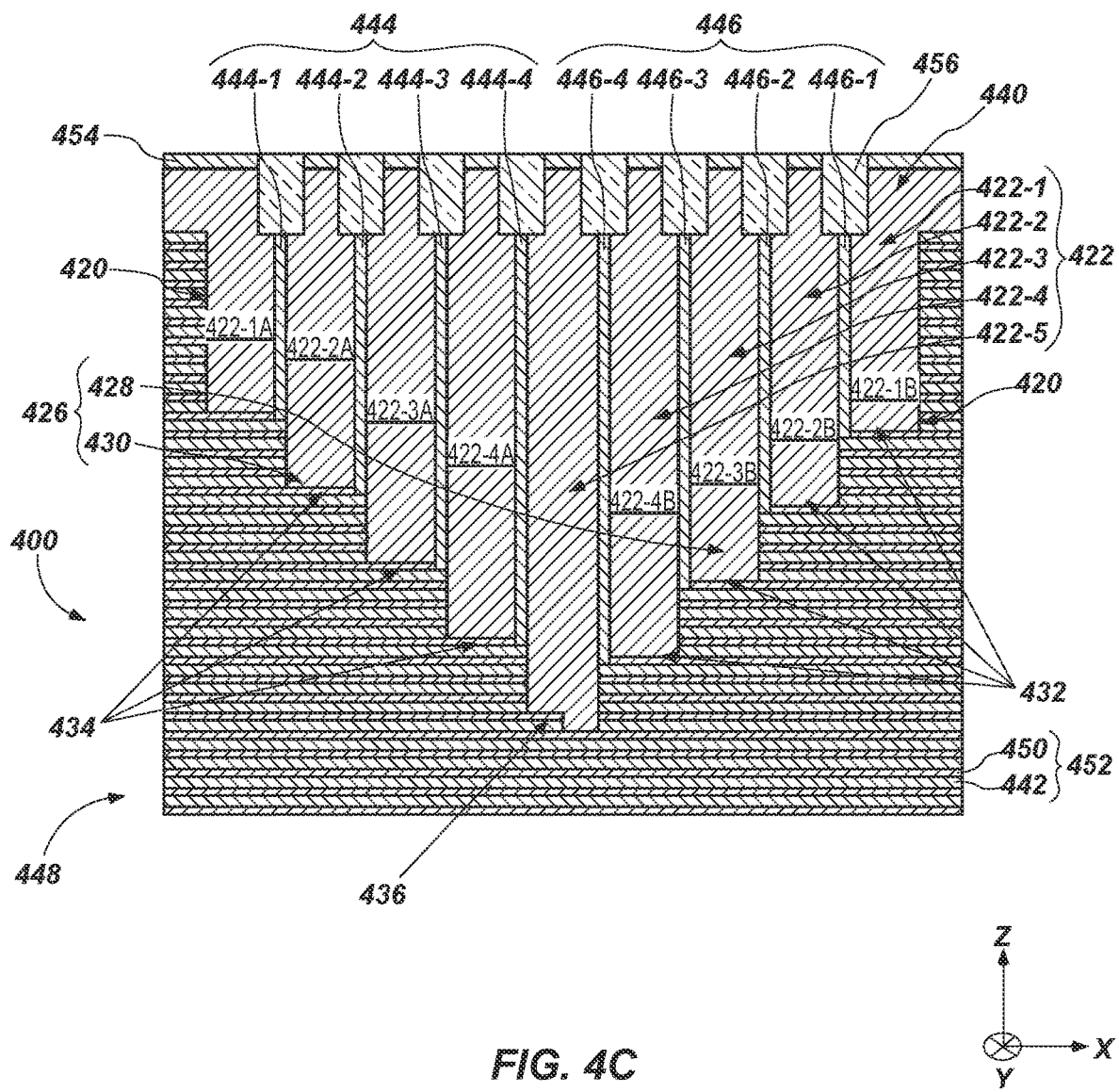

With returned reference to FIG. 1L, in additional embodiments, a microelectronic device structure of the disclosure is formed to have a different configuration than the microelectronic device structure 100 at the processing stage depicted in FIG. 1L. By way of non-limiting example, FIGS. 4A through 4C are simplified partial cross-sectional views illustrating a method of forming a microelectronic device structure 400, in accordance with additional embodiments of the disclosure. The method of forming the microelectronic device structure 400 up to the processing stage depicted in FIG. 4A incorporates the processing acts and features previously described in relation to the formation of the microelectronic device structure 100 up to and including the processing stage previously described with reference to FIG. 1E. The processing stages depicted in FIGS. 4A through 4C and described in further detail below may, for example, include processing act performed in place of and/or in combination with the processing acts previously described with reference to FIGS. 1F through 1L to form the microelectronic device structure 100 previously described with reference to FIG. 1L. Throughout FIGS. 4A through 4C and the associated description below, features (e.g., structures, materials, regions) functionally similar to features of the microelectronic device structure 100 previously described with reference to one or more of FIGS. 1A through 1L are referred to with similar reference numerals incremented by 100. To avoid repetition, not all features shown in FIGS. 4A through 4C are described in detail herein. Rather, unless described otherwise below, in FIGS. 4A through 4C, a feature designated by a reference numeral that is a 100 increment of the reference numeral of a feature previously described with reference to one or more of FIGS. 1A through 1L will be understood to be substantially similar to the previously described feature.

As shown in FIG. 4A, following the formation of the first dielectric liner structure 424-1 (e.g., through processing acts substantially similar to those previously described with reference to FIG. 1E), the microelectronic device structure 400 may be subjected to at least one additional material removal (e.g., etching, such as anisotropic dry etching) processes to increase the vertical depths (e.g., in the Z-direction) of remaining (e.g., unfilled) portions of the trench 416 formed in the preliminary stack structure 402. As described in further detail below, the additional material removal process may increase the vertical depths of the remaining portions of the trench 416 by relatively greater magnitudes than the increases to the vertical depths of the remaining portions of the trench 116 previously described with reference to FIG. 1F. The additional material removal process may increase a vertical depth of a remaining portion of the first region 416A of the trench 416, and may also increase a vertical depth of a remaining portion of the second region 416B of the trench 416. Following the additional material removal process, the remaining portion of the second region 416B of the trench 416 may vertically extend to a relatively lower depth within the preliminary stack structure 402 than the remaining portion of the first region 416A of the trench 416. A magnitude of a vertical offset between a lower vertical boundary of the first region 416A of the trench 416 and a lower vertical boundary of the second region 416B of the trench 416 may be substantially maintained at the end of the additional material removal process. For example, the additional material removal process may increase a vertical depth of each of the remaining portion of the first region 416A of the trench 416 and the remaining portion of the second region 416B of the trench 416 by a distance (e.g., in the Z-direction) greater than or equal to the combined height (e.g., in the Z-direction) of at least two (e.g., at least three) tiers 408 of the preliminary stack structure 402. As shown in FIG. 4A, in some embodiments, the additional material removal process increases a vertical depth of each of the remaining portion of the first region 416A of the trench 416 and the remaining portion of the second region 416B of the trench 416 by a distance substantially equal the combined height of three (3) of the tiers 408 of the preliminary stack structure 402.

Referring next to FIG. 4B, following the processing stage described with reference to FIG. 4A, the microelectronic device structure 400 may be subjected to additional processing acts substantially similar to those previously described with reference to the FIGS. 1D, 1E, and 4A to fill remaining portions of the trench 416 (FIG. 4A) with more of the dielectric liner structures 424 (e.g., in addition to the first dielectric liner structure 424-1) and more of the dielectric spacer structures 422 (e.g., in addition to the first dielectric spacer structure 422-1), and form a stadium structure 426 vertically underlying and in contact with the dielectric liner structures 424 and the dielectric spacer structures 422. As shown in FIG. 4B, the stadium structure 426 may include a forward staircase structure 428 including steps 432 each individually comprising horizontal ends of multiple (e.g., greater than or equal to three (3), greater than or equal to four (4)) of the tiers 408 of the preliminary stack structure 402; a reverse staircase structure 430 including additional steps 434 each individually comprising horizontal ends of multiple (e.g., greater than or equal to three (3), greater than or equal to four (4)) of the tiers 408; and a central region 436 horizontally interposed between the forward staircase structure 428 and the reverse staircase structure 430. The central region 436 of the stadium structure 426 may, for example, constitute an intersection region and vertical termination location for the forward staircase structure 428 and the reverse staircase structure 430. Different dielectric spacer structures 422 and different dielectric liner structures 424 may be formed to physically contact different steps 432 of the forward staircase structure 428 and different additional steps 434 of the reverse staircase structure 430 than one another, in substantially the same manner previously described for the dielectric spacer structures 122 and different dielectric liner structures 124 with reference to FIG. 1H.

As shown in FIG. 4B, in some embodiments, individual steps 432 of the forward staircase structure 428 of the stadium structure 426 are formed to comprise horizontal ends of four (4) of the tiers 408 of the preliminary stack structure 402; and individual additional steps 434 of the reverse staircase structure 430 of the stadium structure 426 are also formed to comprise horizontal ends of four (4) of the tiers 408 of the preliminary stack structure 402. Individual steps 432 of the stadium structure 426 vertically neighboring individual additional steps 434 of the stadium structure 426 may share multiple (e.g., three (3)) tiers 408 of the preliminary stack structure 402 with the individual additional steps 434. For example, three (3) of the four (4) tiers 408 of the preliminary stack structure 402 associated with an individual step 432 may also be three (3) of the four (4) tiers 408 of the preliminary stack structure 402 associated with an individual additional step 434 vertically neighboring the individual step 432. One of the three (3) tiers 408 shared by an individual step 432 and an individual additional step 434 vertically neighboring the individual step 432 may form a vertically upper portion of the individual step 432 and a vertically lower portion of the individual additional step 434, or vice versa. As a non-limiting example, an uppermost additional step 434 of the reverse staircase structure 430 may comprise horizontal ends of a first group of four (4) tiers 408 of the preliminary stack structure 402; and an uppermost step 432 of the forward staircase structure 428 may comprise horizontal ends of a second group of four (4) tiers 408 of the preliminary stack structure 102, wherein three (3) of the four (4) tiers 408 of the second group are the same as three (3) of the four (4) tiers 408 of the first group. A relatively highest tier 408 of the first group of four (4) tiers 408 may form an upper portion of the uppermost additional step 434 and may physically contact the first portion 424-1A of the first dielectric liner structure 424-1; and three (3) relatively lower tiers 408 of the first group of four (4) tiers 408 may form a lower portion of the uppermost additional step 434 and may not physically contact the first portion 424-1A of the first dielectric liner structure 424-1. In turn, a relatively highest tier 408 of the three (3) relatively lower tiers 408 forming the lower portion of the upper additional step 434 may constitute a relatively highest tier 408 of the second group of four (4) tiers 408 and may form an upper portion of the uppermost step 432 in physical contact with the second portion 424-1B of the first dielectric liner structure 424-1; and three (3) relatively lower tiers 408 of the second group of four (4) tiers 408 may form a lower portion of the uppermost step 432 and may not physically contact the second portion 424-1B of the first dielectric liner structure 424-1.

Referring next to FIG. 4C, following the processing stage depicted in FIG. 4B, the microelectronic device structure 400 may be subjected to additional processing acts substantially similar to those previously described with reference to FIGS. 1I through 1L to attain the configuration of the microelectronic device structure 400 depicted in FIG. 4C. Accordingly, the method of forming the microelectronic device structure 400 following the processing stage depicted in FIG. 4B incorporates the processing stages and features previously described in relation to the formation of the microelectronic device structure 100 from the processing stage previously described with reference to FIG. 1I through the processing stage previously described with reference to FIG. 1L.

The microelectronic device structure 400 described with reference to FIG. 4C may be included in embodiments of microelectronic devices (e.g., memory devices, such as a 3D NAND Flash memory devices) of the disclosure. As a non-limiting example, the microelectronic device structure 400 at the processing stage depicted in FIG. 4C may be included in the microelectronic device 200 previously described with reference to FIG. 2 as the microelectronic device structure 201 (FIG. 2). In some such embodiments, the stadium structures 226 (FIG. 2) may individually have a geometric configuration (e.g., a shape and dimensions) substantially similar to that previously described with respect to the stadium structure 426 (including geometric configurations of the forward staircase structure 428, the reverse staircase structure 430, and the central region 436 thereof) (FIGS. 4B and 4C), except at least some of the stadium structures 226 (FIG. 2) may be positioned at different elevations (e.g., vertical positions in the Z-direction) than one another within the stack structure 202. In addition, within individual blocks 205 (FIG. 2) of the stack structure 202 (FIG. 2), the conductive contact structures 244 (FIG. 2), the additional conductive contact structures 246 (FIG. 2), and the dielectric spacer structures 222 (FIG. 2) may respectively correspond to the conductive contact structures 444, the additional conductive contact structure 446, and the dielectric spacer structures 422 of the microelectronic device structure 400 at the processing stage depicted in FIG. 4C. Within an individual block 205 (FIG. 2) of the stack structure 202 (FIG. 2), a first section 226A (FIG. 2) of an individual (e.g., single, one) stadium structure 226 (FIG. 2) may include steps 432 and additional steps 434 that are vertically offset (e.g., vertically above, vertically below) from steps 432 and additional steps 434 of a second section 226B (FIG. 2) of an additional individual stadium structure 226 (FIG. 2). The steps 432 of the forward staircase structure 428 of the first section 226A (FIG. 2) of the stadium structure 226 (FIG. 2) may be vertically offset (e.g., vertically above or vertically below), by one (1) tier 408, from the steps 432 of the forward staircase structure 428 of the second section 226B (FIG. 2) of the additional stadium structure 226 (FIG. 2); and the additional steps 434 of the reverse staircase structure 440 of the first section 226A (FIG. 2) of the stadium structure 226 (FIG. 2) may be vertically offset (e.g., vertically above or vertically below), by one (1) tier 408, from the additional steps 434 of the reverse staircase structure 430 of the second section 226B (FIG. 2) of the additional stadium structure 226 (FIG. 2).

The additional steps 434 of the first section 226A of the stadium structure 226 may each individually be vertically offset from vertically neighboring steps 432 and additional steps 434 of the second section 226B of the additional stadium structure 226.

In further embodiments, a microelectronic device structure of the disclosure is formed to have a different configuration than each of the microelectronic device structure 100 at the processing stage depicted in FIG. 1L and the microelectronic device structure 400 at the processing stage depicted in FIG. 4C. By way of non-limiting example, FIGS. 5A through 5G are simplified partial cross-sectional views illustrating a method of forming a microelectronic device structure 500, in accordance with additional embodiments of the disclosure. The processing stages depicted in FIGS. 5A through 5G and described in further detail below may, for example, include processing act performed in place of and/or in combination with the processing acts previously described with reference to FIGS. 1A through 1L to form the microelectronic device structure 100 previously described with reference to FIG. 1L. Throughout FIGS. 5A through 5G and the associated description below, features (e.g., structures, materials, regions) functionally similar to features of the microelectronic device structure 100 previously described with reference to one or more of FIGS. 1A through 1L are referred to with similar reference numerals incremented by 100. To avoid repetition, not all features shown in FIGS. 5A through 5G are described in detail herein. Rather, unless described otherwise below, in FIGS. 5A through 5G, a feature designated by a reference numeral that is a 100 increment of the reference numeral of a feature previously described with reference to one or more of FIGS. 1A through 1L will be understood to be substantially similar to the previously described feature.

Figure 5A:
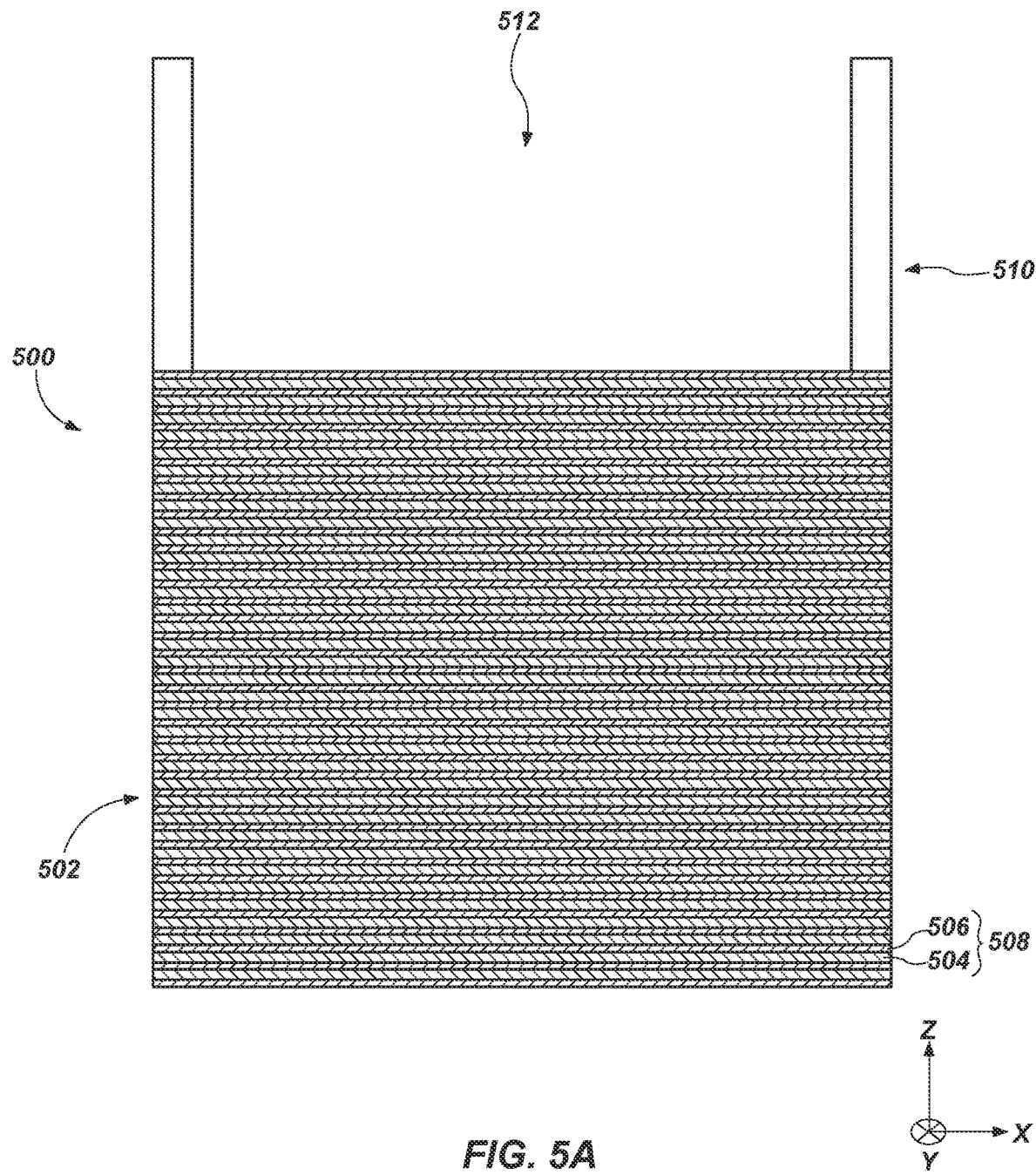
FIGS. 5A through 5G are simplified partial cross-sectional views illustrating a method of forming a microelectronic device, in accordance with additional embodiments of the disclosure.

Referring to FIG. 5A, a microelectronic device structure 500 may be formed to include a preliminary stack structure 502, and a patterned mask structure 510 on or over the preliminary stack structure 502. The preliminary stack structure 502 includes a vertically alternating (e.g., in the Z-direction) sequence of first insulative structures 504 and second insulative structures 506 arranged in tiers 508. The patterned mask structure 510 may include at least one opening 512 (e.g., aperture, via) vertically extending therethrough. The preliminary stack structure 502 (including the first insulative structures 504 and the second insulative structures 506 thereof) and the patterned mask structure 510 (including the opening 512 therein) may be formed to respectively be substantially similar to the preliminary stack structure 102 (including the first insulative structures 104 and the second insulative structures 106 thereof) and the patterned mask structure 110 (including the opening 112 therein) previously described herein with reference to FIG. 1A.

Figure 5B:
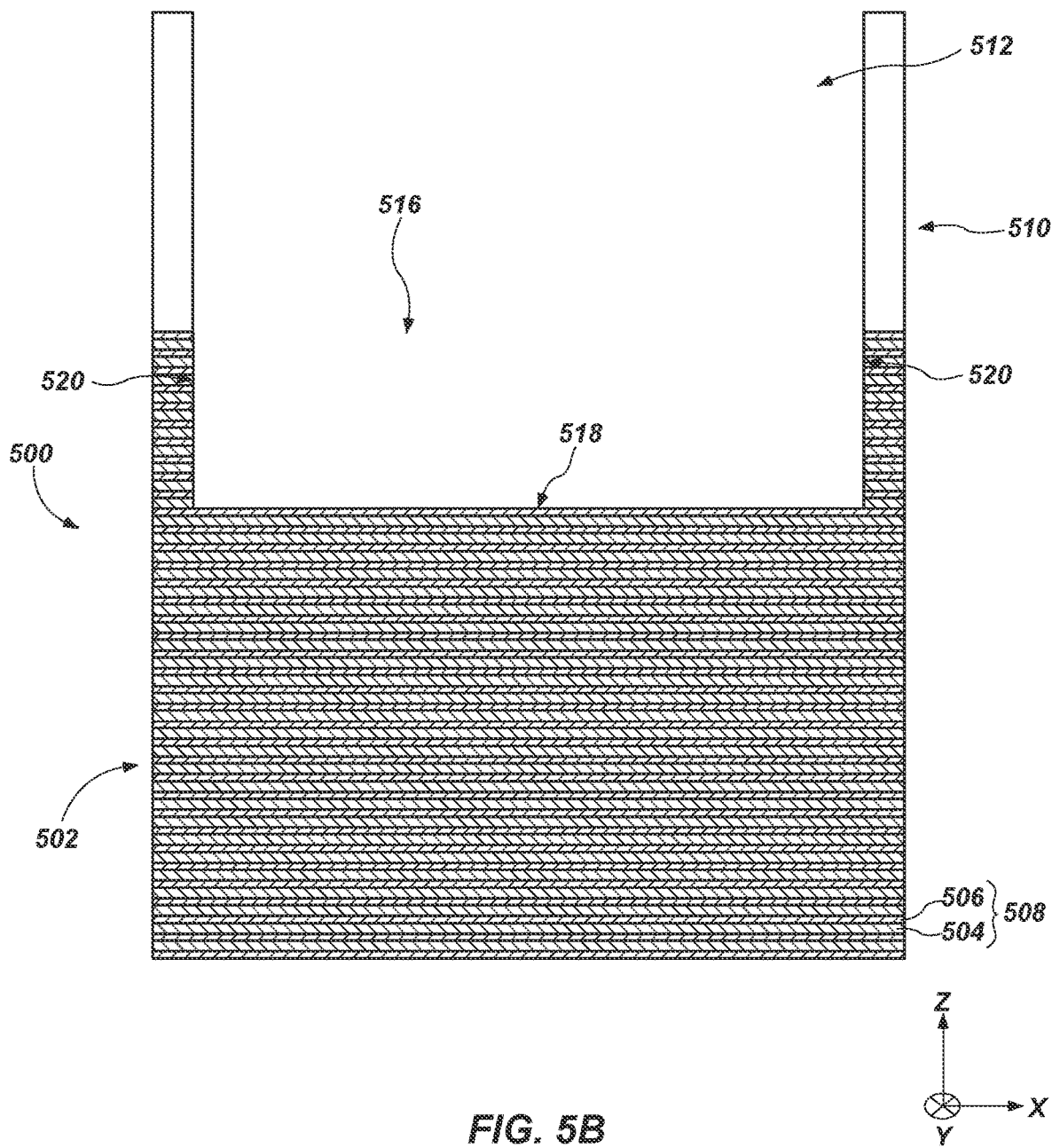

Referring next to FIG. 5B, the microelectronic device structure 500 may be subjected to one or more material removal processes (e.g., one or more chopping processes) to form at least one trench 516 (e.g., opening, blind via) vertically extending (e.g., in the Z-direction) into the preliminary stack structure 502. As shown in FIG. 5B, the trench 516 within the preliminary stack structure 502 may be substantially confined within horizontal boundaries of the opening 512 within the patterned mask structure 510. In embodiments wherein the patterned mask structure 510 includes multiple openings 512, different trenches 516 may be formed to extend to different vertical depths than one another within the preliminary stack structure 502. For example, at least one of the trenches 516 may vertically extend to a relatively lower depth within the preliminary stack structure 502 than at least one other of the trenches 516. The vertical depths of the trenches 516 relative to one another may at least partially depend on the quantity of tiers 508 of the preliminary stack structure 502, the quantity of the trenches 516 within the preliminary stack structure 502, and the horizontal dimensions of the trenches 516. The trench(es) 516 may be configured to facilitate subsequent formation of vertically extending insulative structures in physical contact with at least some (e.g., each) of the tiers 508 of the preliminary stack structure 502, as described in further detail below.

As shown in FIG. 5B, the trench 516 may be formed to include a lower vertical boundary 518 (e.g., floor) and horizontal boundaries 520 (e.g., sides). The lower vertical boundary 518 of the trench 516 may be formed to be substantially horizontally planar. For example, prior to forming the trench 516, the processing stage previously described with reference to FIG. 1B (in relation to the formation of the microelectronic device structure 100) may be omitted. Accordingly, different horizontal regions of the trench 516 may all vertically extend (e.g., in the Z-direction) to substantially the same vertical elevation within the preliminary stack structure 502. In addition, as depicted in FIG. 5B, the horizontal boundaries 520 of the trench 516 may be substantially vertically planar.

The trench 516 in the preliminary stack structure 502 may be formed to vertically terminate (e.g., vertically end) at the second insulative structure 506 of a single (e.g., only one) tier 508 of the preliminary stack structure 502. In additional embodiments, the trench 516 in the preliminary stack structure 502 may be formed to vertically terminate at the first insulative structures 504 of a single (e.g., only one) tier 508 of the preliminary stack structure 502.

Figure 5C:
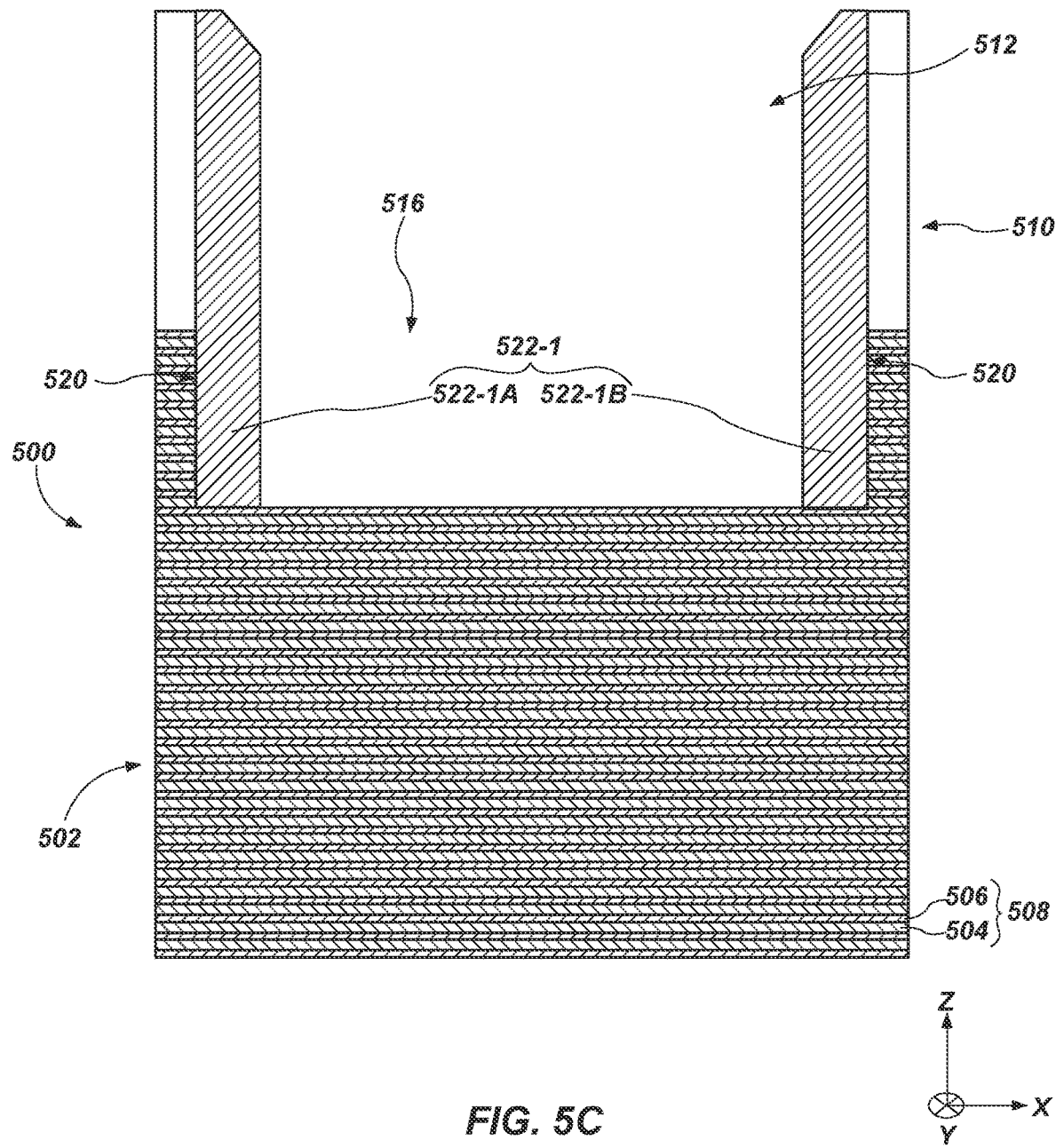

Referring next to FIG. 5C, a first dielectric spacer structure 522-1 may be formed within the opening 512 in the patterned mask structure 510 and the trench 516 in the preliminary stack structure 502. The first dielectric spacer structure 522-1 may partially (e.g., less than completely) fill each of the opening 512 and the trench 516, and may be formed on exposed surfaces of the patterned mask structure 510 and the preliminary stack structure 502 within horizontal boundaries (e.g., in the X-direction and the Y-direction) of the trench 516 (and, hence, the opening 512 in the patterned mask structure 510). For example, as shown in FIG. 5C, the first dielectric spacer structure 522-1 may be formed directly horizontally adjacent (e.g., horizontally on) side surfaces of the patterned mask structure 510 and the preliminary stack structure 502 at (e.g., coplanar with) the horizontal boundaries 520 of the trench 516, and may also be formed directly vertically adjacent (e.g., vertically on) an upper surface of the tier 508 of the preliminary stack structure 502 defining the lower vertical boundary 518 (FIG. 5B) of the trench 516. The first dielectric spacer structure 522-1 may substantially vertically extend across (e.g., in the Z-direction) and cover the side surfaces of the patterned mask structure 510 and the preliminary stack structure 502 at (e.g., coplanar with) the horizontal boundaries 520 of the trench 516, and may only partially horizontally extend across (e.g., in the X-direction and the Y-direction) and cover the upper surface of the tier 508 of the preliminary stack structure 502 defining the lower vertical boundary 518 (FIG. 5B) of the trench 516. As shown in FIG. 5C, the first dielectric spacer structure 522-1 may include a first portion 522-1A and a second portion 522-1B. The first portion 522-1A and the second portion 522-1B may vertically extend (e.g., in the Z-direction) to substantially the same depth within the preliminary stack structure 502 as one another.

The first dielectric spacer structure 522-1 may have substantially the same horizontal dimensions (e.g., width) and material composition as the first dielectric spacer structure 122-1 previously described with reference to FIG. 1D. In addition, the first dielectric spacer structure 522-1 may be formed in substantially the same manner as the first dielectric spacer structure 122-1 previously described with reference to FIG. 1D.

Figure 5D:
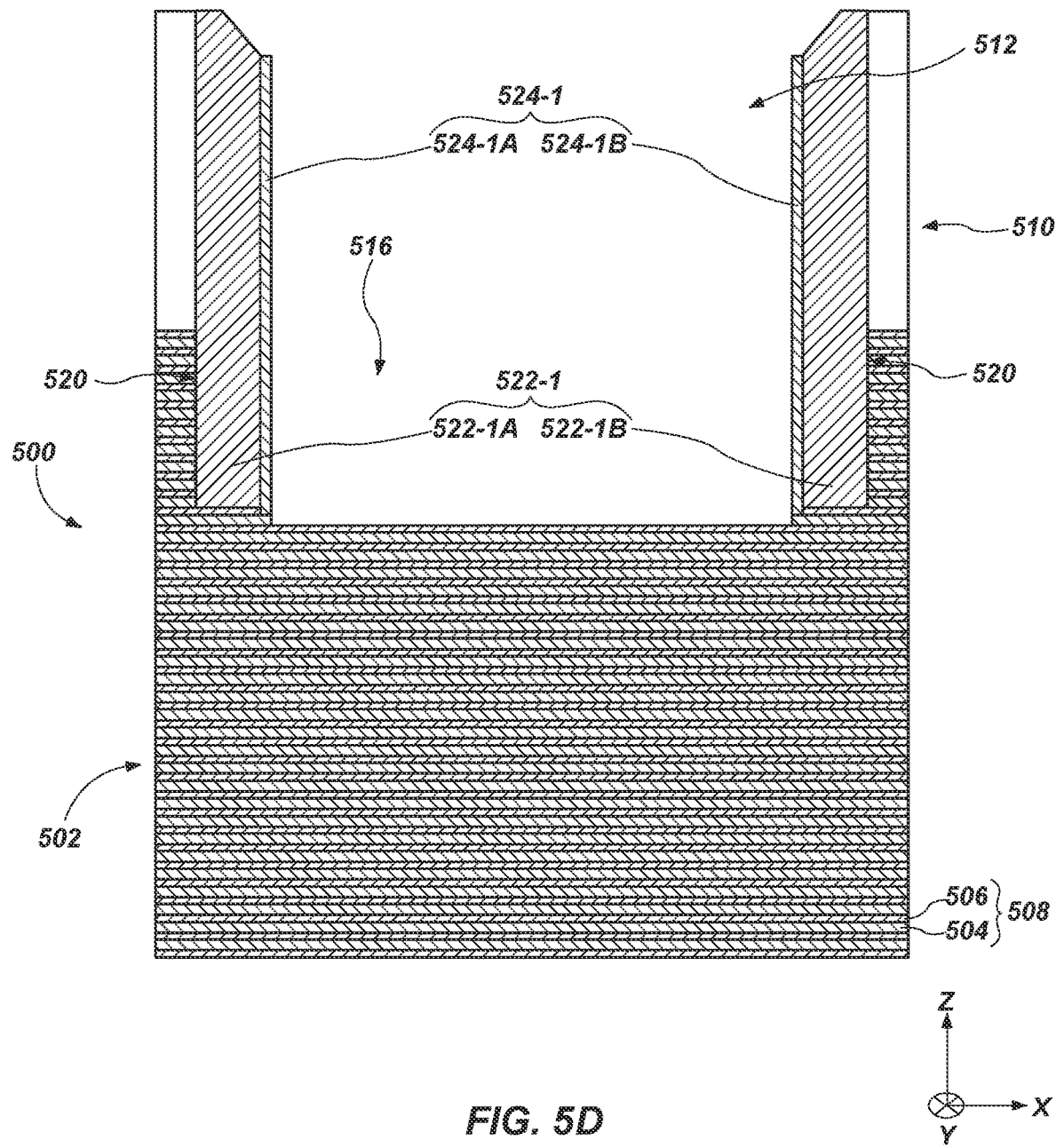

Referring next to FIG. 5D, a first dielectric liner structure 524-1 may be formed within remaining (e.g., unfilled) portions of the opening 512 in the patterned mask structure 510 and the trench 516 in the preliminary stack structure 502. The first dielectric liner structure 524-1 may partially (e.g., less than completely) fill the remaining portions of each of the opening 512 and the trench 516, and may be formed on exposed surfaces of the first dielectric spacer structure 522-1 (FIG. 5D) and the preliminary stack structure 502 within horizontal boundaries (e.g., in the X-direction and the Y-direction) of the trench 516 (and, hence, the opening 512 in the patterned mask structure 510). For example, the first dielectric liner structure 524-1 may be formed directly horizontally adjacent (e.g., horizontally on) inner side surfaces of the first dielectric spacer structure 522-1, and may also be formed directly vertically adjacent (e.g., vertically on) an upper surface of a first insulative structure 504 of a tier 508 of the preliminary stack structure 502 at a modified lower vertical boundary of the trench 516 formed in the processing stage previously described with reference to FIG. 5C. The first dielectric liner structure 524-1 may substantially vertically extend across (e.g., in the Z-direction) and cover the inner side surfaces of the first dielectric spacer structure 522-1.

As shown in FIG. 5D, the first dielectric liner structure 524-1 may include a first portion 524-1A and a second portion 524-1B. The first portion 524-1A may be formed directly horizontally adjacent (e.g., horizontally on) the first portion 522-1A of the first dielectric spacer structure 522-1, and the second portion 524-1B may be formed directly horizontally adjacent (e.g., horizontally on) the second portion 522-1B of the first dielectric spacer structure 522-1. The first portion 524-1A and the second portion 524-1B may vertically extend (e.g., in the Z-direction) to substantially the same depth within the preliminary stack structure 502 as one another. The vertical depth of each of the first portion 524-1A and the second portion 524-1B of the first dielectric liner structure 524-1 may be greater than or equal to the vertical depth of the first dielectric spacer structure 522-1 (including the first portion 522-1A and the second portion 522-1B thereof). For example, the first portion 524-1A and the second portion 524-1B of the first dielectric liner structure 524-1 may each vertically extend to and terminate at the first insulative structure 504 of a tier 508 of the preliminary stack structure 502 vertically neighboring a lower vertical boundary of the first dielectric spacer structure 522-1.

The first dielectric liner structure 524-1 may have substantially the same horizontal dimensions (e.g., width) and material composition as the first dielectric liner structure 124-1 previously described with reference to FIG. 1E. In addition, the first dielectric liner structure 524-1 may be formed in substantially the same manner as the first dielectric liner structure 124-1 previously described with reference to FIG. 1E.

Figure 5E:
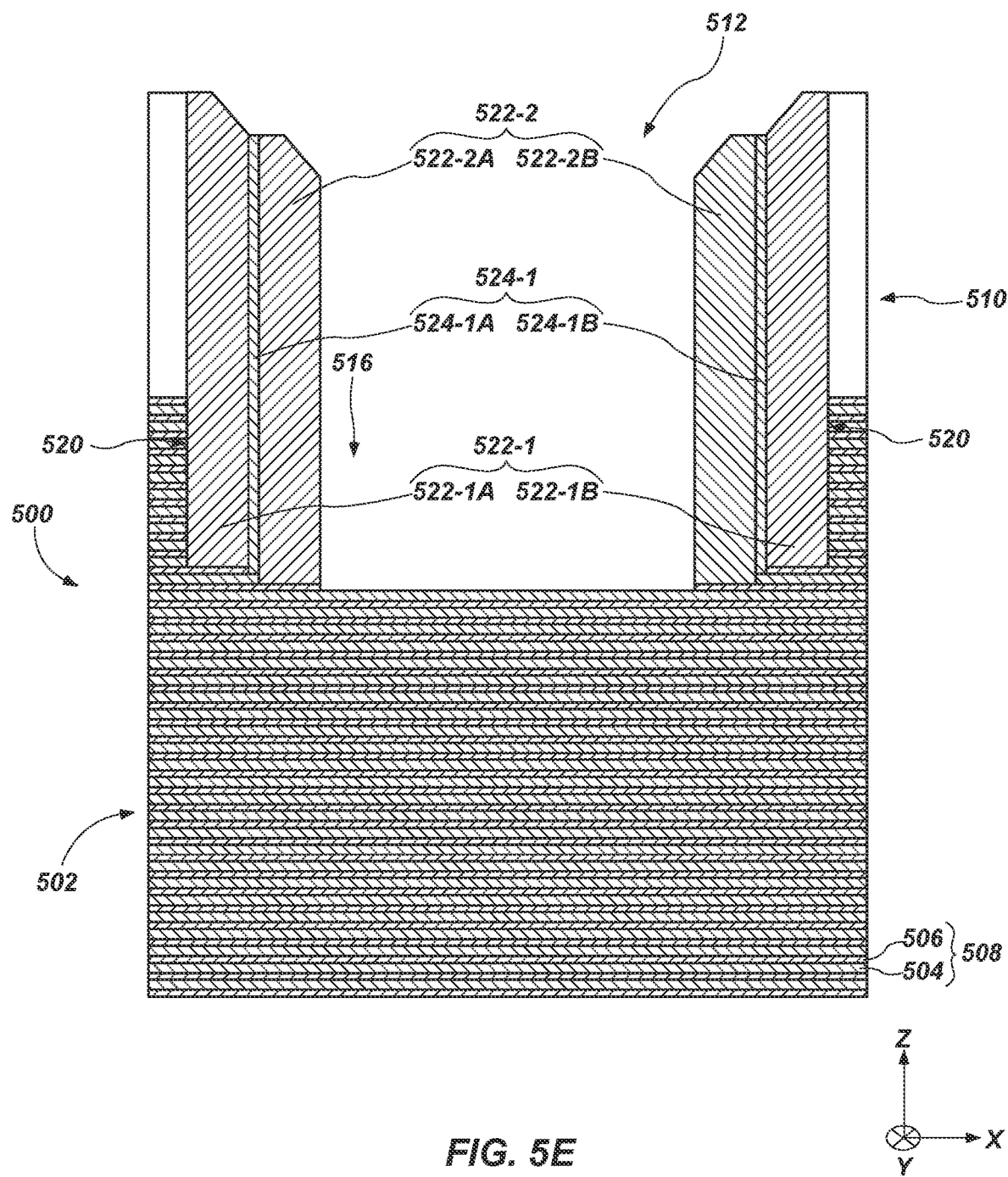

Referring next to FIG. 5E, a second dielectric spacer structure 522-2 may be formed within a remaining (e.g., unfilled) portion the opening 512 in the patterned mask structure 510 and in remaining, deepened portions of the trench 516 in the preliminary stack structure 502. The second dielectric spacer structure 522-2 may partially (e.g., less than completely) fill the remaining portion of the opening 512 and the remaining, deepened portions of the trench 516; and may be formed on exposed surfaces of the first dielectric liner structure 524-1 and the preliminary stack structure 502 within horizontal boundaries (e.g., in the X-direction and the Y-direction) of the trench 516 (and, hence, the opening 512 in the patterned mask structure 510). For example, the second dielectric spacer structure 522-2 may be formed directly horizontally adjacent (e.g., horizontally on) exposed inner side surfaces of the first dielectric liner structure 524-1 and the preliminary stack structure 502 within the trench 516. The second dielectric spacer structure 522-2 and may also be formed directly vertically adjacent (e.g., vertically on) upper surfaces of a second insulative structure 506 of a tier 508 of the preliminary stack structure 502 at a modified lower vertical boundary of the trench 516 formed in the processing stage previously described with reference to FIG. 5D. The second dielectric spacer structure 522-2 may substantially vertically extend across (e.g., in the Z-direction) and cover the inner side surfaces of the first dielectric liner structure 524-1.

As shown in FIG. 5E, the second dielectric spacer structure 522-2 may include a first portion 522-2A and a second portion 522-2B. The first portion 522-2A of the second dielectric spacer structure 522-2 may be formed directly horizontally adjacent (e.g., horizontally on) the first portion 524-1A of the first dielectric liner structure 524-1, and the second portion 522-2B may be formed directly horizontally adjacent (e.g., horizontally on) the second portion 524-1B of the first dielectric liner structure 524-1. The first portion 522-2A and the second portion 522-2B may vertically extend (e.g., in the Z-direction) to substantially the same depth within the preliminary stack structure 502 as one another. The vertical depth of each of the first portion 522-2A and the second portion 522-2B of the second dielectric spacer structure 522-2 may be greater than or equal to the vertical depth of the first dielectric liner structure 524-1 (including the first portion 524-1A and the second portion 524-1B thereof). For example, the first portion 522-2A and the second portion 522-2B of the second dielectric spacer structure 522-2 may each vertically extend to and terminate at the second insulative structure 506 of a tier 508 of the preliminary stack structure 502 vertically neighboring a lower vertical boundary of the first dielectric liner structure 524-1.

The second dielectric spacer structure 522-2 may have substantially the same horizontal dimensions (e.g., width) and material composition as the second dielectric spacer structure 122-2 previously described with reference to FIG. 1G. In addition, the second dielectric spacer structure 522-2 may be formed in substantially the same manner as the second dielectric spacer structure 122-2 previously described with reference to FIG. 1G.

Figure 5F:
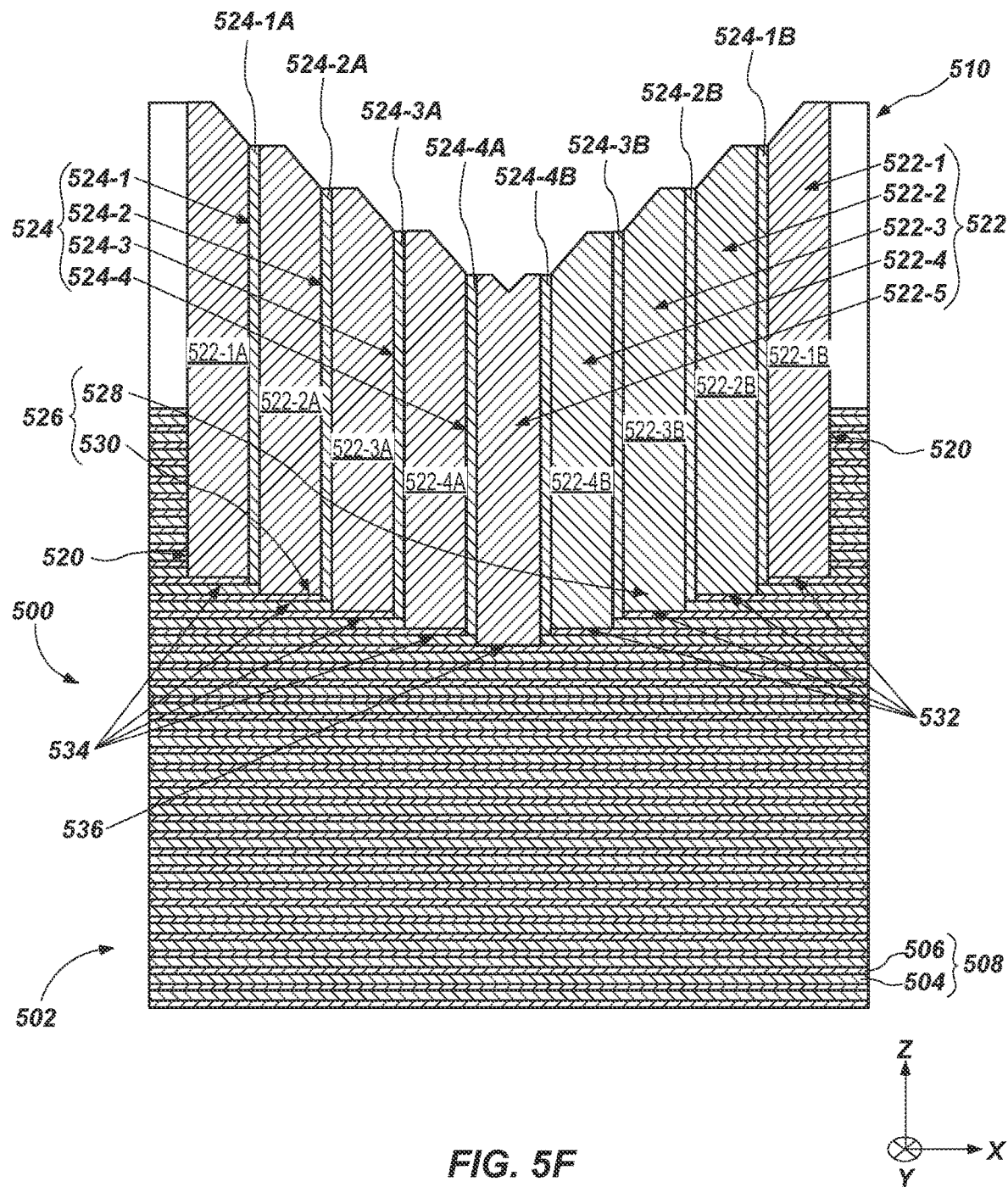

Referring next to FIG. 5F, following the processing stage described with reference to FIG. 5E, the microelectronic device structure 500 may be subjected to additional processing acts similar to those previously described with reference to FIGS. 5D and 5E to fill remaining portions of the trench 516 (FIG. 5E) with more of the dielectric liner structures 524 and more of the dielectric spacer structures 522, and form a stadium structure 526 vertically underlying and in contact with the dielectric liner structures 524 and the dielectric spacer structures 522. As shown in FIG. 5F, the stadium structure 526 may include a forward staircase structure 528 including steps 532 comprising horizontal ends of tiers 508 of the preliminary stack structure 502; a reverse staircase structure 530 including additional steps 534 comprising additional horizontal ends of the tiers 508 of the preliminary stack structure 502; and a central region 536 horizontally interposed between the forward staircase structure 528 and the reverse staircase structure 530. The central region 536 of the stadium structure 526 may, for example, constitute an intersection region and vertical termination location for the forward staircase structure 528 and the reverse staircase structure 530. As described in further detail below, different dielectric spacer structures 522 and different dielectric liner structures 524 may be formed to physically contact different steps 532 of the forward staircase structure 528 and different additional steps 534 of the reverse staircase structure 530 than one another.

As shown in FIG. 5F, the dielectric liner structures 524 may physically contact the first insulative structures 504 of different tiers 508 of the preliminary stack structure 502 at the steps 532 and the additional steps 534 of the stadium structure 526. As shown in FIG. 5F, first portions 524-1A, 524-2A, 524-3A, 524-4A of different dielectric liner structures 524 (e.g., the first dielectric liner structure 524-1, a second dielectric liner structure 524-2, a third dielectric liner structure 524-3, a fourth dielectric liner structure 524-4) may physically contact at least some of the additional steps 534 of the reverse staircase structure 530 of the stadium structure 526; and second portions 524-1B, 524-2B, 524-3B, 524-4B of the different dielectric liner structures 524 (e.g., the first dielectric liner structure 524-1, the second dielectric liner structure 524-2, the third dielectric liner structure 524-3, the fourth dielectric liner structure 524-4) may physically contact at least some of the steps 532 of the forward staircase structure 528 of the stadium structure 526. The dielectric liner structures 524 may have horizontal positions and horizontal dimensions substantially similar to those of the dielectric liner structures 124 previously described with reference to FIG. 1H.

The dielectric spacer structures 522 may be formed horizontally adjacent the dielectric spacer structures 522 over different steps 532 and additional steps 534 of the stadium structure 526. As shown in FIG. 5F, first portions 522-1A, 522-2A, 522-3A, 522-4A of different dielectric spacer structures 522 (e.g., the first dielectric spacer structure 522-1, the second dielectric spacer structure 522-2, a third dielectric spacer structure 522-3, a fourth dielectric spacer structure 522-4) may be formed over and within horizontal boundaries of at least some of the additional steps 534 of the reverse staircase structure 530 of the stadium structure 526; and second portions 522-1B, 522-2B, 522-3B, 522-4B of the different dielectric spacer structures 522 (e.g., the first dielectric spacer structure 522-1, the second dielectric spacer structure 522-2, the third dielectric spacer structure 522-3, the fourth dielectric spacer structure 522-4) may be formed over and within horizontal boundaries of at least some of the steps 532 of the forward staircase structure 528 of the stadium structure 526. The fifth dielectric spacer structure 522-5 may be formed over and within horizontal boundaries of the central region 536 of the stadium structure 526. The dielectric spacer structures 522 may have horizontal positions and horizontal dimensions substantially similar to those of the dielectric spacer structures 122 previously described with reference to FIG. 1H.

Still referring to FIG. 5F, the steps 532 of the forward staircase structure 528 of the stadium structure 526 may each individually comprise horizontal ends of one (1) tier 508 of the preliminary stack structure 502. In addition, the additional steps 534 of the reverse staircase structure 530 of the stadium structure 526 may also each individually comprise horizontal ends of one (1) tier 508 of the preliminary stack structure 502. Individual steps 532 and individual additional steps 534 of the stadium structure 526 at substantially the same elevation (e.g., in the Z-direction) within the preliminary stack structure 502 may share a tier 508 of the preliminary stack structure 502 with one another. For example, an individual step 532 (e.g., an uppermost step 532) of the forward staircase structure 528 may comprise first horizontal ends of an individual tier 508 of the preliminary stack structure 502; and an individual additional step 534 (e.g., an uppermost additional step 534) of the reverse staircase structure 530 may be located at substantially the same vertical position as the individual step 532 of the forward staircase structure 528 and may comprise second horizontal ends of the individual tier 508 of the preliminary stack structure 502.

Figure 5G:
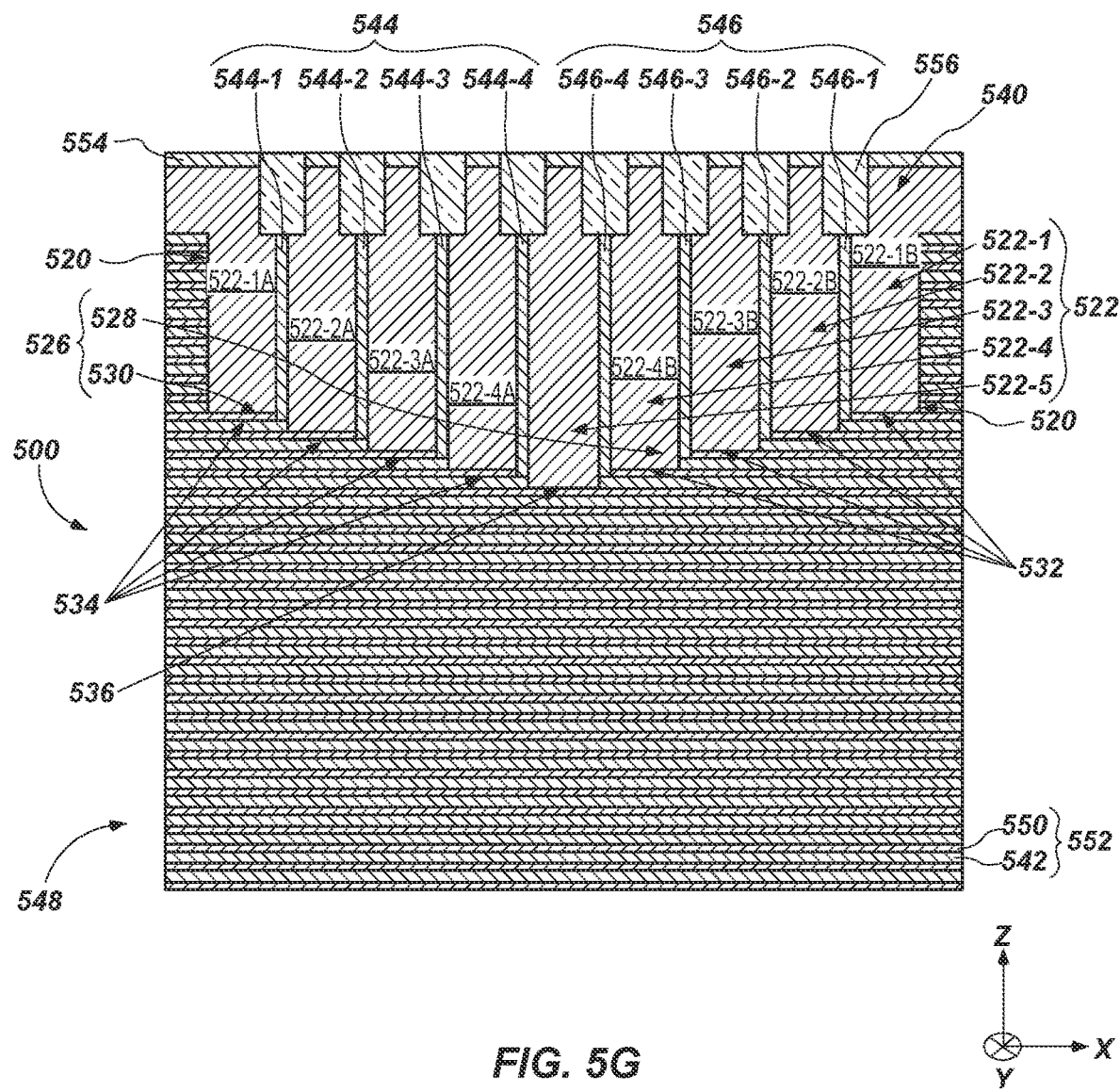

Referring next to FIG. 5G, following the processing stage depicted in FIG. 5F, the microelectronic device structure 500 may be subjected to additional processing acts substantially similar to those previously described with reference to FIGS. 1I through 1L to attain the configuration of the microelectronic device structure 500 depicted in FIG. 5G. Accordingly, the method of forming the microelectronic device structure 500 following the processing stage depicted in FIG. 5F incorporates the processing stages and features previously described in relation to the formation of the microelectronic device structure 100 from the processing stage previously described with reference to FIG. 1I through the processing stage previously described with reference to FIG. 1L.

The microelectronic device structure 500 described with reference to FIG. 5G may be included in embodiments of microelectronic devices (e.g., memory devices, such as a 3D NAND Flash memory devices) of the disclosure. By way of non-limiting example, the microelectronic device structure 500 at the processing stage depicted in FIG. 5G may be included in the microelectronic device 200 (FIG. 2) as the microelectronic device structure 201 (FIG. 2), or may be included in microelectronic device 300 (FIG. 3) as the microelectronic device structure 301 (FIG. 3). In some such embodiments, the stadium structures 226 (FIG. 2) or the stadium structures 326 (FIG. 3) may individually have a geometric configuration (e.g., a shape and dimensions) substantially similar to that previously described with respect to the stadium structure 526 (including geometric configurations of the forward staircase structure 528, the reverse staircase structure 530, and the central region 536 thereof) (FIGS. 5F and 5G), except at least some of the stadium structures 226 (FIG. 2) or at least some of the stadium structures 326 (FIG. 3) may be positioned at different elevations (e.g., vertical positions in the Z-direction) than one another within the stack structure 202 (FIG. 2) or the stack structure 302 (FIG. 3). In addition, within individual blocks 205 (FIG. 2) of the stack structure 202 (FIG. 2) or individual blocks 305 (FIG. 3) of the stack structure 302 (FIG. 3), the conductive contact structures 244 (FIG. 2) or the conductive contact structures 344 (FIG. 3), the additional conductive contact structures 246 (FIG. 2) or the additional conductive contact structures 346 (FIG. 3), and the dielectric spacer structures 222 (FIG. 2) or the dielectric spacer structures 322 (FIG. 3) may respectively correspond to the conductive contact structures 544, the additional conductive contact structure 546, and the dielectric spacer structures 522 of the microelectronic device structure 500 at the processing stage depicted in FIG. 5G.

Figure 6:
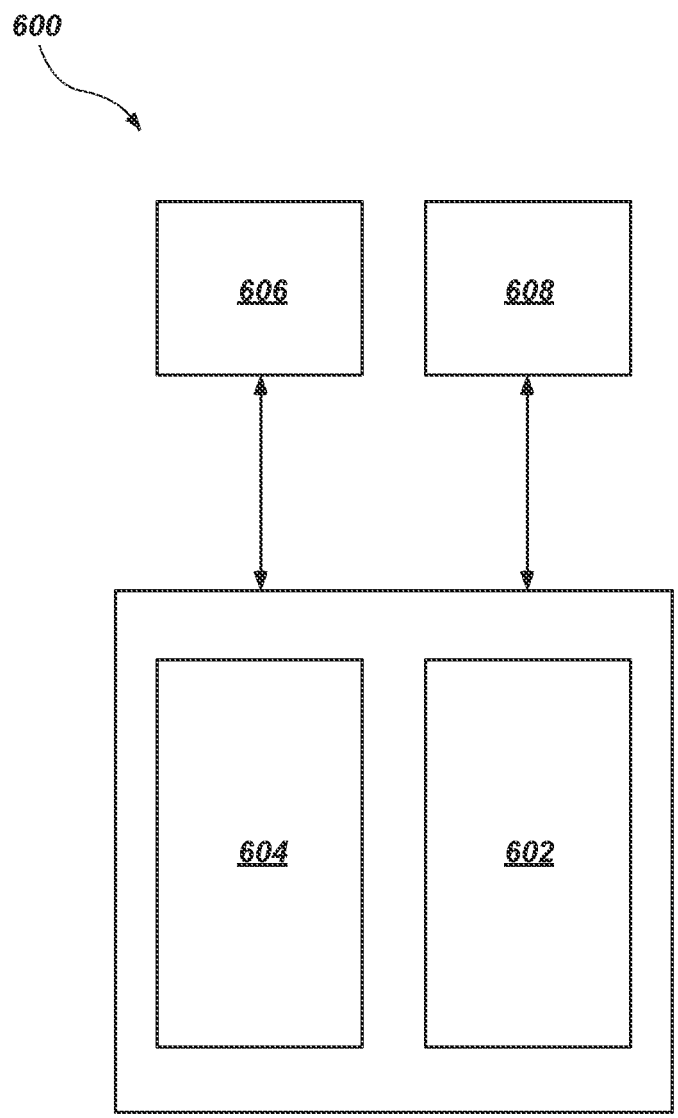
FIG. 6 is a schematic block diagram illustrating an electronic system, in accordance with embodiments of the disclosure.

Microelectronic device structures (e.g., the microelectronic device structure 100 previously described with reference to FIG. 1L; the microelectronic device structure 400 previously described with reference to FIG. 4C; the microelectronic device structure 500 previously described with reference to FIG. 5G) and microelectronic devices (e.g., the microelectronic device 200 previously described with reference to FIG. 2; the microelectronic device 300 previously described with reference to FIG. 3) in accordance with embodiments of the disclosure may be used in embodiments of electronic systems of the disclosure. For example, FIG. 6 is a block diagram of an illustrative electronic system 600 according to embodiments of disclosure. The electronic system 600 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 600 includes at least one memory device 602. The memory device 602 may comprise, for example, an embodiment of one or more of a microelectronic device structure and a microelectronic device previously described herein. The electronic system 600 may further include at least one electronic signal processor device 604 (often referred to as a "microprocessor"). The electronic signal processor device 604 may, optionally, include an embodiment of one or more of a microelectronic device structure and a microelectronic device previously described herein. While the memory device 602 and the electronic signal processor device 604 are depicted as two (2) separate devices in FIG. 6, in additional embodiments, a single (e.g., only one) memory/processor device having the functionalities of the memory device 602 and the electronic signal processor device 604 is included in the electronic system 600. In such embodiments, the memory/processor device may include one or more of a microelectronic device structure and a microelectronic device previously described herein. The electronic system 600 may further include one or more input devices 606 for inputting information into the electronic system 600 by a user, such as, for example, a mouse or other pointing device, a keyboard, a touchpad, a button, or a control panel. The electronic system 600 may further include one or more output devices 608 for outputting information (e.g., visual or audio output) to a user such as, for example, one or more of a monitor, a display, a printer, an audio output jack, and a speaker. In some embodiments, the input device 606 and the output device 608 may comprise a single touchscreen device that can be used both to input information to the electronic system 600 and to output visual information to a user. The input device 606 and the output device 608 may communicate electrically with one or more of the memory device 602 and the electronic signal processor device 604.

Thus, in accordance with embodiments of the disclosure, an electronic system comprises an input device, an output device, a processor device operably coupled to the input device and the output device, and a memory device operably coupled to the processor device. The memory device comprises a microelectronic device structure comprising a stack structure, a stadium structure, and conductive contact structures. The stack structure comprises a vertically alternating sequence of conductive structures and insulative structures arranged in tiers. The stadium structure is within the stack structure and comprises opposing staircase structures each having steps comprising edges of at least some of the tiers. The conductive contact structures are integral and continuous with at least some of the conductive structures of the stack structure at the steps of the opposing staircase structures of the stadium structure. Each of the conductive contact structures individually has an inner horizontal boundary substantially coplanar with an inner horizontal boundary of one of the steps of the opposing staircase structures.

The methods, structures (e.g., the microelectronic device structures 100, 400, 500), devices (e.g., the microelectronic devices 200, 300), and systems (e.g., the electronic system 600) of the disclosure advantageously facilitate one or more of improved performance, reliability, and durability, lower costs, increased miniaturization of components, improved pattern quality, and greater packaging density as compared to conventional structures, conventional devices, and conventional systems. The methods and structures of the disclosure may alleviate problems related to the formation and processing of conventional microelectronic devices including stack structures having staircase structures at edges thereof. For example, the methods and structures of the disclosure do not suffer from the relatively small sizing and spacing error margins associated with properly forming staircase structures of conventional microelectronic device structures to receive contact structures thereon. In addition, the methods and structures of the disclosure may reduce the risk of undesirable damage (e.g., contact punch through) as well as undesirable current leakage and short circuits as compared to conventional methods and conventional structures.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents.

What is claimed is:

1. A method of forming a microelectronic device, comprising:
    forming a preliminary stack structure comprising a vertically alternating sequence of insulative structures and additional insulative structures arranged in tiers, each of the tiers comprising one of the insulative structures and one of the additional insulative structures;
    forming a trench vertically extending into the preliminary stack structure;
    forming a horizontally alternating sequence of dielectric spacer structures and dielectric liner structures within horizontal boundaries of the trench, at least some of the dielectric liner structures physically contacting different insulative structures of the preliminary stack structure than one another; and
    at least partially replacing dielectric material of the dielectric liner structures and the insulative structures of the preliminary stack structure with electrically conductive material.

2. The method of claim 1, wherein forming a horizontally alternating sequence of dielectric spacer structures and dielectric liner structures within horizontal boundaries of the trench comprises:
    forming a first dielectric spacer structure within the trench;
    forming a first dielectric liner structure within the trench and horizontally inward of the first dielectric spacer structure, the first dielectric liner structure physically contacting at least one of the insulative structures of the preliminary stack structure;
    forming a second dielectric spacer structure within the trench and horizontally inward of the first dielectric liner structure; and
    forming a second dielectric liner structure within the trench and horizontally inward of the second dielectric spacer structure, the second dielectric liner structure physically contacting at least one other of the insulative structures at a relatively lower vertical position within the preliminary stack structure than the at least one of the insulative structures.

3. The method of claim 2, wherein:
    forming a first dielectric liner structure within the trench comprises:
        forming a first portion of the first dielectric liner structure to physically contact a first of the insulative structures; and
        forming a second portion of the first dielectric liner structure to physically contact a second of the insulative structures vertically neighboring the first of the insulative structures; and
    forming a second dielectric liner structure within the trench comprises:
        forming a first portion of the second dielectric liner structure to physically contact a third of the insulative structures vertically underlying the second of the insulative structures; and
        forming a second portion of the second dielectric liner structure to physically contact a fourth of the insulative structures vertically neighboring the third of the insulative structures.

4. The method of claim 2, wherein:
    forming a first dielectric spacer structure within the trench comprises:
        forming a first portion of the first dielectric spacer structure to physically contact a first of the additional insulative structures; and
        forming a second portion of the first dielectric spacer structure to physically contact a second of the additional insulative structures vertically neighboring the first of the additional insulative structures; and
    forming a second dielectric spacer structure within the trench comprises:
        forming a first portion of the second dielectric spacer structure to physically contact a third of the additional insulative structures vertically underlying the second of the additional insulative structures; and
        forming a second portion of the second dielectric spacer structure to physically contact a fourth of the additional insulative structures vertically neighboring the third of the additional insulative structures.

5. The method of claim 1, wherein forming a horizontally alternating sequence of dielectric spacer structures and dielectric liner structures within horizontal boundaries of the trench comprises forming a stadium structure within the preliminary stack structure and within horizontal boundaries of the trench, the stadium structure comprising:
    a forward staircase structure having steps comprising horizontal ends of the tiers, some portions of the dielectric liner structures in physical contact with some of the insulative structures of the preliminary stack structure at the steps of the forward staircase structure; and
    a reverse staircase structure opposing the forward staircase structure and having additional steps comprising additional horizontal ends of the tiers, some other portions of the dielectric liner structures in physical contact with some other of the insulative structures of the preliminary stack structure at the additional steps of the reverse staircase structure.

6. The method of claim 5, wherein forming a stadium structure comprises forming upper surfaces of each of the steps of the forward staircase structure to be vertically offset from upper surfaces of each of the additional steps of the reverse staircase structure.

7. The method of claim 5, wherein forming a stadium structure comprises forming upper surfaces of some of the steps of the forward staircase structure to be substantially coplanar with upper surfaces of some of the additional steps of the reverse staircase structure.

8. The method of claim 5, wherein forming a stadium structure comprises:
    forming each of the steps of the forward staircase structure to individually comprise horizontal ends of a group of at least two of the tiers of the preliminary stack structure; and
    forming each of the additional steps of the reverse staircase structure to comprise horizontal ends of an additional group of at least two of the tiers of the preliminary stack structure, the additional group sharing at least one of the tiers of the preliminary stack structure with the group.

9. A method of forming a microelectronic device, comprising:
    forming a stack structure comprising tiers individually including insulative material and additional material vertically adjacent the insulative material;
    forming a trench extending into the stack structure;
    forming insulative spacer material on side surfaces of the stack structure partially defining the trench;
    forming liner material on inner side surfaces of the insulative spacer material, the liner material physically contacting the additional material of at least one of the tiers of the stack structure;
    extending a portion of the trench horizontally inward of vertically extending portions the liner material vertically deeper into the stack structure to form an extended trench;
    forming additional insulative spacer material on inner side surfaces of remaining portions of the liner material after forming the extended trench;
    forming additional liner material on inner side surfaces of the additional insulative spacer material, the additional liner material physically contacting the additional material of at least one other of the tiers of the stack structure; and
    at least partially replacing the liner material, the additional liner material, and the additional material of the tiers of stack structure with conductive material.

10. The method of claim 9, wherein:
    forming a trench extending into the stack structure comprises forming the trench to have a non-planar lower boundary at least partially defined by two of the tiers of the stack structure vertically offset from one another; and
    forming liner material comprises forming the liner material to physically contact the additional material of the two of the tiers.

11. The method of claim 10, wherein forming the trench to have a non-planar lower boundary defined by at least two of the tiers comprises:
    selecting the two of the tiers to be directly vertically adjacent one another;
    forming about one half of the non-planar lower boundary of the trench to be defined by one of the two of the tiers; and
    forming about one other half of the non-planar lower boundary of the trench to be defined by an additional one of the two of the tiers.

12. The method of claim 10, wherein:
    extending a portion of the trench horizontally inward of vertically extending portions of the liner material vertically deeper into the stack structure comprises forming a lower boundary of the extended trench to be separated from a lower boundary of the remaining portions of the liner material by multiple of the tiers; and
    forming additional insulative spacer material further comprises forming the additional insulative spacer material on inner side surfaces of the multiple of the tiers.

13. The method of claim 9, wherein:
    forming a trench extending into the stack structure comprises forming the trench to have a substantially planar lower boundary defined by only one of the tiers of the stack structure; and
    forming liner material comprises forming the liner material to physically contact the additional material of the only one of the tiers.

14. The method of claim 13, wherein:
    extending a portion of the trench horizontally inward of the liner material vertically deeper into the stack structure comprises forming a lower boundary of the extended trench to be separated from a lower boundary of the remaining portions of the liner material by at least a portion of at least one of the tiers; and
    forming additional insulative spacer material further comprises forming the additional insulative spacer material on inner side surfaces of the at least a portion of the at least one of the tiers.

15. The method of claim 9, wherein:
    at least partially replacing the liner material, the additional liner material, and the additional material of the tiers of stack structure with conductive material comprises:
        forming vertically extending conductive contact structures from the liner material and the additional liner material; and
        forming horizontally extending conductive structures from the additional material of the tiers of stack structure, the horizontally extending conductive structures integral and continuous with the vertically extending conductive contact structures.

16. The method of claim 15, further comprising forming the vertically extending conductive contact structures and the horizontally extending conductive structures substantially simultaneously with one another.

17. The method of claim 15, further comprising forming at least some of the vertically extending conductive contact structures to horizontally extend in partially non-linear paths.

18. The method of claim 15, further comprising forming at least some of the vertically extending conductive contact structures to horizontally extend in substantially linear paths.

19. The method of claim 15, further comprising forming conductive contact structures vertically over and in physical contact with portions of the vertically extending conductive contact structures.

20. A method of forming a microelectronic device, comprising: forming a stack structure comprising insulative structures and additional structures vertically interleaved with the insulative structures, the insulative structures and the additional structures arranged in tiers individually comprising one of the insulative structures and one of the additional structures; forming a trench vertically extending through some of the tiers of the stack structure; forming a horizontally alternating sequence of insulative spacer structures and liner structures with a horizontal area of the trench, a material composition of the liner structures is substantially the same as a material composition of the additional structures, and pairs of the liner structures horizontally adjacent opposing sides of respective ones of the insulative spacer structures in contact with different respective ones of the additional structures of the stack structure than one another; and selectively replacing material of the liner structures and the additional structures of the stack structure with conductive material to substantially simultaneously form conductive contact structures from the liner structures and conductive structures from the additional structures, each of the conductive contact structures integral and continuous with a respective one of the conductive structures.

* * * * *

UNITED STATES PATENT AND TRADEMARK OFFICE
CERTIFICATE OF CORRECTION

| | |
|---|---|
| PATENT NO. | : 11,942,422 B2 |
| APPLICATION NO. | : 18/050438 |
| DATED | : March 26, 2024 |
| INVENTOR(S) | : Darwin A. Clampitt et al. |

It is certified that error appears in the above-identified patent and that said Letters Patent is hereby corrected as shown below:

In the Specification

| | | | |
|---|---|---|---|
| | Column 7, | Line 7, | change "(e.g., $SiN_g$), at" to --(e.g., $SiN_y$), at-- |
| | Column 26, | Line 53, | change "iridium (Jr), iridium" to --iridium (Ir), iridium-- |
| | Column 27, | Line 66, | change "Rh, Jr, Ni," to --Rh, Ir, Ni,-- |
| | Column 32, | Line 29, | change "Rh, Jr, Ni," to --Rh, Ir, Ni,-- |

In the Claims

| | | | |
|---|---|---|---|
| Claim 20, | Column 48, | Lines 43-44, | change "device, comprising: forming a stack" to --device, comprising:<br>forming a stack-- |
| Claim 20, | Column 48, | Line 49, | change "additional structures; forming a trench" to --additional structures;<br>forming a trench-- |
| Claim 20, | Column 48, | Line 50, | change "stack structure; forming a" to --stack structure;<br>forming a-- |
| Claim 20, | Column 48, | Lines 52-53, | change "area of the trench, a material" to --area of the trench,<br>a material-- |
| Claim 20, | Column 48, | Lines 54-55, | change "additional structures, and pairs of" to --additional structures, and<br>pairs of-- |
| Claim 20, | Column 48, | Lines 58-59, | change "one another; and selectively replacing" to --one another; and<br>selectively replacing-- |

Signed and Sealed this
Twenty-eighth Day of May, 2024

Katherine Kelly Vidal
*Director of the United States Patent and Trademark Office*